US008907672B2

(12) United States Patent  
Hori et al.

(10) Patent No.: US 8,907,672 B2
(45) Date of Patent: Dec. 9, 2014

(54) MAGNETIC RESONANCE IMAGING APPARATUS AND CONTROL DEVICE OF A MAGNETIC RESONANCE IMAGING APPARATUS

(75) Inventors: Masashi Hori, Nasushiobara (JP); Motohiro Miura, Yaita (JP)

(73) Assignees: Kabushiki Kaisha Toshiba, Minato-Ku, Tokyo (JP); Toshiba Medical Systems Corporation, Otawara-Shi, Tochigi-Ken (JP)

( * ) Notice: Subject to any disclaimer, the term of this patent is extended or adjusted under 35 U.S.C. 154(b) by 0 days.

(21) Appl. No.: 13/615,891

(22) Filed: Sep. 14, 2012

(65) Prior Publication Data

US 2013/0009641 A1 Jan. 10, 2013

Related U.S. Application Data

(63) Continuation of application No. PCT/JP2012/064927, filed on Jun. 11, 2012.

(30) Foreign Application Priority Data

Jun. 13, 2011 (JP) .................................. 2011/131067  
Jun. 13, 2011 (JP) .................................. 2011/131388

(51) Int. Cl.
*G01R 3/00* (2006.01)
*G01R 33/385* (2006.01)
*G01R 33/565* (2006.01)
*G01R 33/48* (2006.01)

(52) U.S. Cl.
CPC ...... *G01R 33/56572* (2013.01); *G01R 33/3852* (2013.01); *G01R 33/56545* (2013.01); *G01R 33/56554* (2013.01)
USPC ............................. 324/309; 324/307; 324/318

(58) Field of Classification Search
CPC ......... G01R 33/48; G01R 33/44; G01R 33/54
USPC .................................................. 324/300–322
See application file for complete search history.

(56) References Cited

U.S. PATENT DOCUMENTS

2008/0231271 A1* 9/2008 Yui et al. ........................ 324/307
2009/0322330 A1* 12/2009 Adachi et al. ................. 324/309

(Continued)

FOREIGN PATENT DOCUMENTS

JP 4-054614 2/1992
JP 2009-011476 1/2009

(Continued)

OTHER PUBLICATIONS

J.M.B. Koot, "Analysis of Eddy Currents in a Gradient Coil", Jun. 2005, 182 pages.

(Continued)

*Primary Examiner* — Arleen M Vazquez
*Assistant Examiner* — Emily Chan
(74) *Attorney, Agent, or Firm* — Nixon & Vanderhye PC

(57) ABSTRACT

A control device of a magnetic resonance imaging (MRI) apparatus includes a condition setting unit and a judging unit. The condition setting unit sets an imaging sequence to be performed by the MRI apparatus based on set conditions of the set imaging sequence. The judging unit then (a) calculates a value of electric current that would need to be supplied to a gradient magnetic field coil of the MRI apparatus to perform that set imaging sequence based on the set conditions of the set imaging sequence, (b) calculates a value of voltage that would need to be applied to the gradient magnetic field coil based on a mutual inductance of the gradient magnetic field to cause electric current flowing to the gradient magnetic field coil to equal to the value of the calculated electric current, and (c) judges whether the set imaging sequence is practicable or not based on the calculated value of voltage.

11 Claims, 29 Drawing Sheets

(56) References Cited

U.S. PATENT DOCUMENTS

2010/0106008 A1* 4/2010 Harvey .................. 600/422
2011/0304331 A1* 12/2011 Takahashi et al. ............ 324/309
2013/0009639 A1* 1/2013 Ookawa .................. 324/307

FOREIGN PATENT DOCUMENTS

JP  2010-075753  4/2010
JP  2010-172383  8/2010

OTHER PUBLICATIONS

International Preliminary Report on Patentability in PCT/JP2012/064927 issued Dec. 17, 2013.

Form PCT/ISA/210 in PCT/JP2012/064927.

S. H. Cho et al., "Compensation of Eddy Current by an R-L-C Circuit Model of the Gradient System," Proc. Intl. Soc. Mag. Reson. Med. 16 (2008), p. 1156.

* cited by examiner

MAGNETIC RESONANCE IMAGING APPARATUS AND CONTROL DEVICE OF A MAGNETIC RESONANCE IMAGING APPARATUS

CROSS-REFERENCE TO RELATED APPLICATIONS

This application is a Continuation application of No. PCT/JP2012/64927, filed on Jun. 11, 2012, and the PCT application is based upon and claims the benefit of priority from Japanese Patent Application No. 2011-131388, filed on Jun. 13, 2011 and Japanese Patent Application No. 2011-131067 filed on Jun. 13, 2011, the entire contents of which are incorporated herein by reference.

BACKGROUND OF THE INVENTION

1. Field of the Invention

Embodiments described herein relate generally to magnetic resonance imaging.

2. Description of the Related Art

MRI is an imaging method which magnetically excites nuclear spin of an object (a patient) set in a static magnetic field with an RF pulse having the Larmor frequency and reconstructs an image based on MR signals generated due to the excitation. The aforementioned MRI means magnetic resonance imaging, the RF pulse means a radio frequency pulse, and the MR signal means a nuclear magnetic resonance signal.

In MRI, in order to obtain spatial positional information, mutually orthogonal gradient magnetic fields are applied. Thus, a gradient magnetic field generation system in an MRI apparatus includes a gradient magnetic field coil which adds spatial positional information to MR signals by applying a gradient magnetic field in an imaging space where an object is set.

This gradient magnetic field coil produces heat by being provided with pulse electric current during imaging. A gradient magnetic field generation system has various limitations in terms of the total upper limit of electric power, the respective upper limits of electric power in each channel and the like, and does not have enough ability to endure the maximum electric current in every channel (X axis direction, Y axis direction and Z axis direction) concurrently.

Then, in Japanese Patent Application Laid-open (KOKAI) Publication No. 2010-75753 (hereinafter referred to as Patent Document 1), change of the order of imaging protocols and resetting of imaging cessation time are performed in order to keep residual heat of a gradient magnetic field coil equal to or less than an abort level.

Additionally, for example, in the case of reconstructing 2-dimensional images, three gradient magnetic fields in a slice selection direction, a phase encode direction and a readout direction are used. Generally, a waveform of a gradient magnetic field is pulsed, and called a gradient magnetic field pulse. A waveform and amplitude of a gradient magnetic field pulse are defined as a part of parameters of an imaging sequence stipulated by an imaging method and imaging conditions.

Out of gradient magnetic field pulses, a gradient magnetic field pulse in the readout direction is to apply a magnetic field having gradient defined by amplitude of a gradient magnetic field pulse.

While a gradient magnetic field pulse in the readout direction is applied, i.e. on-span of a pulse, MR signals (echo signals) emitted from an object are sampled. If the amplitude of the gradient magnetic field pulse during the on-span is constant, the gradient of the magnetic field in the readout direction becomes constant, and this ensures a linear relation between the position of the readout direction and the frequency of MR signals.

In a high speed imaging method, sampling in the readout direction is performed in a short span. For example, in a high speed imaging method called EPI (Echo Planer Imaging), a scan (acquisition of MR signals) are performed speedily and consecutively by inverting a gradient magnetic field for each nuclear magnetic excitation.

The pulse waveform of the gradient magnetic field in the readout direction in EPI has a shorter pulse width and a shorter pulse cycle length, as compared with other imaging methods. That is, the frequency component of the pulse waveform of the gradient magnetic field in the readout direction in EPI is high, as compared with other imaging methods.

On the other hand, a gradient magnetic field pulse is generated by applying pulsed electric current to a gradient magnetic field coil. A waveform of the pulsed electric current applied to a gradient magnetic field coil is ideally a block pulse, but actually becomes a trapezoidal wave having a rising edge region and a falling edge region. As a result, a pulse waveform of a gradient magnetic field does not become an ideal block pulse, but becomes a trapezoidal wave having a rising edge region and a falling edge region.

Generally, in high speed imaging methods such as EPI, a pulse width of a gradient magnetic field pulse is short, and a ratio of a rising edge region and a falling edge region in both ends of a pulse to the entire pulse width becomes high. Therefore, it is proposed to sample data in a rising edge region and a falling edge region as well as in sampling data a flat region of a pulse, so as to use the sampled data for image reconstruction.

The method of sampling data in a rising edge region and a falling edge region is called Ramp Sampling. The Ramp Sampling gives a shorter data acquisition time, as compared with other methods of sampling data only in regions whose gradient magnetic field intensity is flat.

However, raw data sampled at regular time intervals in a rising edge region and a falling edge region do not become equally-spaced in a k-space, because these raw data are sampled while a gradient magnetic field is changing. Then, it is preferable to rearrange the sampled data before reconstruction, in such a manner that the sampled data become equally-spaced in the k-space. This rearrangement processing is generally called regridding.

In the regridding processing mentioned in Japanese Patent Application Laid-open (KOKAI) Publication No. 2010-172383 (hereinafter, referred to as Patent Document 2), a waveform of gradient magnetic field pulse is assumed not a simple trapezoidal waveform but a nonlinear waveform, and a nonlinear waveform of a gradient magnetic field pulse is calculated based on a waveform of gradient magnetic field current. In the method of Patent Document 2, regridding processing is performed based on this waveform of a gradient magnetic field pulse.

However, in conventional technology, it is difficult to precisely estimate application limits of a gradient magnetic field generation system in terms of electric power depending on an imaging sequence.

Thus, a gradient magnetic field generation system is safely driven under control of keeping a sufficient margin between actual supplied amount of electric current and the application limit value. That is, the supplied amount of electric current to a gradient magnetic field generation system is controlled so as to surely fall below its application limit value.

In other words, in the aforementioned conventional technology, though there is an enough margin from its application limit, a gradient magnetic field generation system is sometimes driven more safely than its application limit. If there was an enough margin up to the application limit of a gradient magnetic field generation system, imaging could be performed under more optimized conditions by increasing a slice number by the value corresponding to the margin, for example.

Thus, it is preferable to accurately judge, in terms of electric load on a gradient magnetic field generation system in MRI, whether an imaging sequence is practicable or not, before performance of the imaging sequence. This is so that imaging is performed under more optimized conditions.

That is, "technology to accurately judge whether an imaging sequence is practicable or not in terms of electric load on a gradient magnetic field generation system in MRI" has been desired.

The conventional technology mentioned in Patent Document 2 is based on the assumption that a waveform of gradient magnetic field pulse is similar to a waveform of "electric current supplied to a gradient magnetic field coil (hereinafter referred to as "gradient magnetic field current")". That is, if a waveform of gradient magnetic field current is nonlinear, a waveform of a gradient magnetic field pulse is assumed to be similar to the nonlinear waveform of the gradient magnetic field current.

Then, gradient magnetic field current is actually measured with an ammeter, and regridding processing is performed based on a gradient magnetic field pulse whose waveform is similar (homothetic) to the measured electric current waveform.

Additionally, technology to calculate an output electric current waveform based on an input signal (control signal) to a gradient magnetic field power supply by simulation, and perform regridding processing based on a gradient magnetic field pulse whose waveform is similar to the calculated output electric current waveform is also disclosed.

However, a waveform of gradient magnetic field current and a waveform of a gradient magnetic field actually generated by this gradient magnetic field current do not necessarily accord with each other. Especially, in a waveform of high frequency components like a gradient magnetic field used in a high speed imaging such as EPI, the following fact has been clarified. That is, a difference between a waveform of gradient magnetic field current and a waveform of a gradient magnetic field becomes large, and discordance of a gradient magnetic field waveform in a rising edge and a falling edge becomes conspicuous.

Therefore, MRI technology to accurately calculate actual gradient magnetic field waveforms and perform regridding processing or parameter correction processing with a high degree of accuracy based on the calculated gradient magnetic field waveform has been desired.

Figure 1:
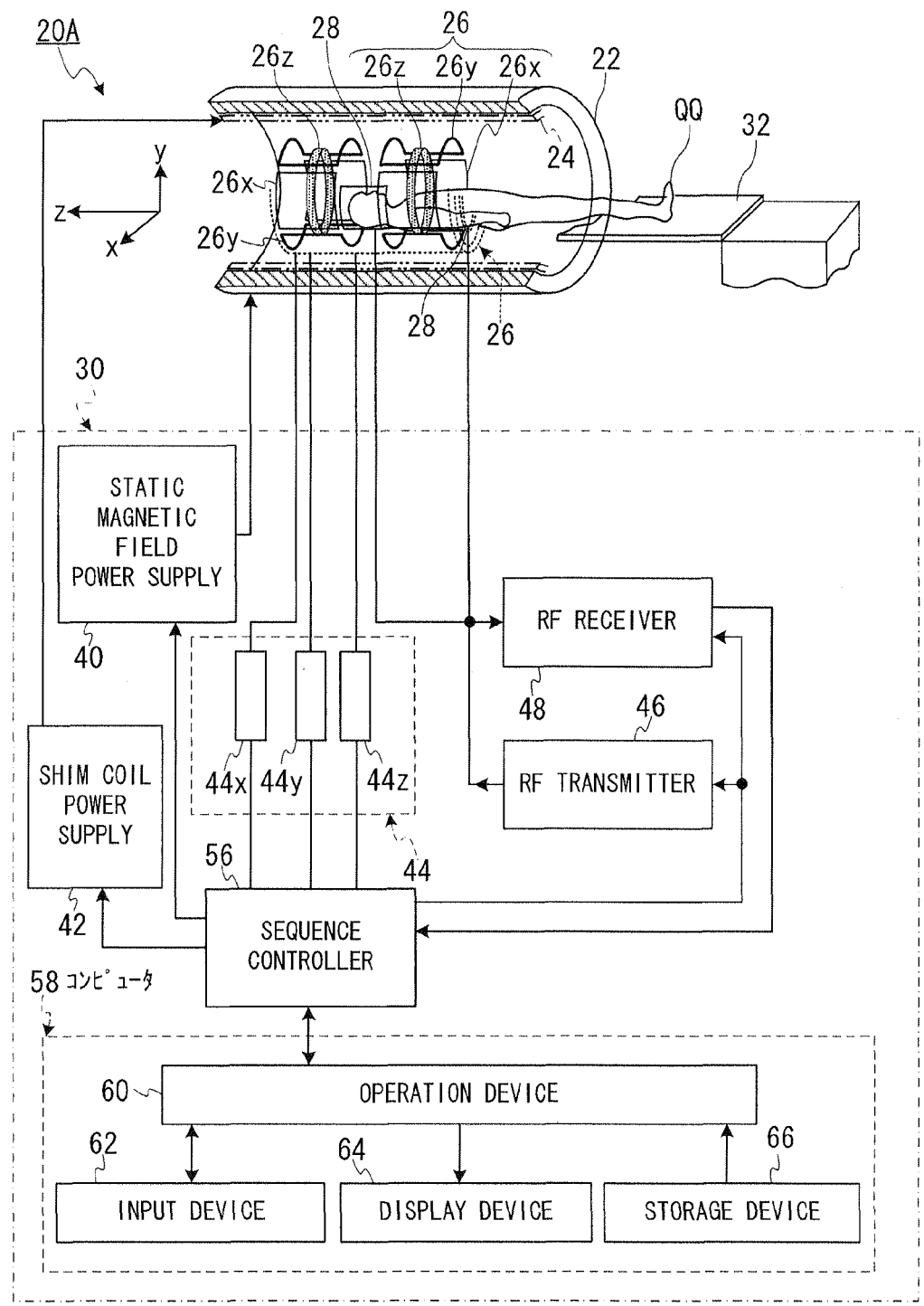
FIG. 1 is a block diagram showing general structure of the MRI apparatus of the first embodiment.

DETAILED DESCRIPTION (1) According to one embodiment, a magnetic resonance imaging apparatus and its control device include a condition setting unit and a judging unit.

The condition setting unit sets an imaging sequence performed by the magnetic resonance imaging apparatus, based on conditions of the imaging sequence.

The judging unit calculates a value of electric current supplied to a gradient magnetic field coil of the magnetic resonance imaging apparatus based on the conditions of the imaging sequence. The judging unit calculates a value of voltage applied to the gradient magnetic field coil based on a mutual inductance by which the gradient magnetic field coil causes mutual induction, in such a manner that electric current flowing the gradient magnetic field coil becomes equal to the value of an electric current calculated. Then, the judging unit judges whether the imaging sequence is practicable or not, based on the value of voltage.

(2) According to another embodiment, a magnetic resonance imaging apparatus applies a gradient magnetic field to an imaging region, generates k-space data including a plurality of matrix elements by sampling a nuclear magnetic resonance signal acquired from the imaging region, and reconstructs image data based on the k-space data. This magnetic resonance imaging apparatus includes a gradient magnetic field power supply, a gradient magnetic field calculating unit, and a regridding processing unit.

The gradient magnetic field power supply applies the gradient magnetic field to the imaging region, by supplying gradient magnetic field current to a gradient magnetic field coil under an imaging sequence;

The gradient magnetic field calculating unit calculates a waveform of the gradient magnetic field current based on conditions of the imaging sequence. The gradient magnetic field calculating unit calculates a waveform of a gradient magnetic field in a readout direction, based on a mutual inductance by which the gradient magnetic field coil causes mutual induction and the waveform of the gradient magnetic field current.

The regridding processing unit generates or rearranges the k-space data by sampling at unequally-spaced intervals, in such a manner that a part of the nuclear magnetic resonance signal acquired during a time span in which a time integral value of intensity of the gradient magnetic field in a readout direction is non-linear and each time integral value up to a sampling period corresponding to each of the matrix elements becomes equally-spaced.

(3) According to another embodiment, a magnetic resonance imaging apparatus applies a gradient magnetic field to an imaging region, reconstructs image data based on a nuclear magnetic resonance signal acquired from the imaging region. This magnetic resonance imaging apparatus includes the gradient magnetic field power supply which is similar to the above (2), the gradient magnetic field calculating unit which is similar to the above (2) and a waveform correcting unit.

The waveform correcting unit corrects at least one of the conditions of the imaging sequence before performance of the imaging sequence, in such a manner that the waveform of the gradient magnetic field in a readout direction becomes closer to a target waveform for the gradient magnetic field in a readout direction, if the waveform of the gradient magnetic field in a readout direction calculated by the gradient magnetic field calculating unit is different from the target waveform.

A magnetic resonance imaging apparatus, its control device and a magnetic resonance imaging method according to embodiments of the present invention will be described with reference to the accompanying drawings.

Note that the same reference numbers are given for identical components in each figure, and overlapping explanation is abbreviated.

First Embodiment

FIG. 1 is a block diagram showing general structure of the MRI apparatus 20A according to the first embodiment.

As shown in FIG. 1, the MRI apparatus 20A includes a cylinder-shaped static magnetic field magnet 22 for generating a static magnetic field, a cylinder-shaped shim coil 24 coaxially-arranged inside the static magnetic field magnet 22, a gradient magnetic field coil 26, RF coils 28, a control device 30, and a bed 32 for placing an object (e.g. a patient) QQ on it.

Here, as one example, an apparatus coordinate system, whose X axis, a Y axis and a Z axis are perpendicular to each other, is defined as follows. Firstly, the direction of an axis of the static magnetic field magnet 22 and the shim coil 24 is aligned with the direction which is perpendicular to the vertical direction, and the direction of the axis of the static magnetic field magnet 22 and the shim coil 24 is defined as the Z axis direction.

Additionally, it is assumed that the vertical direction is the same as the Y axis direction. Moreover, the bed 32 is disposed in such a position that the direction of the normal line of the table plane thereof on which an object is put is the same as the Y axis direction.

The control device 30 includes, for example, a static magnetic field power supply 40, a shim coil power supply 42, a gradient magnetic field power supply 44, an RF transmitter 46, an RF receiver 48, a sequence controller 56 and a computer 58.

The gradient magnetic field power supply 44 includes an X axis gradient magnetic field power supply 44x, a Y axis gradient magnetic field power supply 44y and a Z axis gradient magnetic field power supply 44z.

The computer 58 includes an operation device 60, an input device 62, a display device 64 and a storage device 66.

The static magnetic field magnet 22 is electrically connected to the static magnetic field power supply 40 and generates a static magnetic field in an imaging space by using electric current supplied from the static magnetic field power supply 40.

The aforementioned imaging space means, for example, a space in the gantry 21 (see FIG. 2) in which an object QQ is placed and to which a static magnetic field is applied. For simplicity, FIG. 1 does not show the gantry 21 itself, but shows the components of the gantry 21 such as the static magnetic field magnet 22.

The shim coil 24 is electrically connected to the shim coil power supply 42 and uniforms the static magnetic field with the electric current supplied from the shim coil power supply 42.

The static magnetic field magnet 22 includes a superconductivity coil in many cases. The static magnetic field magnet 22 gets electric current from the static magnetic field power supply 40 at excitation. However, once excitation has been made, the static magnetic field magnet 22 is usually isolated from the static magnetic field power supply 40. The static magnetic field magnet 22 may include a permanent magnet which makes the static magnetic field power supply 40 unnecessary.

The gradient magnetic field coil 26 includes an X axis gradient magnetic field coil 26x, a Y axis gradient magnetic field coil 26y and a Z axis gradient magnetic field coil 26z. Each of the X axis gradient magnetic field coil 26x, the Y axis gradient magnetic field coil 26y and the Z axis gradient magnetic field coil 26z is cylinder-shaped and arranged inside the static magnetic field magnet 22.

The X axis gradient magnetic field coil 26x, the Y axis gradient magnetic field coil 26y and the Z axis gradient magnetic field coil 26z are electrically connected to the X axis gradient magnetic field power supply 44x, the Y axis gradient magnetic field power supply 44y and the Z axis gradient magnetic field power supply 44z of the gradient magnetic field power supply 44, respectively.

The X axis gradient magnetic field power supply 44x, the Y axis gradient magnetic field power supply 44y and the Z axis gradient magnetic field power supply 44z supply electric current to the X axis gradient magnetic field coil 26x, the Y axis gradient magnetic field coil 26y and the Z axis gradient magnetic field coil 26z respectively, so as to generate a gradient magnetic field Gx in the X axis direction, a gradient magnetic field Gy in the Y axis direction and a gradient magnetic field Gz in the Z axis direction in the imaging region.

That is, directions of a gradient magnetic field Gss in a slice selection direction, a gradient magnetic field Gpe in a phase encode direction and a gradient magnetic field Gro in a readout (frequency encode) direction can be arbitrarily set as logical axes, by combining gradient magnetic fields Gx, Gy and Gz in the X axis, Y axis and Z axis directions as three physical axes.

The gradient magnetic fields Gss, Gpe and Gro in the slice selection direction, the phase encode direction and the readout direction are superimposed on the static magnetic field.

Note that, the aforementioned imaging region means, for example, at least a part of an acquisition range of MR signals used to generate one image or one set of images, which becomes an image. The imaging region is defined as a part of the imaging space in terms of range and position by an apparatus coordinate system, for example.

In some cases, the entire acquisition range of MR signals becomes an image, i.e. the imaging region and the acquisition range of MR signals agree with each other. However, in some cases, the imaging region and the acquisition range of MR signals do not agree with each other. For example, when MR signals are acquired in a range wider than a region made into an image in order to prevent aliasing (artifact), the imaging region is a part of the acquisition range of MR signals.

The one image or one set of images may be a two-dimensional image or a three-dimensional image. Here, one set of images means, for example, a plurality of images when MR signals of the plurality of images are acquired in a lump in one pulse sequence such as multi-slice imaging.

The RF transmitter 46 generates RF pulses (RF pulse electric current) in accordance with control information provided from the sequence controller 56, and outputs the generated RF pulses to the transmission RF coil 28.

The RF coils 28 include whole body coil built in the gantry 21 for transmission and reception of RF pulses and local coils arranged around the bed 32 or the object QQ for reception of RF pulses.

The transmission RF coil 28 transmits an RF pulse given from the RF transmitter 46 to the object QQ. The reception RF coil 28 receives an MR signal generated due to excited nuclear spin inside the object QQ by the RF pulse and this MR signal is detected by the RF receiver 48.

The RF receiver 48 generates raw data which are digitized complex number data obtained by performing A/D (analogue to digital) conversion after performing predetermined signal processing such as preamplification, intermediate-frequency conversion, phase detection, low-frequency amplification and filtering on the detected MR signal. The RF receiver inputs the generated raw data to the sequence controller 56.

The operation device 60 performs system control of the MRI apparatus 20 in imaging operation, and its function will be explained later with FIG. 3.

The sequence controller 56 storages control information needed in order to make the gradient magnetic field power supply 44, the RF transmitter 46 and the RF receiver 48 drive, under the control by the operation device 60. The aforementioned control information includes, for example, sequence information describing operation control information such as intensity, impression period and impression timing of the pulse electric current which should be impressed to the gradient magnetic field power supply 44.

The sequence controller 56 generates the gradient magnetic fields Gx, Gy and Gz in the X axis, Y axis and Z axis directions and RF pulses, by driving the gradient magnetic field power supply 44, the RF transmitter 46 and the RF receiver 48 according to a predetermined sequence stored. Additionally, the sequence controller 56 receives the raw data of an MR signal inputted from the RF receiver 48, and input the raw data to the operation device 60.

Figure 2:
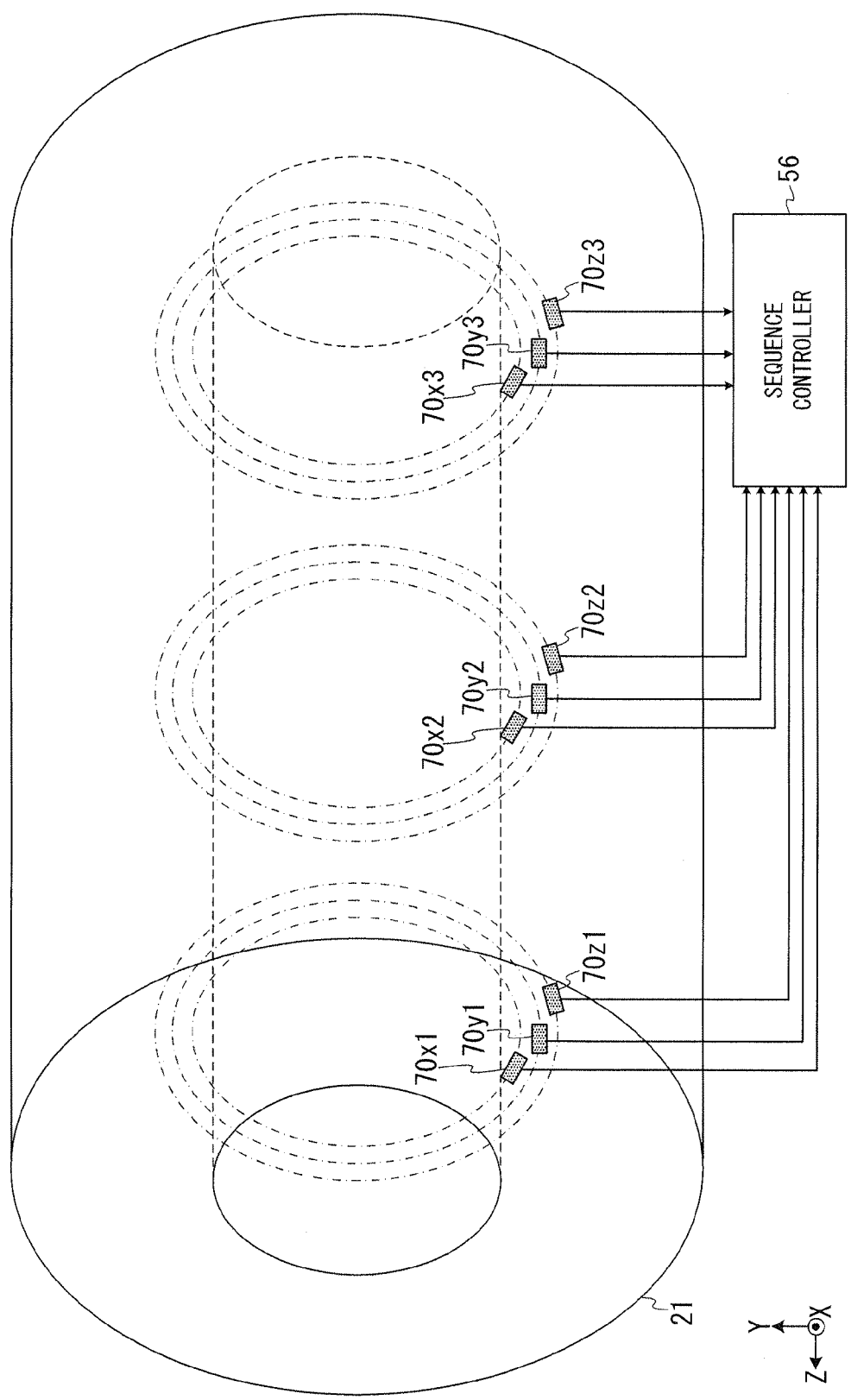
FIG. 2 is a schematic perspective view showing an arrangement of temperature sensors in a gantry of the MRI apparatus of the first embodiment.

FIG. 2 is a schematic perspective view showing an arrangement of temperature sensors in the gantry 21. In the gantry 21, the static magnetic field magnet 22, the shim coil 24, the gradient magnetic field coil 26 having a cylindrical shape shown in FIG. 1 are arranged (not shown in FIG. 2 for the sake of simplicity).

The gradient magnetic field coil 26 has a multilayer structure that comprises, in ascending order of the distance from the center, a layer of an X axis gradient magnetic field coil 26x, a layer of a Y axis gradient magnetic field coil 26y, a layer of a Z axis gradient magnetic field coil 26z and a cooling layer (not shown), for example, molded to form a cylindrical shape. The cooling layer is a structure including a cooling tube arranging layer and a shim tray arranging layer.

In the layer of the X axis gradient magnetic field coil 26x, temperature sensors 70x1, 70x2 and 70x3 are embedded at equal intervals in the Z axis direction in the apparatus coordinate system.

In the layer of the Y axis gradient magnetic field coil 26y, temperature sensors 70y1, 70y2 and 70y3 are embedded at equal intervals in the Z axis direction in the apparatus coordinate system.

In the layer of the Z axis gradient magnetic field coil 26z, temperature sensors 70z1, 70z2 and 70z3 are embedded at equal intervals in the Z axis direction in the apparatus coordinate system.

The temperature sensors 70x1 to 70x3 detect the temperature of the X axis gradient magnetic field coil 26x at their respective positions and input (transmit) the detected temperatures to a judging unit 102 (see FIG. 3, described later) via the sequence controller 56.

Similarly, the temperature sensors 70y1 to 70y3 detect the temperature of the Y axis gradient magnetic field coil 26y at their respective positions and input the detected temperatures to the judging unit 102.

Similarly, the temperature sensors 70z1 to 70z3 detect the temperature of the Z axis gradient magnetic field coil 26z at their respective positions and input the detected temperatures to the judging unit 102.

The arrangement of the temperature sensors 70x1 to 70x3, 70y1 to 70y3 and 70z1 to 70z3 is just an example. For example, in each of the layers of the X axis gradient magnetic field coil 26x, the Y axis gradient magnetic field coil 26y and the Z axis gradient magnetic field coils 26z, four or more temperature sensors may be embedded, and the judging unit 102 may calculate the maximum of the temperatures detected by the sensors.

Alternatively, one or two temperature sensors may be embedded in each of the layers of the X axis gradient magnetic field coil 26x, the Y axis gradient magnetic field coil 26y and the Z axis gradient magnetic field coils 26z.

The temperature sensors 70x1 to 70x3, 70y1 to 70y3 and 70z1 to 70z3 may be an infrared radiation thermometer, or a thermistor, a thermocouple or the like that substantially directly measures the temperature of the X axis gradient magnetic field coil 26x, the Y axis gradient magnetic field coil 26y and the Z axis gradient magnetic field coils 26z.

The infrared radiation thermometer can measure the temperature of the object QQ without coming into contact with the object QQ. Thus, the infrared radiation thermometer has an advantage that it can measure the temperature in a shorter time than "measuring methods that require the temperatures of the measurement target and the temperature sensor to be equal to each other as a result of heat conduction".

The operation device 60 of the computer 58 provides various functions, including control of the sequence controller 56 and control of the whole system of the MRI apparatus 20A, according to a program stored in the storage device 66. These various functions can also be provided by a particular circuit provided in the MRI apparatus 20A.

Typically, components (including the gantry 21) other than those of the control device 30 are installed in an examination room, and the components of the control device 30 are installed in a different room (a machine room, for example). However, embodiments of the present invention are not limited to this way of installation.

For example, the RF receiver 48 may be disposed in the gantry 21. The RF receiver 48 may be disposed in the vicinity of the receiving RF coil 28 in the gantry 21, convert an analog signal into a digital signal (and further into an optical signal) and transmit the resulting signal to the sequence controller 56 in the machine room. In this case, interference with unwanted noise can be reduced.

Figure 3:
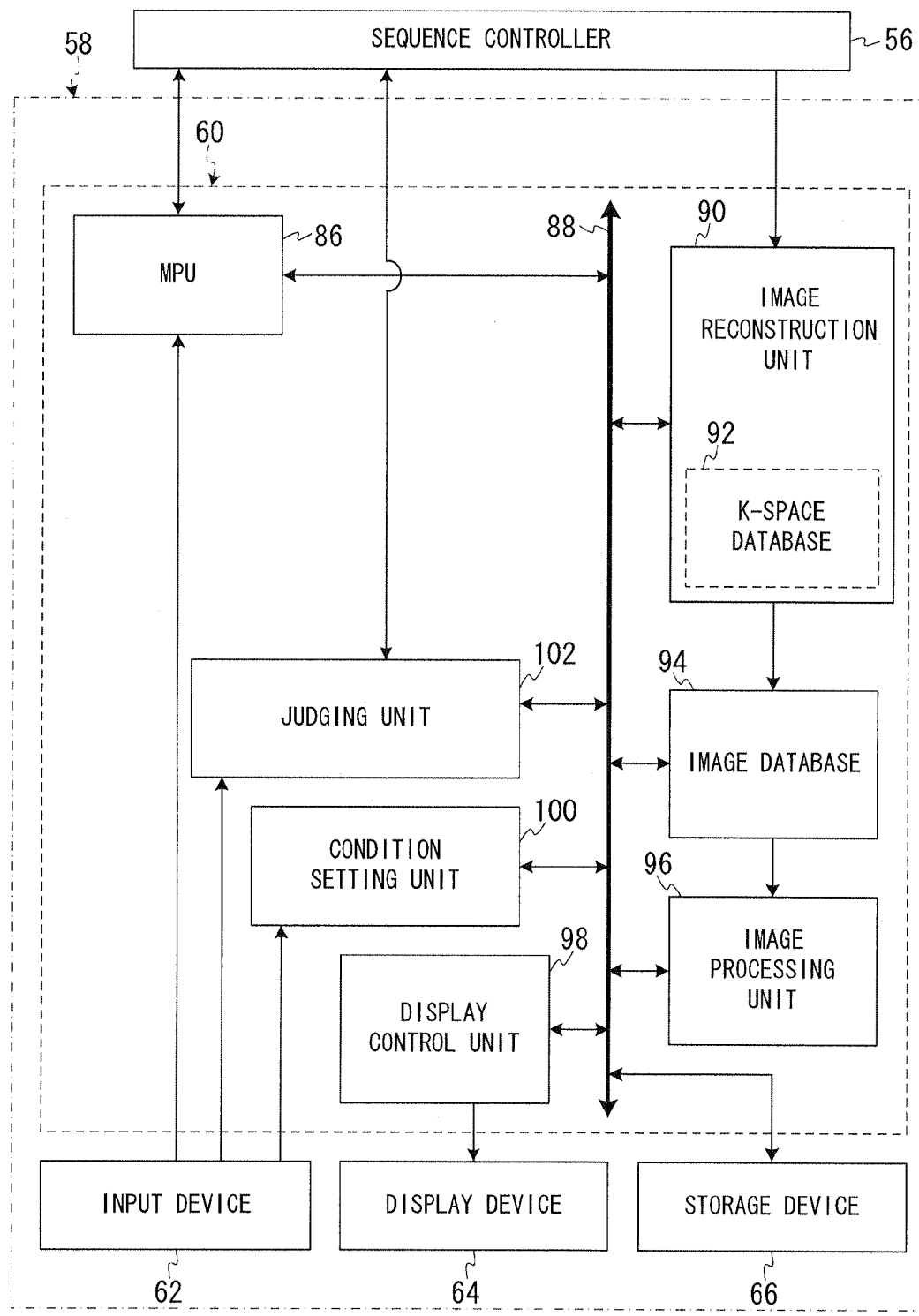
FIG. 3 is a functional block diagram of the computer 58 shown in FIG. 1.

FIG. 3 is a functional block diagram of the computer 58 shown in FIG. 1.

The operation device 60 of the computer 58 includes an MPU (Micro Processor Unit) 86, a system bus 88, an image reconstruction unit 90, an image database 94, an image processing unit 96, a display controlling unit 98, a condition setting unit 100, and a judging unit 102.

The MPU 86 performs system control of the MRI apparatus 20A in setting of conditions of an imaging sequence, imaging operation and image display after imaging through interconnection such as the system bus 88.

Additionally, the MPU 86 controls the display controlling unit 98 and displays screen information for setting conditions of an imaging sequence on the display device 64.

The input device 62 is, for example, an input tool such as a keyboard and a mouse, and provides a user with a function to set conditions of an imaging sequence and image processing conditions.

The display device 64 is, for example, a display equipment including a liquid crystal display. A user interface is composed of the input device 62 and the display device 64.

The image reconstruction unit 90 includes a k-space database 92 inside. The image reconstruction unit 90 arranges the raw data of MR signals inputted from the sequence controller 56 in the k-space (frequency-space) formed in the k-space database 92 as k-space data.

The image reconstruction unit 90 generates image data of each slice of the object QQ by performing image reconstruction processing including such as 2-dimensional Fourier transformation. The image reconstruction unit 90 stores the generated image data in the image database 94.

The image processing unit 96 takes in the image data from the image database 94, performs predetermined image processing on them, and stores the image data after the image processing in the storage device 66 as image data for display.

The storage device 66 stores the image data for display after adding accompanying information such as imaging conditions used for generating the image data for display and information of the object QQ (patient information) to the image data for display.

The display controlling unit 98 displays a screen for setting conditions of an imaging sequence and an image indicated by generated image data through imaging on the display device 64, under control of the MPU 86.

The condition setting unit 100 sets a condition for an imaging sequence based on information inputted via the input device 62. If the judging unit 102 judges that the set imaging sequence is impracticable, the condition setting unit 100 calculates a correction candidate for the conditions of the imaging sequence to make the imaging sequence practicable.

The judging unit 102 judges whether or not the imaging sequence set by the condition setting unit 100 is practicable according to the first to third judgment algorithms.

The judging unit 102 judges that the imaging sequence is practicable, only if neither of the first to third judgment algorithms has judged that the imaging sequence is impracticable. The first to third judgment algorithms are to make the judgment of whether the imaging sequence is practicable or not through calculation based on an equivalent circuit model of a gradient magnetic field generation system.

In the following, a principle of a first embodiment will be described. In the description, an example of a circuit configuration of the actual gradient magnetic field generation system will be first described, an example of a configuration of the equivalent circuit mode will be then described, the first judgment algorithm, the second judgment algorithm and the third judgment algorithm performed by the judging unit 102 will be then described, and a method for the condition setting unit 100 to calculate correction candidates for the conditions of the imaging sequence will be then described.

Figure 4:
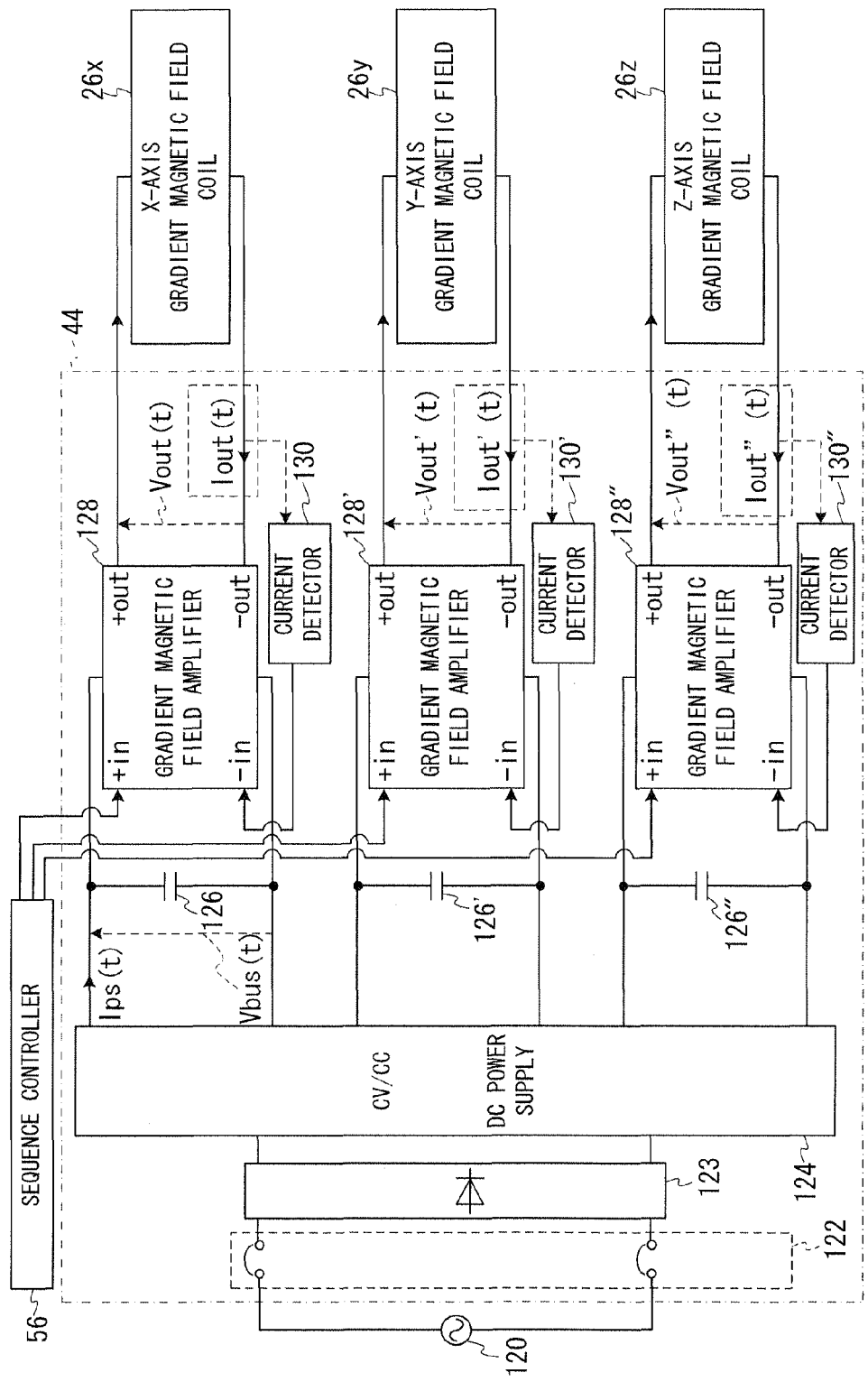
FIG. 4 is a block diagram showing an example of a configuration of a gradient magnetic field power supply 44 in FIG. 1.

FIG. 4 is a block diagram showing an example of a configuration of a gradient magnetic field power supply 44. As shown in FIG. 4, the gradient magnetic field power supply 44 has a breaker (circuit breaker) 122, a rectifier 123, a direct-current power supply 124, electrolyte capacitors 126, 126' and 126", gradient magnetic field amplifiers 128, 128' and 128", and current detectors 130, 130' and 130".

That is, the X axis gradient magnetic field power supply 44x, the Y axis gradient magnetic field power supply 44y and the Z axis gradient magnetic field power supply 44z shown in FIG. 1 share the breaker 122, the rectifier 123 and the direct-current power supply 124 that has CV/CC characteristics. The X axis gradient magnetic field power supply 44x shown in FIG. 1 corresponds to the breaker 122, the rectifier 123, the direct-current power supply 124, the electrolyte capacitor 126, the gradient magnetic field amplifier 128 and the current detector 130.

The direct-current power supply 124 having CV/CC characteristics is a power supply that outputs a constant voltage when the load is light and, when the load is heavy and electric current equal to or higher than a certain level needs to be supplied, supplies constant electric current to the load rather than outputting the needed current. That is, "CV" is an abbreviation of constant voltage, and "CC" is an abbreviation of constant current.

Similarly, the Y axis gradient magnetic field power supply 44y shown in FIG. 1 corresponds to the breaker 122, the rectifier 123, the direct-current power supply 124, the electrolyte capacitor 126', the gradient magnetic field amplifier 128' and the current detector 130'.

Similarly, the Z axis gradient magnetic field power supply 44z shown in FIG. 1 corresponds to the breaker 122, the rectifier 123, the direct-current power supply 124, the electrolyte capacitor 126", the gradient magnetic field amplifier 128" and the current detector 130".

The breaker 122 electrically disconnects an external alternating-current power supply 120 and the rectifier 123 from each other, when the output current from the alternating-current power supply 120 exceeds a rated current value.

The rectifier 123 converts the alternating-current power supplied from the alternating-current power supply 120 into a direct-current power, and supplies the direct-current power to the direct-current power supply 124.

The direct-current power supply 124 charges the electrolyte capacitors 126, 126' and 126" with the direct current supplied via the rectifier 123 and supplies the direct current to the gradient magnetic field amplifiers 128, 128' and 128".

The direct-current power supply 124 operates as a constant voltage source, when the load on the side of the gradient magnetic field amplifiers 128, 128' and 128" is light. The direct-current power supply 124 operates as a constant current source, when the load is heavy.

Each of the gradient magnetic field amplifiers 128, 128' and 128" has a positive-side input terminal (+IN in the drawing), a negative-side input terminal (−IN in the drawing), a positive-side output terminal (+OUT in the drawing) and a negative-side output terminal (−OUT in the drawing).

Each of the gradient magnetic field amplifiers 128, 128' and 128" receives the power from the direct-current power supply 124 and receives a control signal (voltage signal) from the sequence controller 56 at the positive-side input terminal. The control signals inputted from the sequence controller 56 to the gradient magnetic field amplifiers 128, 128' and 128" have waveforms similar to ideal waveforms of the magnetic fields to be generated by the X axis gradient magnetic field coil 26x, the Y axis gradient magnetic field coil 26y and the Z axis gradient magnetic field coil 26z according to the imaging sequence, respectively.

The current detectors 130, 130' and 130" detects the values of each electric current flowing into the negative-side output terminals of the gradient magnetic field amplifiers 128, 128' and 128", respectively, and the magnitudes of the detected electric current are equal to the magnitudes of the current outputted from the positive-side output terminals of the gradient magnetic field amplifiers 128, 128' and 128". This is because each electric current outputted from the positive-side output terminals of the gradient magnetic field amplifiers 128, 128' and 128" are fed back to the negative-side output terminals of the gradient magnetic field amplifiers 128, 128' and 128" through the gradient magnetic field coils 26x, 26y and 26z, respectively.

The current detectors 130, 130' and 130" generate voltage signals indicative of the values of the each detected electric current, and input the generated voltage signals to the negative-side input terminals of the gradient magnetic field amplifiers 128, 128' and 128", respectively.

The gradient magnetic field amplifiers 128, 128' and 128" each operate as a current source that outputs electric current, in such a manner that the error signal between the positive-side input terminal and the negative-side input terminal is 0. As described above, each output electric current of the gradient magnetic field amplifiers 128, 128' and 128" are negatively fed back by the current detectors 130, 130' and 130". Thus, the feedback control occurs, in such a manner that each electric current proportional to the voltages inputted to the positive-side input terminals of the gradient magnetic field amplifiers 128, 128' and 128" are outputted from the respective positive-side output terminals.

Figure 5:
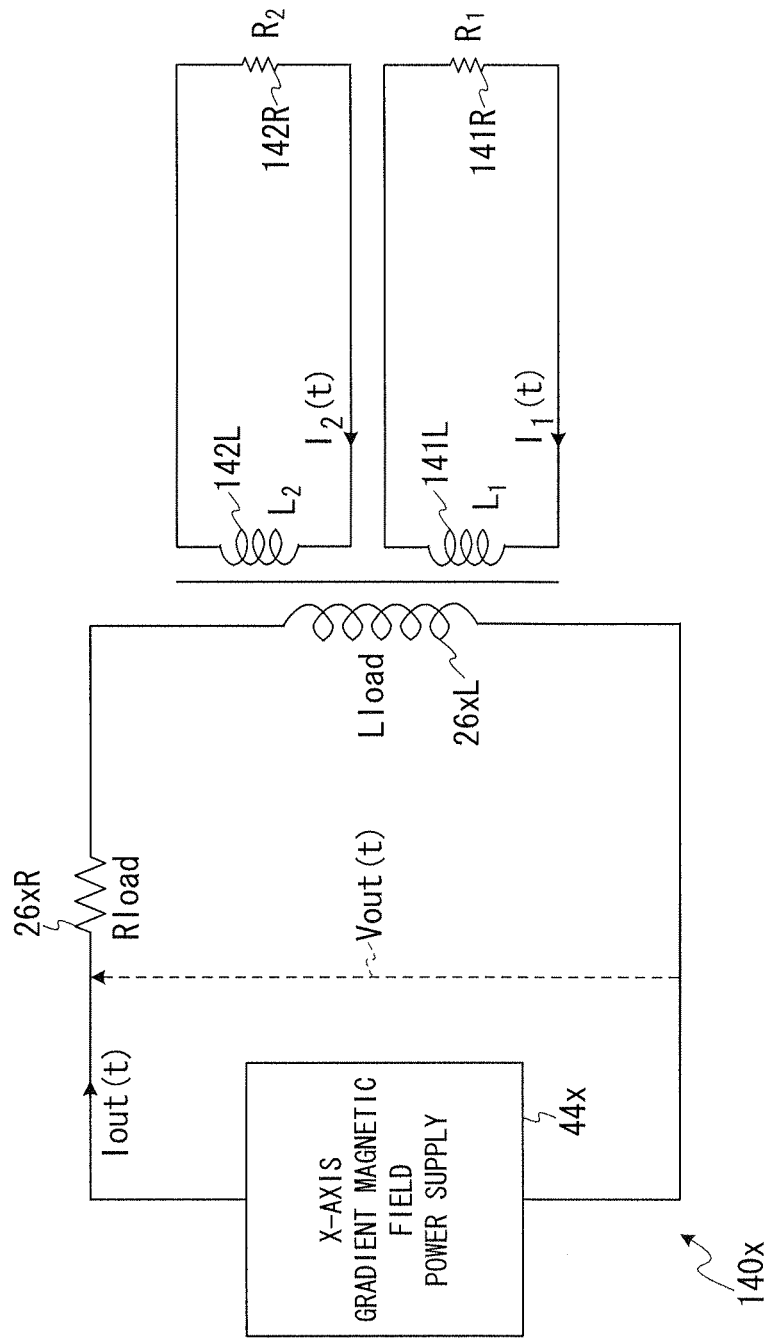
FIG. 5 is a circuit diagram showing an example of an equivalent circuit model of the gradient magnetic field generation system used in the calculation to judge whether an imaging sequence is practicable or not.

FIG. 5 is a circuit diagram showing an example of an equivalent circuit model of the gradient magnetic field generation system used in the calculation for the judging unit 102 to judge whether the imaging sequence is practicable or not. The gradient magnetic field generation system refers to the whole of the components involved in generation of the gradient magnetic field, including the gradient magnetic field power supply 44, the gradient magnetic field coil 26 and the sequence controller 56 shown in FIG. 1.

The judging unit 102 judges by calculation whether the imaging sequence is practicable or not on the assumption that the gradient magnetic field generation system has the circuit configuration shown in FIG. 5. That is, the actual gradient magnetic field generation system of the MRI apparatus 20A has the configuration shown in FIG. 4, which differs from the circuit configuration shown in FIG. 5.

As shown in FIG. 5, an equivalent circuit model 140x has, on the primary side, the X axis gradient magnetic field power supply 44x, a resistor 26xR that corresponds to the resistance component of the X axis gradient magnetic field coil 26x, and a coil 26xL that corresponds to the inductance component of the X axis gradient magnetic field coil 26x, which are connected to each other in series.

The equivalent circuit model 140x further has a series circuit of a resistor 141R and a coil 141L as a first secondary-side circuit. The equivalent circuit model 140x further has a series circuit of a resistor 142 and a coil 142L as a second secondary-side circuit. The coil 26xL and the coil 141L are electromagnetically coupled to each other. The coil 26xL and the coil 142L are also electromagnetically coupled to each other.

Now, the reason why the equivalent circuit model 140x having the configuration described above has been adopted will be described.

At higher frequencies, the impedances of the X axis gradient magnetic field coil 26x, the Y axis gradient magnetic field coil 26y and the Z axis gradient magnetic field coil 26z do not simply increase as in a simple model in which the impedance is expressed by the sum of one resistance component and one inductance component.

In actuality, for example, when high frequency electric current flows through a conductor, the electric current density is highest at the surface of the conductor and decreases as the distance from the surface increases. As the frequency increases, the electric current is more highly concentrated at the surface, because of the skin effect, and therefore, the alternating-current resistance of the conductor increases. Taking the skin effect into consideration, the term involving the resistance value of the resistor 26xR of the X axis gradient magnetic field coil 26x in the polynomial expressing the impedance of the gradient magnetic field generation system also desirably varies depending on the frequency.

Thus, it is desirable to adopt an equivalent circuit model in which the resistance value of the resistor 26xR is also multiplied by an angular frequency ω. That is, an equivalent circuit model that reflects not only the frequency dependence of the imaginary part of the impedance but also the frequency dependence of the real part of the impedance is desirable.

In actuality, furthermore, when pulse electric current is supplied to the X axis gradient magnetic field coil 26x, the Y axis gradient magnetic field coil 26y and the Z axis gradient magnetic field coil 26z respectively, eddy current occurs in the coils to generate a magnetic field, which is added to the gradient magnetic fields Gx, Gy and Gz to distort the gradient magnetic field distribution. To take into consideration the magnetic field generated by the eddy current, it is desirable to adopt an equivalent circuit model involving a mutual inductance.

Although not shown in the drawing, the actual gradient magnetic field generation system may include a choke coil that cuts off high frequency electric current at a predetermined frequency or higher. Thus, it is desirable to adopt an equivalent circuit model that involves a plurality of, not a single, mutual inductances.

The equivalent circuit model 140x shown in FIG. 5 is just an example of the equivalent circuit models described above, and the equivalent circuit model is not limited to the configuration shown in FIG. 5 (see FIGS. 16 and 17 described later).

Furthermore, as described above, the series circuit of the resistor 141R and the coil 141L and the series circuit of the resistor 142R and the coil 142L are actually existing components that correspond to the mutual inductance component, the resistance component or the like involved in the magnetic field generated by the eddy current, the skin effect or the like.

In this specification, for the sake of convenience, the series circuit of the resistor 141R and the coil 141L is regarded as a "virtual coil" different from the gradient magnetic field coil 26. Thus, in this specification, for the sake of convenience, the resistance value of the resistor 141R is regarded as the resistance component of the virtual coil, and the self-inductance value of the coil 141L is regarded as the self-inductance value of the virtual coil.

However, the series circuit of the resistor 141R and the coil 141L is not a non-existing component but is an expression of the actually existing mutual inductance component or the like in the equivalent circuit.

The aforementioned interpretation described above holds true for the series circuit of the resistor 142R and the coil 142L in FIG. 5. The aforementioned interpretation also holds true for a series circuit of a capacitor 143C, a coil 143L and a resistor 143R according to a modification shown in FIG. 16 described later. Furthermore, the same interpretation holds true for a parallel circuit of the capacitor 143C, the coil 143L and the resistor 143R according to a modification shown in FIG. 17 described later.

Next, the first judgment algorithm for the judging unit 102 to judge whether the image sequence is practicable or not will be described.

In FIG. 5, the resistance values of the resistors 26xR, 141R and 142R are denoted by Rload, $R_1$ and $R_2$, respectively.

The self-inductance values of the coils 26xL, 141L and 142L are denoted by Lload, $L_1$ and $L_2$, respectively.

The mutual inductance value of the coils 26xL and 141L is denoted by $M_1$.

The mutual inductance value of the coils 26xL and 142L is denoted by $M_2$.

The value of the electric current flowing in the primary-side circuit in the direction of the arrow in FIG. 5 is denoted by Iout(t).

The value of the electric current flowing in the first secondary-side circuit in the direction of the arrow in FIG. 5 is denoted by $I_1(t)$.

The value of the electric current flowing in the second secondary-side circuit in the direction of the arrow in FIG. 5 is denoted by $I_2(t)$.

The value of the voltage across "the coil 26xL and the resistor 26xR" is denoted by Vout(t), on the assumption that the direction of the arrow in FIG. 5 is the positive direction.

"(t)" in these expressions means that the expression is a function of time t, and the same holds true for the other expressions found in the following description. On the primary side and the secondary side, the following formulas (1), (2) and (3) hold.

$$Vout(t) = R_{load} \cdot Iout(t) + L_{load} \cdot \frac{d\,Iout(t)}{dt} + M_1 \cdot \frac{d\,I_1(t)}{dt} + M_2 \cdot \frac{d\,I_2(t)}{dt} \quad (1)$$

$$0 = R_1 \cdot I_1(t) + L_1 \cdot \frac{d\,I_1(t)}{dt} + M_1 \cdot \frac{d\,Iout(t)}{dt} \quad (2)$$

$$0 = R_2 \cdot I_2(t) + L_2 \cdot \frac{d\,I_2(t)}{dt} + M_2 \cdot \frac{d\,Iout(t)}{dt} \quad (3)$$

$M_1$ in the formulas (1) to (3) is expressed by the following formula (4), and $M_2$ in the formulas (1) to (3) is expressed by the following formula (5).

$$M_1 = K_1 \cdot \sqrt{L_{load} \cdot L_1} \quad (4)$$

$$M_2 = K_2 \cdot \sqrt{L_{load} \cdot L_2} \quad (5)$$

$K_1$ in the formula (4) denotes a coupling coefficient of the coils 26xL and 141L, and $K_2$ in the formula (5) denotes a coupling coefficient of the coils 26xL and 142L. The imaginary unit is denoted by j. That is, j squared equals to −1.

In the case of an alternating-current, by replacing the time differential d/dt with j×ω, the formula (2) can be transformed into the following formula (6), and the formula (3) can be transformed into the following formula (7).

$$I_1(t) = -\frac{j \cdot \omega \cdot M_1}{R_1 + j \cdot \omega \cdot L_1} \cdot Iout(t) \quad (6)$$

$$I_2(t) = -\frac{j \cdot \omega \cdot M_2}{R_2 + j \cdot \omega \cdot L_2} \cdot Iout(t) \quad (7)$$

In the equivalent circuit model 140x, the impedance of the X axis gradient magnetic field coil 26x viewed from the X axis gradient magnetic field power supply 44x is denoted by Z. If both sides of the formula (1) are divided by Iout(t), the time differential d/dt is replaced with j×ω, and the formulas (6) and (7) are substituted into the formula (1), the impedance Z is expressed by the following formula (8).

$$Z = \frac{Vout(t)}{Iout(t)} \quad (8)$$

$$= R_{load} + j \cdot \omega \cdot L_{load} + \frac{j \cdot \omega \cdot M_1 \cdot I_1(t)}{Iout(t)} + \frac{j \cdot \omega \cdot M_2 \cdot I_2(t)}{Iout(t)}$$

$$= R_{load} + j \cdot \omega \cdot L_{load} - j \cdot \omega \cdot M_1 \cdot \frac{j \cdot \omega \cdot M_1}{R_1 + j \cdot \omega \cdot L_1} -$$

$$j \cdot \omega \cdot M_2 \cdot \frac{j \cdot \omega \cdot M_2}{R_2 + j \cdot \omega \cdot L_2}$$

$$= R_{load} + j \cdot \omega \cdot L_{load} + \frac{\omega^2 \cdot M_1^2}{R_1 + j \cdot \omega \cdot L_1} + \frac{\omega^2 \cdot M_2^2}{R_2 + j \cdot \omega \cdot L_2}$$

$$= R_{load} + j \cdot \omega \cdot L_{load} + \frac{\omega^2 \cdot M_1^2 \cdot (R_1 - j \cdot \omega \cdot L_1)}{R_1^2 + \omega^2 \cdot L_1^2} +$$

$$\frac{\omega^2 \cdot M_2^2 \cdot (R_2 - j \cdot \omega \cdot L_2)}{R_2^2 + \omega^2 \cdot L_2^2}$$

$$= R_{load} + \frac{\omega^2 \cdot M_1^2 \cdot R_1}{R_1^2 + \omega^2 \cdot L_1^2} + \frac{\omega^2 \cdot M_2^2 \cdot R_2}{R_2^2 + \omega^2 \cdot L_2^2} + j \cdot \omega \cdot L_{load} -$$

$$\frac{j \cdot \omega^3 \cdot M_1^2 \cdot L_1}{R_1^2 + \omega^2 \cdot L_1^2} - \frac{j \cdot \omega^3 \cdot M_2^2 \cdot L_2}{R_2^2 + \omega^2 \cdot L_2^2}$$

According to the formula (8), the real part $Re\{Z\}$ and the imaginary part $Im\{Z\}$ of the impedance Z viewed from the X axis gradient magnetic field power supply 44x are expressed by the following formulas (9) and (10), respectively.

$$Re\{Z\} = R_{load} + \frac{\omega^2 \cdot M_1^2 \cdot R_1}{R_1^2 + \omega^2 \cdot L_1^2} + \frac{\omega^2 \cdot M_2^2 \cdot R_2}{R_2^2 + \omega^2 \cdot L_2^2} \quad (9)$$

$$= R_{load} + \frac{A \cdot \omega^2}{1 + B \cdot \omega^2} + \frac{C \cdot \omega^2}{1 + D \cdot \omega^2}$$

$$Im\{Z\} = \omega \cdot \left\{ L_{load} - \frac{\omega^2 \cdot M_1^2 \cdot L_1}{R_1^2 + \omega^2 \cdot L_1^2} - \frac{\omega^2 \cdot M_2^2 \cdot L_2}{R_2^2 + \omega^2 \cdot L_2^2} \right\} \quad (10)$$

$$= \omega \cdot \left\{ L_{load} - \frac{A \cdot \sqrt{B} \cdot \omega^2}{1 + B \cdot \omega^2} - \frac{C \cdot \sqrt{D} \cdot \omega^2}{1 + D \cdot \omega^2} \right\}$$

Circuit constants A, B, C and D in the formulas (9) and (10) are expressed by the following formulas (11), (12), (13) and (14), respectively.

$$A = \frac{M_1^2}{R_1} \quad (11)$$

$$B = \frac{L_1^2}{R_1^2} \quad (12)$$

$$C = \frac{M_2^2}{R_2} \quad (13)$$

$$D = \frac{L_2^2}{R_2^2} \quad (14)$$

Figure 6:
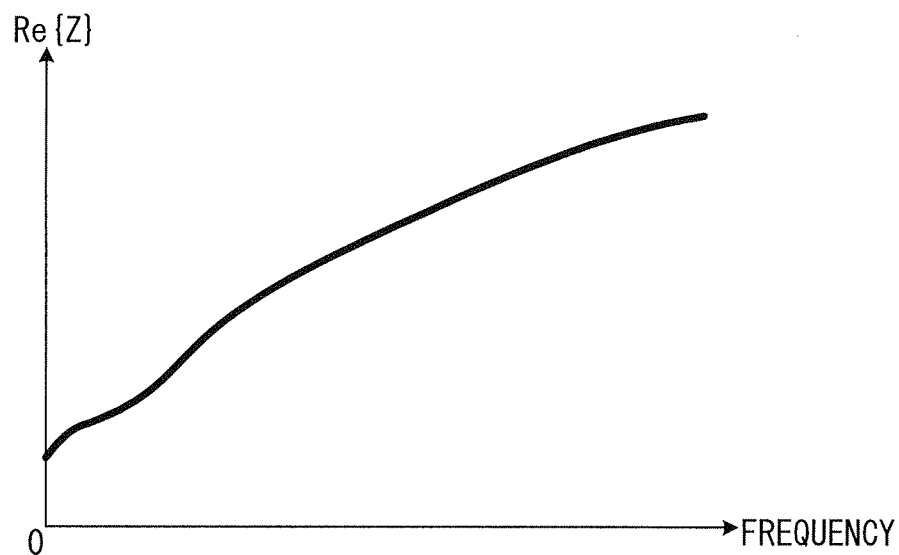
FIG. 6 is a graph schematically showing measurements of frequency characteristics of the real part $Re\{Z\}$ of the impedance Z of a gradient magnetic field coil.

FIG. 6 is a graph schematically showing measurements of frequency characteristics of the real part $Re\{Z\}$ of the impedance Z of the X axis gradient magnetic field coil 26x. In FIG. 6, the horizontal axis indicates frequency, and the vertical axis indicates the real part $Re\{Z\}$ of the impedance Z.

Figure 7:
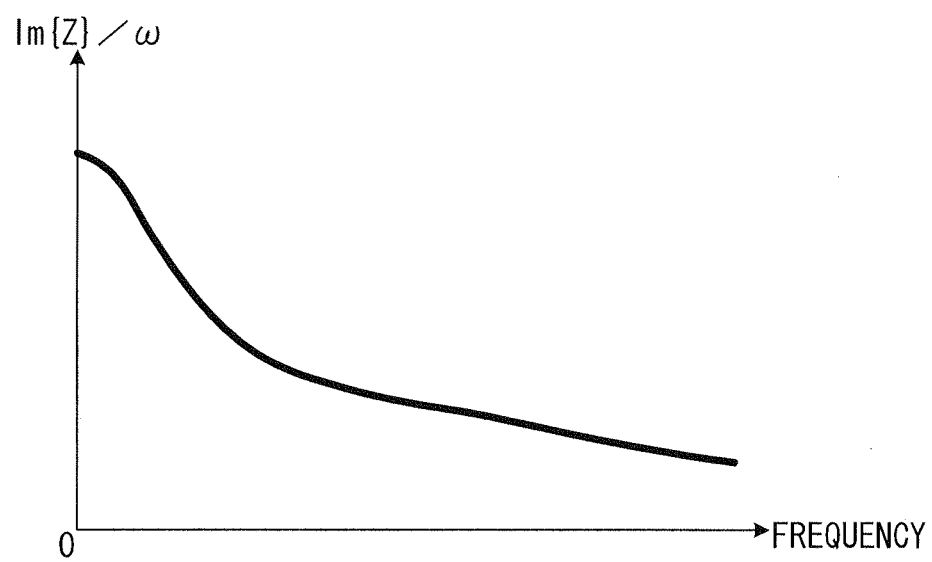
FIG. 7 is a graph schematically showing measurements of frequency characteristics of $Im\{Z\}/\omega$, which is the imaginary part $Im\{Z\}$ of the impedance Z of the gradient magnetic field coil divided by an angular frequency $\omega$.

FIG. 7 is a graph schematically showing measurements of frequency characteristics of $Im\{Z\}/\omega$, which is the imaginary part $Im\{Z\}$ of the impedance Z of the X axis gradient magnetic field coil 26x divided by ω. In FIG. 7, the horizontal axis indicates frequency, and the vertical axis indicates $Im\{Z\}/\omega$.

The resistance value Rload in the formula (9) and the like is preliminarily determined by measuring the voltage across the X axis gradient magnetic field coil 26x in the case where a direct current is passed through the X axis gradient magnetic field coil 26x, and is preliminarily stored in the judging unit 102. The measurement can be achieved with an LCR meter, for example ("L" in LCR means inductance, "C" means capacitance, and "R" means resistance).

The self-inductance value Lload in the formula (10) and the like can be calculated from measurements of the magnetic flux generated by the X axis gradient magnetic field coil 26x when a direct current is passed through the X axis gradient magnetic field coil 26x, for example.

Alternatively, the self-inductance value Lload may be determined by measurement with the LCR meter at a low frequency (1 to 10 Hertz, for example) at which the self-inductance value is not affected by the secondary side in the equivalent circuit model 140x.

Alternatively, a theoretical value of the self-inductance value Lload may be calculated from the shape (the way of winding of the coil), the material or the like of the X axis gradient magnetic field coil 26x and used.

The self-inductance value preliminarily determined in this way is preliminarily stored in the judging unit 102.

Once the resistance value Rload and the self-inductance value Lload are determined as described above, the coupling coefficient $K_1$ in the formula (4), the coupling coefficient $K_2$ in the formula (5), a time constant $\tau_1 = L_1/R_1$ and a time constant $\tau_2 = L_2/R_2$ can be determined by fitting as described below, for example.

Specifically, fitting between the frequency characteristics of the real part $Re\{Z\}$ of the impedance Z expressed by the formula (9) and the measurements of the frequency characteristics of the real part of the impedance of the X axis gradient magnetic field coil 26x is performed.

In addition, fitting between the frequency characteristics of $Im\{Z\}/\omega$, which is the imaginary part $Im\{Z\}$ of the impedance Z expressed by the formula (10) divided by the angular frequency c, and the measurements of the frequency characteristics of the imaginary part of the impedance of the X axis gradient magnetic field coil 26x divided by the angular frequency ω is performed.

Although the real part $Re\{Z\}$ and $Im\{Z\}/\omega$, which is the imaginary part divided by the angular frequency ω, are used in the fittings described above, calculated values and measurements of (the amplitude and the phase of) the impedance Z, which is the sum of the formulas (9) and (10), may be used for the fittings.

Alternatively, calculated values and measurements of the phase difference between the real part $Re\{Z\}$ and the imaginary part $Im\{Z\}$ of the impedance Z may be used for the fittings.

Once the coupling coefficients $K_1$ and $K_2$ and the time constants $\tau_1$ and $\tau_2$ are determined, the mutual inductances $M_1$ and $M_2$ are determined according to the formulas (4) and (5), and the circuit constants A, B, C and D are determined according to the formulas (11) to (14).

The inductance values Rload and Lload and the circuit constants A, B, C and D determined as described above are preliminarily stored in the judging unit 102. In this way, the real part Re{Z} and the imaginary part Im{Z} of the impedance Z at any frequency can be calculated according to the formulas (9) and (10).

Next, in order to determine the voltage Vout(t) required to pass the output electric current Iout(t) through the X axis gradient magnetic field coil 26x, a formula that does not involve the electric current $I_1(t)$ and the electric current $I_2(t)$ is derived from the formula (1).

The electric current $I_1(t)$ and the electric current $I_2(t)$ are accidental electric current occurring in the equivalent circuit model 140x that is induced by the output current Iout(t) of the actual gradient magnetic field generation system.

First, both sides of the formulas (1) to (3) are differentiated with respect to time to obtain the following formulas (15), (16) and (17).

$$\frac{d\,Vout(t)}{dt} = \qquad (15)$$
$$R_{load} \cdot \frac{d\,Iout(t)}{dt} + L_{load} \cdot \frac{d^2\,Iout(t)}{dt^2} + M_1 \cdot \frac{d^2\,I_1(t)}{dt^2} + M_2 \cdot \frac{d^2\,I_2(t)}{dt^2}$$

$$0 = R_1 \cdot \frac{d\,I_1(t)}{dt} + L_1 \cdot \frac{d^2\,I_1(t)}{dt^2} + M_1 \cdot \frac{d^2\,Iout(t)}{dt^2} \qquad (16)$$

$$0 = R_2 \cdot \frac{d\,I_2(t)}{dt} + L_2 \cdot \frac{d^2\,I_2(t)}{dt^2} + M_2 \cdot \frac{d^2\,Iout(t)}{dt^2} \qquad (17)$$

Next, in order to eliminate the time differential of $I_2(t)$ and the second-order time differential of $I_2(t)$, the formula (15) is transformed into the following formula (18), and the formula (1) is transformed into the following formula (19).

$$\frac{d^2\,I_2(t)}{dt^2} = \qquad (18)$$
$$\frac{1}{M_2}\left\{\frac{d\,Vout(t)}{dt} - R_{load} \cdot \frac{d\,Iout(t)}{dt} - L_{load} \cdot \frac{d^2\,Iout(t)}{dt^2} + M_1 \cdot \frac{d^2\,I_1(t)}{dt^2}\right\}$$

$$\frac{d\,I_2(t)}{dt} = \frac{1}{M_2}\left\{Vout(t) - R_{load} \cdot Iout(t) - L_{load} \cdot \frac{d\,Iout(t)}{dt} - M_1 \cdot \frac{d\,I_1(t)}{dt}\right\} \qquad (19)$$

The formulas (18) and (19) described above are substituted into the formula (17), and then, both sides of the resulting formula (17) are multiplied by $M_2$, thereby obtaining the following formula (20) that does not involve $I_2(t)$.

$$0 = R_2 \cdot \left\{Vout(t) - R_{load} \cdot Iout(t) - L_{load} \cdot \frac{d\,Iout(t)}{dt} - M_1 \cdot \frac{d\,I_1(t)}{dt}\right\} + \qquad (20)$$
$$L_2 \cdot \left\{\frac{d\,Vout(t)}{dt} - R_{load} \cdot \frac{d\,Iout(t)}{dt} - L_{load} \cdot \frac{d^2\,Iout(t)}{dt^2} - M_1 \cdot \frac{d^2\,I_1(t)}{dt^2}\right\} + M_2^2 \cdot \frac{d^2\,Iout(t)}{dt^2} =$$
$$R_2 \cdot Vout(t) - R_{load} \cdot R_2 \cdot Iout(t) - L_{load} \cdot R_2 \cdot \frac{d\,Iout(t)}{dt} - R_2 \cdot M_1 \cdot \frac{d\,I_1(t)}{dt} + L_2 \cdot \frac{d\,Vout(t)}{dt} - L_2 \cdot R_{load} \cdot \frac{d\,Iout(t)}{dt} - L_{load} \cdot L_2 \cdot \frac{d^2\,Iout(t)}{dt^2} - L_2 \cdot M_1 \cdot \frac{d^2\,I_1(t)}{dt^2} + M_2^2 \cdot \frac{d^2\,Iout(t)}{dt^2}$$

Then, the second-order time differential of $I_1(t)$ is eliminated. Specifically, the formula (16) is transformed into the following formula (21), the formula (21) is substituted into the formula (20) to obtain the following formula (22). Then, both sides of the formula (22) are multiplied $L_1$, and only the terms involved with $dI_1/dt$ are transposed to the left side, thereby obtaining the following formula (23).

$$\frac{d^2\,I_1(t)}{dt^2} = -\frac{1}{L_1}\left\{R_1 \cdot \frac{d\,I_1(t)}{dt} + M_1 \cdot \frac{d^2\,Iout(t)}{dt^2}\right\} \qquad (21)$$

$$0 = R_2 \cdot Vout(t) - R_{load} \cdot R_2 \cdot Iout(t) - \qquad (22)$$
$$L_{load} \cdot R_2 \cdot \frac{d\,Iout(t)}{dt} - R_2 \cdot M_1 \cdot \frac{d\,I_1(t)}{dt} + L_2 \cdot \frac{d\,Vout(t)}{dt} - L_2 \cdot R_{load} \cdot \frac{d\,Iout(t)}{dt} - L_{load} \cdot L_2 \cdot \frac{d^2\,Iout(t)}{dt^2} + \frac{L_2 \cdot M_1}{L_1}\left\{R_1 \cdot \frac{d\,I_1(t)}{dt} + M_1 \cdot \frac{d^2\,Iout(t)}{dt^2}\right\} + M_2^2 \cdot \frac{d^2\,Iout(t)}{dt^2}$$

$$M_1 \cdot (L_1 \cdot R_2 - L_2 \cdot R_1) \cdot \frac{d\,I_1(t)}{dt} = \qquad (23)$$
$$L_1 \cdot R_2 \cdot Vout(t) + L_1 \cdot L_2 \cdot \frac{d\,Vout(t)}{dt} - L_1 \cdot R_{load} \cdot R_2 \cdot Iout(t) - (L_{load} \cdot L_1 \cdot R_2 + L_1 \cdot L_2 \cdot R_{load}) \cdot \frac{d\,Iout(t)}{dt} + (L_1 \cdot M_2^2 + L_2 \cdot M_1^2 - L_{load} \cdot L_1 \cdot L_2) \cdot \frac{d^2\,Iout(t)}{dt^2}$$

Then, both sides of the formula (23) are differentiated with respect to time to obtain the following formula (24), and both sides of the formula (16) are multiplied by $M_1 \times (L_1 \times R_2 - L_2 \times R_1)$ to obtain the following formula (25).

$$M_1 \cdot (L_1 \cdot R_2 - L_2 \cdot R_1) \cdot \frac{d^2\,I_1(t)}{dt^2} = \qquad (24)$$
$$L_1 \cdot R_2 \cdot \frac{d\,Vout(t)}{dt} + L_1 \cdot L_2 \cdot \frac{d^2\,Vout(t)}{dt^2} - L_1 \cdot R_{load} \cdot R_2 \cdot \frac{d\,Iout(t)}{dt} - (L_{load} \cdot L_1 \cdot R_2 + L_1 \cdot L_2 \cdot R_{load}) \cdot \frac{d^2\,Iout(t)}{dt^2} + (L_1 \cdot M_2^2 + L_2 \cdot M_1^2 - L_{load} \cdot L_1 \cdot L_2) \cdot \frac{d^3\,Iout(t)}{dt^3}$$

$$0 = R_1 \cdot M_1 \cdot (L_1 \cdot R_2 - L_2 \cdot R_1) \cdot \frac{d\,I_1(t)}{dt} + \qquad (25)$$
$$L_1 \cdot M_1 \cdot (L_1 \cdot R_2 - L_2 \cdot R_1) \cdot \frac{d^2\,I_1(t)}{dt^2} + M_1^2 \cdot (L_1 \cdot R_2 - L_2 \cdot R_1) \cdot \frac{d^2\,Iout(t)}{dt^2}$$

Then, both sides of the formula (23) are divided $M_1 \times (L_1 \times R_2 - L_2 \times R_1)$ to transform the formula (23) into an equation of $dI_1/dt=$, and $dI_1/dt$ expressed by the equation is substituted into the formula (25). Similarly, the formula (24) is transformed into an equation of $d^2I_1/dt^2=$, and $d^2I_1/dt^2$ expressed by the equation is substituted into the formula (25). Thus, by these substitutions, the following formula (26) is obtained.

$$0 = L_1 \cdot R_1 \cdot R_2 \cdot Vout(t) + \qquad (26)$$
$$R_1 \cdot L_1 \cdot L_2 \cdot \frac{d\,Vout(t)}{dt} - L_1 \cdot R_{load} \cdot R_1 \cdot R_2 \cdot Iout(t) - (L_{load} \cdot L_1 \cdot R_1 \cdot R_2 + L_1 \cdot L_2 \cdot R_{load} \cdot R_1) \cdot \frac{d\,Iout(t)}{dt} + (L_1 \cdot R_1 \cdot M_2^2 + L_2 \cdot R_1 \cdot M_1^2 - L_{load} \cdot L_1 \cdot L_2 \cdot R_1) \cdot \frac{d^2\,Iout(t)}{dt^2} + L_1^2 \cdot R_2 \cdot \frac{d\,Vout(t)}{dt} + L_1^2 \cdot L_2 \cdot \frac{d^2\,Vout(t)}{dt^2} - L_1^2 \cdot R_{load} \cdot R_2 \cdot \frac{d\,Iout(t)}{dt} -$$

-continued $$(L_{load} \cdot L_1^2 \cdot R_2 + L_1^2 \cdot L_2 \cdot R_{load}) \cdot \frac{d^2 Iout(t)}{dt^2} +$$

$$(L_1^2 \cdot M_2^2 + L_1 \cdot L_2 \cdot M_1^2 - L_{load} \cdot L_1^2 \cdot L_2) \cdot \frac{d^3 Iout(t)}{dt^3} +$$

$$M_1^2 \cdot (L_1 \cdot R_2 - L_2 \cdot R_1) \cdot \frac{d^2 Iout(t)}{dt^2}$$

In the formula (26), only the terms involved with Vout(t) are transposed to the left side, and then both sides of the resulting formula are divided by $(-L_1^2 \times L_2)$, thereby obtaining the following formula (27) that does not involve $I_1(t)$ and $I_2(t)$.

$$\frac{d^2 Vout(t)}{dt^2} + \left(\frac{R_1}{L_1} + \frac{R_2}{L_2}\right) \cdot \frac{dVout(t)}{dt} + \left(\frac{R_1}{L_1} \cdot \frac{R_2}{L_2}\right) \cdot Vout(t) = \quad (27)$$

$$\left(L_{load} - \frac{M_2^2}{L_2} - \frac{M_1^2}{L_1}\right) \cdot \frac{d^3 Iout(t)}{dt^3} +$$

$$\left(Rload + \frac{L_{load} \cdot R_1}{L_1} + \frac{L_{load} \cdot R_2}{L_2} - \frac{R_1 \cdot M_2^2}{L_1 \cdot L_2} - \frac{R_2 \cdot M_1^2}{L_1 \cdot L_2}\right) \cdot$$

$$\frac{d^2 Iout(t)}{dt^2} + \left(\frac{R_1 \cdot R_2 \cdot L_{load}}{L_1 \cdot L_2} + \frac{R_{load} \cdot R_1}{L_1} + \frac{R_{load} \cdot R_2}{L_2}\right) \cdot$$

$$\frac{dIout}{dt} + \left(\frac{R_{load} \cdot R_1 \cdot R_2}{L_1 \cdot L_2}\right) \cdot Iout(t)$$

In the formula (27), the output electric current Iout(t) outputted from the X axis gradient magnetic field power supply 44x, that is, the electric current flowing through the X axis gradient magnetic field coil 26x, is determined by the conditions of the imaging sequence.

This is because once the conditions of the imaging sequence are determined, the gradient magnetic field waveform of the X axis gradient magnetic field Gx to be generated is determined, and the gradient magnetic field waveform of the X axis gradient magnetic field Gx is determined by the waveform of the electric current flowing through the X axis gradient magnetic field coil 26x.

Therefore, if an initial value of the output electric current Iout(t) is determined, the value of the right side of the formula (27), which involves the third order time differential of the output electric current Iout(t), can be calculated. This is because the values of Lload, $L_1$, $L_2$, Rload, $R_1$, $R_2$, $M_1$ and $M_2$ in the formula (27) are previously determined as described above.

If the right side of the formula (27) is determined in this way, the formula (27) is the second order time differential equation of the output voltage Vout(t). The output voltage Vout(t) required to pass the output electric current Iout(t) through the X axis gradient magnetic field coil 26x can be calculated by solving the equation.

If this calculation is performed with a conventional model in which the gradient magnetic field coil is represented by a series circuit of a coil and a resistor, the output power required to pass the output electric current Iout(t) through the X axis gradient magnetic field coil 26x can be underestimated. In such a case, the output voltage can be inadequate during the imaging sequence.

However, according to the first embodiment, since the calculation is performed according to the formula (27), the output voltage Vout(t), and therefore the output power, required to pass the output electric current Iout(t) through the X axis gradient magnetic field coil 26x can be accurately calculated.

As a result, according to the first embodiment, the voltage can be prevented from being inadequate (insufficient) during the imaging sequence.

Next, a power consumption Pxcoil(t) of the X axis gradient magnetic field coil 26x can be calculated according to the following formula (28).

$$Pxcoil(t) = Iout(t) \times Vout(t) \quad (28)$$

The amount ΔHeat of heat generated by the X axis gradient magnetic field coil 26x can be calculated as a time integral of the power consumption Pxcoil(t) over a period from the start time to the end time of the imaging sequence. Provided that the thermal resistance value of the X axis gradient magnetic field coil 26x is denoted by RHX, a temperature increase ΔTempx of the X axis gradient magnetic field coil 26x is expressed by the following formula.

$$\Delta Tempx = RHX \times \Delta Heat \quad (29)$$

In the formula (29), the thermal resistance value RHX of the X axis gradient magnetic field coil 26x is a measured value, for example, and is preliminarily stored in the judging unit 102.

More specifically, for example, a constant direct current is passed through the X axis gradient magnetic field coil 26x, and the voltage across the X axis gradient magnetic field coil 26x is measured, thereby calculating the power applied to the X axis gradient magnetic field coil 26x.

The increase in temperature of the X axis gradient magnetic field coil 26x in a period from a point in time immediately before application of the direct current to a point in time immediately after application of the direct current is measured with the temperature sensors 70x1 to 70x3. Once the power applied to the X axis gradient magnetic field coil 26x and the temperature increase provided thereby are determined by this measurement, the thermal resistance value RHX can be calculated.

The temperature Tempx of the X axis gradient magnetic field coil 26x immediately after the imaging sequence is performed can be calculated by adding the temperature increase ΔTempx calculated based on the equivalent circuit model 140x to the measured temperature of the X axis gradient magnetic field coil 26x immediately before the imaging sequence is performed.

The judging unit 102 preliminarily stores the formulas (1) to (29) described above and the circuit constants (A, B and the like) found in these formulas. Therefore, if the temperature of the X axis gradient magnetic field coil 26x immediately after the imaging sequence is performed is higher than a preset threshold, the judging unit 102 judges that the imaging sequence is impracticable.

The judging unit 102 calculates the temperature of the Y axis gradient magnetic field coil 26y immediately after the imaging sequence is performed in the same manner, and judges that the imaging sequence is impracticable if the calculated temperature is higher than a threshold.

The judging unit 102 calculates the temperature of the Z axis gradient magnetic field coil 26z immediately after the imaging sequence is performed in the same manner, and judges that the imaging sequence is impracticable if the calculated temperature is higher than a threshold.

When all the temperatures of the X axis gradient magnetic field coils 26x, the Y axis gradient magnetic field coils 26y and the Z axis gradient magnetic field coil 26z immediately after the imaging sequence is performed are equal to or lower than the respective thresholds, if it is not judged according to the second and third judgment algorithms that the imaging sequence is impracticable, the judging unit 102 judges that the imaging sequence is practicable.

In connection with the first judgment algorithm described above, a method of improving the accuracy of a regridding processing in image reconstruction will be described. The regridding processing refers to rearrangement of k-space data arranged in a matrix (matrix data) in a k-space. In the following, the regridding processing will be described in detail.

In FIG. 5, the electric current sensitivity of the coil 26xL, which is a main coil, is denoted by α, the current sensitivity of the coil 141L is denoted by β, and the current sensitivity of the coil 142L is denoted by γ. The electric current sensitivity is a constant obtained by dividing the intensity (Tesla/meter) of the gradient magnetic field generated by electric current flowing through the coil by the value (ampere) of the current flowing through the coil. In this case, the waveform of the X axis gradient magnetic field Gx(t), which is the sum of magnetic fields including the magnetic field induced by the eddy current, can be calculated as a waveform of a sum magnetic field as expressed by the following formula.

$$Gx(t)=\alpha \times Iout(t)+\beta \times I_1(t)+\gamma \times I_2(t) \quad (30)$$

The second and third terms in the right side of the formula (30) are examples of the waveforms of the magnetic fields generated by the coils 141L and 142L (virtual magnetic field waveforms).

As described above, the output electric current Iout(t) flowing through the X axis gradient magnetic field coil 26x is determined by the conditions of the imaging sequence.

Therefore, once the initial values of the electric current $I_1(t)$ and the electric current $I_2(t)$ are determined according to the formulas (2) and (3), the electric current $I_1(t)$ flowing through the coil 141L on the secondary side and the electric current $I_2(t)$ flowing through the coil 142L can be determined according to the formula (30).

Both the initial values of the electric current $I_1(t)$ and the electric current $I_2(t)$ can be zero, if it is assumed that a sufficient time has elapsed after the end of the preceding imaging sequence, for example.

Then, the formula (30) contains no unknown quantity, and the waveform of the magnetic field Gx(t) can be calculated. As an example, the accuracy of the regridding processing in reconstruction is improved by changing the intervals of reception sampling based on the waveform of the magnetic field Gx(t) expressed by the formula (30). In the following, this example will be described in more detail.

Figure 8:
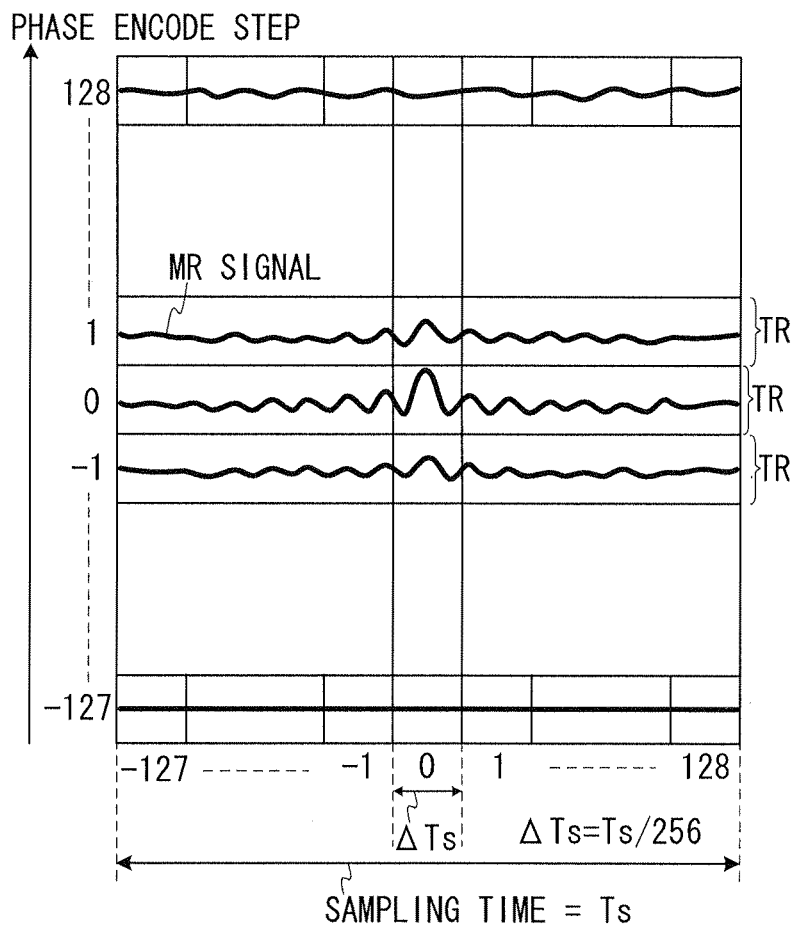
FIG. 8 is a schematic diagram showing an example of data of MR signals immediately before transformation into k-space data, in the case where the number of matrix elements in the phase encode direction is 256 and the number of matrix elements in the frequency encode direction is 256.

FIG. 8 is a schematic diagram showing an example of data of MR signals immediately before transformation into k-space data, in the case where the number of matrix elements in the phase encode direction is 256 and the number of matrix elements in the frequency encode direction is 256.

In FIG. 8, TR denotes repetition time, Ts on the horizontal axis denotes sampling time, and the vertical axis indicates phase encode step.

In this case, in principle, the 256 lines of MR signals acquired by changing the position in the phase encode direction 256 times are arranged for each encode step as shown in FIG. 8 after the cosine function or sine function of the carrier frequency is subtracted from each MR signal.

The sampling time Ts of each MR signal on the horizontal axis in FIG. 8 is equally divided by 256, and the intensity of the MR signal for each resulting time ΔTs is regarded as a matrix value of the matrix element.

Thus, 256 rows by 256 columns of matrix data are determined for each of the real part (the MR signal from which the cosine function has been subtracted) and the imaginary part (the MR signal from which the sine function has been subtracted). These two types of matrix data are regarded as k-space data.

However, for example, in a single-shot echo planar imaging (EPI), if only five lines have been acquired before the effective echo time, only 133 lines (256/2+5) are acquired. In this case, the data in the 123 lines that have failed to be acquired are zero in the k-space.

Figure 9:
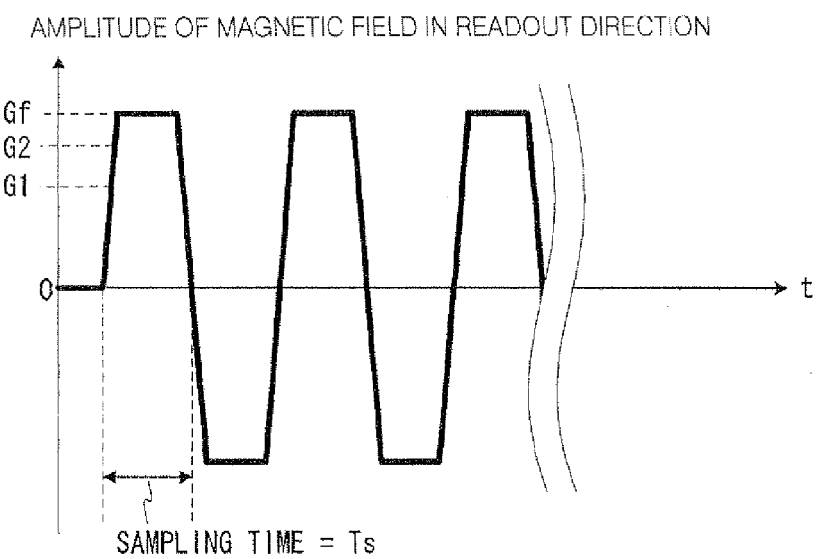
FIG. 9 is a schematic diagram showing an example of the gradient magnetic field waveform in the readout direction in EPI.

FIG. 9 is a schematic diagram showing an example of the gradient magnetic field waveform in the readout direction in EPI. In FIG. 9, the vertical axis indicates the amplitude (intensity) of the magnetic field in the readout direction, and the horizontal axis indicates elapsed time t. As shown in FIG. 9, the actual inversion of the gradient magnetic field in the readout direction is not an instantaneous inversion of the polarity of the amplitude of the magnetic field with a slop that is substantially vertical to the time axis but an abrupt change from positive to negative or negative to positive of the intensity of the gradient magnetic field in a certain length of time.

That is, in an early phase of one sampling time Ts, the intensity of the gradient magnetic field increases to G1 and then to G2 and then further increases. Then, the amplitude of the magnetic field remains constant at Gf for a certain period before it decreases.

In the early phase of the sampling time Ts, as the absolute value of the amplitude of the gradient magnetic field increases, the frequency of the MR signals gradually increases. Therefore, in the early phase of the sampling time Ts, if the sampling interval ΔTs is gradually reduced as the frequency increases, it appears as if the MR signals at a constant frequency are detected throughout the sampling time Ts.

Similarly, in an ending phase of the sampling time Ts, as the absolute value of the amplitude of the gradient magnetic field decreases, the frequency of the MR signals gradually decreases. Therefore, in the ending phase of the sampling time Ts, if the sampling interval ΔTs is gradually increased as the frequency decreases, it appears as if the MR signals at a constant frequency are detected throughout the sampling time Ts.

In other words, it is desirable that the sampling interval ΔTs is shorter in the middle phase of the sampling time Ts where the amplitude of the gradient magnetic field is constant, and the sampling interval ΔTs is longer in the early phase and the ending phase of the sampling time Ts.

The image reconstruction unit 90 changes the length of each sampling interval ΔTs for the matrix data so as to correspond to the amplitude (intensity) of the gradient magnetic field at the time of reception of the MR signal in the sampling interval ΔTs. In this way, the matrix data is rearranged (the regridding processing will be described in more detail with regard to a second embodiment described later with reference to FIGS. 22 to 24).

For example, in the case where the X axis direction of the apparatus coordinate system is made to agree with the readout direction, the waveform of the gradient magnetic field in the readout direction is calculated according to the formula (30). Then, the regridding processing is performed, in such a manner that the length of each sampling interval ΔTs corresponds to the amplitude (intensity) of the gradient magnetic field at the time of reception of the MR signal in the sampling interval ΔTs.

In particular, in the case where the MR signal in each line are received at short time intervals as in EPI, the regridding processing described above improves the accuracy of the image reconstruction, and therefore the image quality is improved. In the case where the Y axis direction or Z axis direction of the apparatus coordinate system is made to agree with the readout direction, the regridding processing can be performed in the same way as described above.

Next, the second judgment algorithm to judge whether the imaging sequence is practicable or not will be described.

In FIG. 4, the gradient magnetic field amplifier 128, 128' and 128'' each have a switching element, such as an insulated gate bipolar transistor (IGBT), a metal-oxide-semiconductor field-effect transistor (MOSFET) and a diode. Most of the power consumed by the gradient magnetic field amplifier 128 is consumed by the switching element, so that a power consumption Pampx(t) of the gradient magnetic field amplifier 128 can generally be expressed by the following approximate formula.

$$Pampx(t) = WA \times \{Iout(t)\}^2 + Wb \times Iout(t) + Wc \quad (31)$$

In the formula (31), Wa, Wb and Wc are constant determined by the characteristics of the switching element, and preliminarily measured and stored in the judging unit 102. Alternatively, theoretical values of the constants Wa, Wb and Wc may be preliminarily calculated by simulation and stored in the judging unit 102.

An input power Pinx(t) to the gradient magnetic field amplifier 128 is approximately the sum of the power consumption Pampx(t) of the gradient magnetic field amplifier 128 and the power consumption Pxcoil(t) of the X axis gradient magnetic field coil 26x. That is, the following approximate formula holds.

$$Pinx(t) = Pampx(t) + Pxcoil(t) \quad (32)$$

In the formula (32), the power consumption Pxcoil(t) of the X axis gradient magnetic field coil 26x can be calculated according to the formula (28) described above, and the power consumption Pampx(t) of the gradient magnetic field amplifier 128 can be calculated according to the formula (31). Therefore, the input power Pinx(t) to the gradient magnetic field amplifier 128 can be calculated according to the formula (32).

As to the Y channel, the power consumption Pycoil(t) of the Y axis gradient magnetic field coil 26y, the power consumption Pampy(t) of the gradient magnetic field amplifier 128', and the input power Piny(t) to the gradient magnetic field amplifier 128' are calculated in the same method.

As to the Z channel, the power consumption Pxcoil(t) of the Z axis gradient magnetic field coil 26z, the power consumption Pampz(t) of the gradient magnetic field amplifier 128'', and the input power Pinz(t) to the gradient magnetic field amplifier 128'' are calculated in the same method.

Then, the sum of the input powers Pinx(t), Piny(t) and Pinz(t) to the three channels is calculated as a total input power Pin(t).

Here, it is assumed that the power factor of the output voltage from the alternating-current power supply 120 is constant and the output power of the alternating-current power supply 120 is constant. On this assumption, a time variation of the value of the electric current flowing through the breaker 122 can be calculated by dividing the total input power Pin(t) divided by the power factor by an effective value of the output voltage of the alternating-current power supply 120.

The effective value of the output voltage of the alternating-current power supply 120 may be assumed to be a predetermined constant value and preliminarily stored in the judging unit 102, or may be measured each time it is used.

In the duration of the imaging sequence, if there is a time zone when the electric current flowing through the breaker 122 exceeds the rated current value of the breaker 122, the power required for the imaging sequence exceeds the rated power of the gradient magnetic field amplifier 128. In this case, the judging unit 102 judges that the set imaging sequence is impracticable. This is the end of the description of the second judgment algorithm.

In the case where the current flowing through the breaker 122 does not exceed the rated current value, if it is not judged according to the first and third judgment algorithms that the imaging sequence is impracticable, the imaging sequence is judged to be practicable.

Next, the third judgment algorithm to judge whether the imaging sequence is practicable or not will be described.

The third judgment algorithm takes into consideration the drop of an output voltage Vbus(t) of the direct-current power supply 124 when the imaging sequence is performed. More specifically, if the sum of the power consumption Pamp(t) of the gradient magnetic field amplifier 128 and the power consumption Pxcoil(t) of the X axis gradient magnetic field coil 26x is larger than a rated output power Pps of the direct-current power supply 124, a discharge current from the electrolyte capacitor 126 is supplied to the gradient magnetic field amplifier 128 to compensate for the shortfall in power.

The output voltage Vbus(t) of the direct-current power supply 124 is equal to the charging voltage on the electrolyte capacitor 126, and therefore, the output voltage Vbus(t) drops as the discharge current flows out of the electrolyte capacitor 126, and the charging voltage on the electrolyte capacitor 126 decreases. If the output voltage Vbus(t) is lower than a predetermined value, the judging unit 102 judges that the imaging sequence is impracticable.

To calculate a value Vfin of the output voltage Vbus(t) after the voltage drop, the third judgment algorithm will be described with reference to an example of the current waveforms and the voltage waveforms of several parts (see FIG. 10).

Taking into consideration only the primary side in FIG. 5, the output voltage Vout(t) of the circuit of the X axis gradient magnetic field power supply 44x and the X axis gradient magnetic field coil 26x shown in FIG. 4 is expressed by the following formula (33).

$$Vout(t) = R_{load} \cdot Iout(t) + L_{load} \cdot \frac{d\,Iout(t)}{dt} \quad (33)$$

Figure 10:
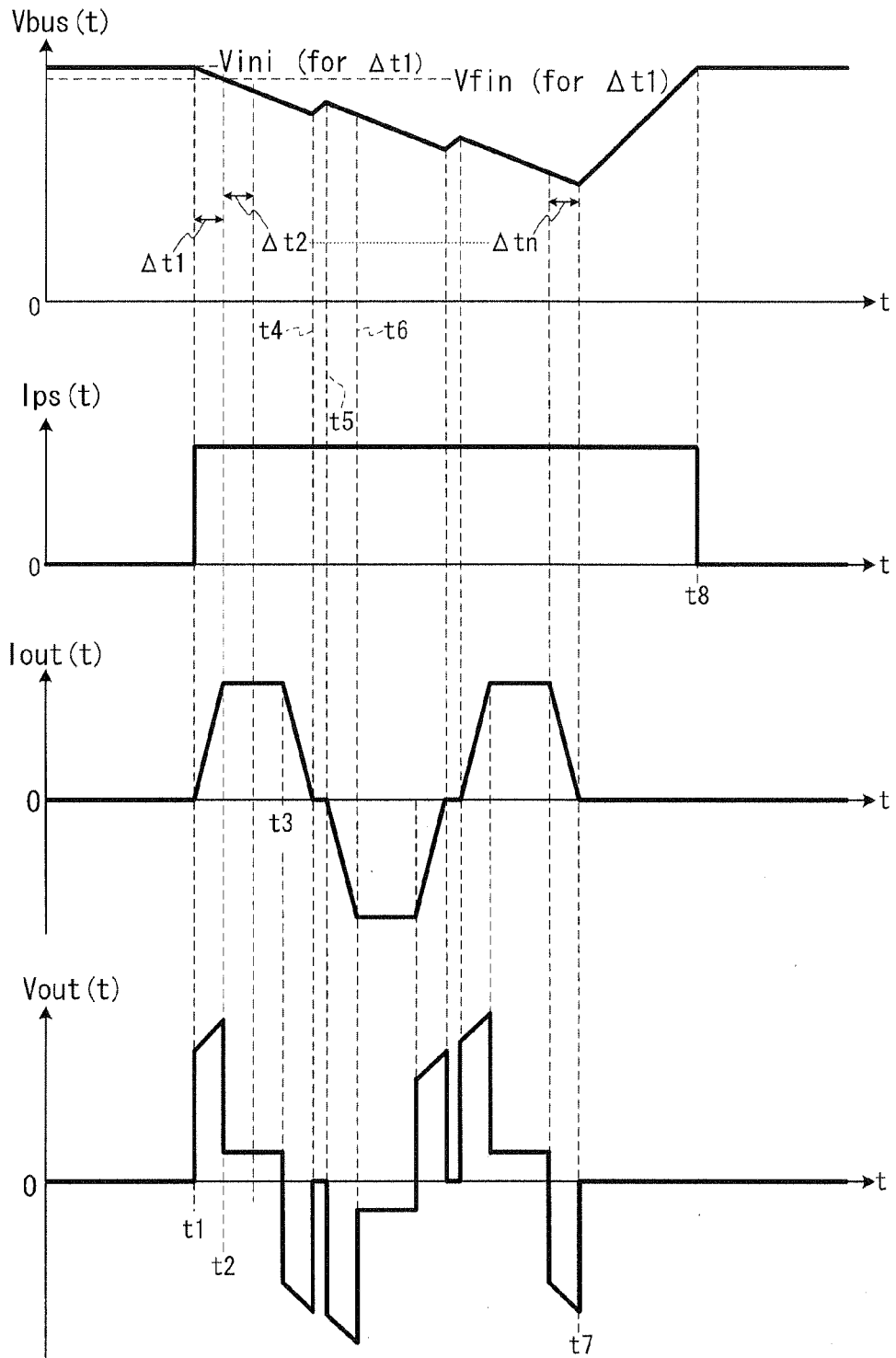
FIG. 10 is a schematic diagram showing an example of the waveform of the output voltage Vout(t) shown in FIG. 4 that is simplified on the assumption that the output voltage Vout(t) complies with the formula (33)

FIG. 10 is a schematic diagram showing an example of the waveform of the output voltage Vout(t) shown in FIG. 4 and FIG. 5 that is simplified on the assumption that the output voltage Vout(t) complies with the formula (33). A waveform of the output voltage Vout(t) accurately calculated according to the formula (27) or the like will be described later with reference to FIG. 11. In FIG. 4 and FIG. 10, the output current of the direct-current power supply 124 is denoted by Ips(t).

In the following, an operation of the circuit will be briefly described.

Referring to FIG. 4, after power activation of the gradient magnetic field power supply 44 is performed, the electrolyte capacitor 126 is immediately charged to a charging completion voltage. Thus, assuming that the start time of the imaging sequence is denoted by t1, at least in a period from the time t=0 to the time t=t1, the output voltage Vbus(t) of the direct-power supply 124 is constant, and the output current Ips(t) of the direct-current power supply 124 is constantly zero.

Then, at the time t=t1, a control voltage signal (not shown) from the sequence controller 56 starts increasing with a constant slope. As described above, the gradient magnetic field amplifier 128 outputs electric current proportional to the input voltage to the positive-side input terminal (+in) at the output terminal as the output current Iout(t). Therefore, the time waveform of the output current Iout(t) in FIG. 10 is approximately the same as the waveform of the control voltage signal.

Meanwhile, the time differential of Iout(t) in the second term of the right side of the formula (33) is zero before the time t1 but is a constant positive value in the period when the control voltage signal is increasing with a constant slope. Therefore, at the time t1, the output voltage Vout(t) of the gradient magnetic field amplifier 128 instantaneously increases by an amount expressed by the second term of the right side of the formula (33).

On the other hand, the first term (R×Iout(t)) of the right side of the formula (33) is zero at the time t1 but, after the time t1, increases as the output current Iout(t) increases, so that the output voltage Vout(t) also increases after the time t1.

At the time t1, the gradient magnetic field amplifier 128 starts supplying the output electric current Iout(t), so that, as a current supply source for this, the direct-current power supply 124 and the electrolyte capacitor 126 supply electric current to the gradient magnetic field amplifier 128. As a result, at the time t1, the output current Ips(t) also rises and then assumes a constant value.

After the time t1, the output voltage Vbus(t) of the direct-current power supply 124, that is, the charging voltage on the electrolyte capacitor 126 decreases. This occurs when the sum (Pinx(t)) of the power consumption Pamp(t) of the gradient magnetic field amplifier 128 and the power consumption Pxcoil(t) of the X axis gradient magnetic field coil 26x is larger than the rated output power Pps of the X channel of the direct-current power supply 124.

At a time t2, the output electric current Iout(t) having been increasing with a constant slope levels off at a constant value. Since the output current Iout(t) having been increasing levels off at the constant value, the time differential changes to zero, so that the second term of the right side of the formula (33) changes to zero. Consequently, the output voltage Vout(t) instantaneously decreases at the time t2 and remains at a constant value in a period from the time t2 to a time t3 in which the output current Iout(t) remains at a constant value.

At the time t3, the output electric current Iout(t) having been constant starts decreasing with a constant slope. Thus, the time differential of the output current Iout(t) in the second term of the right side of the formula (33) changes from zero to a constant negative value, so that the output electric current Iout(t) instantaneously decreases at the time t3. On the other hand, after the time t3, the first term in the right side of the formula (33) decreases as the output electric current Iout(t) decreases, so that the output voltage Vout(t) also decreases after the time t3.

At a time t4, the output electric current Iout(t) having been decreasing levels off at zero, and the output voltage Vout(t) also levels off at zero according to the formula (33). In a period in which the output current Iout(t) is constantly zero, the electrolyte capacitor 126 is charged by the output electric current Ips(t) from the direct-current power supply 124, so that the output voltage Vbus(t) of the direct-current power supply 124 increases.

At a time t5, the output electric current Iout(t) having been constantly zero starts decreasing with a constant slope, and the output voltage Vbus(t) of the direct-current power supply 124 also starts decreasing again. Consequently, the time differential of the output current Iout(t) in the second term of the right side of the formula (33) changes from zero to a constant negative value, so that the output electric current Iout(t) instantaneously decreases at the time t5. On the other hand, after the time t5, the first term of the right side of the formula (33) decreases as the output current Iout(t) decreases, so that the output voltage Vout(t) also decreases after the time t5.

At a time t6, the output electric current having been decreasing levels off at a constant negative value. Consequently, the time differential of the output electric current Iout(t) changes from a negative value to zero, so that the output current Iout(t) instantaneously increases at the time t6.

In this way, the output voltage Vout(t) varies with the output electric current Iout(t) according to the formula (33).

At a time t7, supply of the output electric current Iout(t) is stopped, and the output voltage Vbus(t) of the direct-current power supply 124 having been decreasing starts increasing. This is because, after the time t7, electric current supply to the gradient magnetic field amplifier 128 is unnecessary, so that the electrolyte capacitor 126 is charged with the output electric current Ips(t) of the direct-current power supply 124, and the charging voltage on the electrolyte capacitor 126 increases.

The output electric current Ips(t) of the direct-current power supply 124 starts decreasing when charging of the electrolyte capacitor 126 nears completion. And at a time t8, when charging of the electrolyte capacitor 126 is completed, the output electric current Ips(t) of the direct-current power supply 124 changes to 0. This is the end of the description of the circuit operation.

In the case where the sum (Pinx(t)) of the power consumption Pampx(t) of the gradient magnetic field amplifier 128 and the power consumption Pxcoil(t) of the X axis gradient magnetic field coil 26x is larger than the rated output power Pps of the direct-current power supply 124, the electrolyte capacitor 126 supplies discharge current to the gradient magnetic field amplifier 128 to compensate for the shortfall in power. In this case, the charging voltage on the electrolyte capacitor 126, that is, the output voltage Vbus(t) of the direct-current power supply 124 decreases.

As described above, the direct-current power supply 124 operates as a constant voltage source, when the load is light. And the direct-current power supply 124 operates as a constant current source, when the load is heavy.

The judging unit 102 preliminarily stores the value of the rated output power Pps of the X channel of the direct-current power supply 124 and a capacitance value Cbank of the electrolyte capacitor 126 connected to the output of the direct-current power supply 124, for the case where the load is heavy (to an extent that the discharge current from the electrolyte capacitor 126 is needed), that is, the case where the power supply for the gradient magnetic field amplifier 128 is a constant current source.

Provided that the output voltage of the direct-current power supply 124 before the voltage decrease is denoted by Vini, and the output voltage of the direct-current power supply 124 after the voltage decrease is denoted by Vfin, the slope of the voltage drop is expressed by an approximate straight line. In this case, an energy Esup supplied from the direct-current power supply 124 and the electrolyte capacitor 126 to the gradient magnetic field amplifier 128 is expressed by the following formula (34).

$$Esup(t) = \left\{ \left( \frac{Vini + Vfin}{2} \right) \cdot Ips(t) \cdot \Delta t \right\} + \left\{ \frac{Cbank \cdot (Vini^2 - Vfin^2)}{2} \right\} \quad (34)$$

The second term of the right side of the formula (34) represents a value obtained by subtracting the energy accumulated in the electrolyte capacitor 126 after the voltage drop from the energy accumulated in the electrolyte capacitor 126 before the voltage drop. That is, the second term of the right side of the formula (34) represents the decrease of the energy accumulated in the electrolyte capacitor 126, and the energy lost in the electrolyte capacitor 126 is supplied to the gradient magnetic field amplifier 128 as the discharge current.

The first term of the right side of the formula (34) represents the amount of energy supplied from the direct-current power supply 124 to the gradient magnetic field amplifier 128 in a period Lt. Here, it is assumed that in the period $\Delta t$, the output voltage Vbus(t) of the direct-current power supply 124 linearly decreases. Therefore, the average value of the output voltage Vbus(t) of the direct-current power supply 124 in the period $\Delta t$ is (Vin+Vfin)/2.

In the period in which the voltage decreases (the period at), the output electric current Ips(t) to the X channel from the direct-current power supply 124 in the formula (34) is a constant value determined by the characteristics of the direct-current power supply 124 and is preliminarily stored in the judging unit 102. This is because the direct-current power supply 124 operates as a constant current source when the load is heavy (to an extent that the discharge current from the electrolyte capacitor 126 is needed) as described above.

Thus, the energy consumed by the gradient magnetic field amplifier 128 and the X axis gradient magnetic field coil 26x is expressed by the following formula.

$$Ediss(y) = Pinx(t) \times \Delta t \quad (35)$$

Since Esup(t)=Ediss(t) according to the law of conservation of energy, the following formula (36) holds.

$$Pinx(t) \cdot \Delta t = \left\{ \left( \frac{Vini + Vfin}{2} \right) \cdot Ips(t) \cdot \Delta t \right\} + \left\{ \frac{Cbank \cdot (Vini^2 - Vfin^2)}{2} \right\} \quad (36)$$

In the formula (36), since Pinx(t) can be calculated according to the formula (32), the output voltage Vfin of the direct-current power supply 124 after the voltage drop can be calculated if the output voltage Vini of the direct-current power supply 124 before the voltage drop is determined. In the following, a way of determining the period $\Delta t$ and a way of determining the output voltage Vini of the direct-current power supply 124 before the voltage drop will be described.

As the period $\Delta t$, $\Delta t1$, $\Delta t2$, $\Delta tn$ are determined by dividing the period from the start time to the end time of the imaging sequence into n equal periods. The period from the start time to the end time of the imaging sequence may not be divided into n equal periods but alternatively may be divided into n variable periods.

If the period $\Delta t$ is determined in this way, the end time of the first period $\Delta t1$ agrees with the start time of the next period $\Delta t2$. That is, the output voltage Vfin of the direct-current power supply 124 after the voltage drop, that is, at the end of the period $\Delta t1$, is equal to the output voltage Vini of the direct-current power supply 124 before the voltage drop in the next period $\Delta t2$.

The output voltage Vini of the direct-current power supply 124 before the voltage drop at the first period $\Delta t1$ is the voltage on the electrolyte capacitor 126 at the time of completion of charging and is preliminarily stored in the judging unit 102 as a known value. Thus, the output voltage Vfin of the direct-current power supply 124 after the voltage drop in the period $\Delta t1$ can be calculated according to the formula (36).

This output voltage Vfin (in the period $\Delta t1$) is regarded as the output voltage Vini of the direct-current power supply 124 before the voltage drop in the next period $\Delta t2$. Then, the output voltage Vfin of the direct-current power supply 124 after the voltage drop in the next period $\Delta t2$ can be calculated according to the formula (36).

For the subsequent periods $\Delta t2$ to $\Delta tn$, the output voltage Vini of the direct-current power supply 124 before the voltage drop and the output voltage Vfin of the direct-current power supply 124 after the voltage drop can be calculated in the same manner.

Here, the minimum value and the maximum value of the length of each period $\Delta t1$ to $\Delta tn$ will be supplementarily described.

The length of each period $\Delta t1$ to $\Delta tn$ is desirably set to be short enough that the inverse of the length of the period ($1/\Delta t$) is sufficiently larger than the maximum operating frequency of the gradient magnetic field amplifier 128. One discharge from the electrolyte capacitor 126 occurs in a length of time equal to the inverse of the maximum operating frequency of the gradient magnetic field amplifier 128, and therefore, if the length of each period $\Delta t1$ to $\Delta tn$ is set as described above, it can be calculated with adequate accuracy. For example, the period $\Delta t$ can be set so that the inverse $1/\Delta t$ is twice, three times or five times as high as the maximum operating frequency of the gradient magnetic field amplifier 128.

From the viewpoint of the calculation load on the judging unit 102, the length of each period $\Delta t1$ to $\Delta tn$ is desirably set to be long enough that the calculation is completed in an acceptable time. This is because as the period $\Delta t1$ to $\Delta tn$ becomes shorter, the number n of the divisional periods increases, and therefore, the calculation load also increases.

As an example, it is assumed that the gradient magnetic field amplifier 128 is a pulse width modulation (PWM) amplifier. In this case, the judging unit 102 calculates a judgment target value, which will be described below, for each period $\Delta t1$ to $\Delta tn$.

The judgment target value is the output voltage Vfin of the direct-current power supply 124 after the voltage drop in each period $\Delta t1$ to $\Delta tn$ multiplied by the maximum duty ratio (the ratio of the on period in one cycle) of the switching element in the gradient magnetic field amplifier 128.

The judging unit 102 judges for each period $\Delta t1$ to $\Delta tn$ whether the following judgment condition is met or not. The judgment condition is that the judgment target value is not smaller than the voltage Vout(t) required to achieve the time variation dIout(t)/dt of the output current Iout(t).

The voltage Vout(t) required to achieve the time variation dIout(t)/dt of the output current Iout(t) described above refers to the output voltage Vout(t) determined as described above with regard to the first judgment algorithm by substituting the output electric current Iout(t) determined by the conditions of the imaging sequence into the formula (27) and solving the resulting formula.

If any of the periods $\Delta t1$ to $\Delta tn$ does not satisfy the judgment condition described above, the judging unit 102 judges that the imaging sequence is impracticable. The reason why the imaging sequence is judged to be impracticable is because an overshoot can occur in the waveform of the output current Iout(t) to degrade the image quality.

For the Y channel and the Z channel, the judging unit 102 also makes the judgment of whether the judgment condition is satisfied in each period $\Delta t1$ to $\Delta tn$ according to the formula (36) or the like in the same way as for the X channel described above.

If the judgment condition is satisfied in every period $\Delta t1$ to $\Delta tn$ for all of the X channel, the Y channel and the Z channel, the judging unit 102 judges that the imaging sequence satisfies the judgment condition of the third judgment algorithm.

When the imaging sequence satisfies the judgment condition of the third judgment algorithm, if it is not judged according to the first and second judgment algorithms that the imaging sequence is impracticable, the imaging sequence is judged to be practicable.

In the above description, as an example, the judgment is made based on the comparison with voltage Vout(t) required to achieve the time variation dIout(t)/dt of the output current Iout(t). However, embodiments of the present invention are not limited to such an implementation. For example, the judging unit 102 may judge that the imaging sequence is impracticable if the judgment target value is lower than a preset threshold.

In the above description, on the assumption that the gradient magnetic field amplifier 128 is a PWM amplifier, the target of comparison for judgment is the output voltage Vfin of the direct-current power supply 124 after the voltage drop multiplied by the maximum duty ratio of the switching element. However, this is only an example.

In a case where the gradient magnetic field amplifiers 128, 128' and 128" are not PWM amplifiers, a value of those amplifiers equivalent to the maximum duty ratio of the switching element in the PWM amplifier can be alternatively used.

In this example, for the sake of simplicity of the calculation, the calculation is performed on the assumption that the rising time Trise of the output electric current Ips(t) of the direct-current power supply 124 in the vicinity of the time t1 in FIG. 10 is zero. However, this is only an example. The actual rising time Trise until the output electric current Ips(t) reaches a constant value is not zero. The judgment target value may be calculated by accurately calculating the output electric current Ips(t) taking the rising time Trise into consideration.

Figure 11:
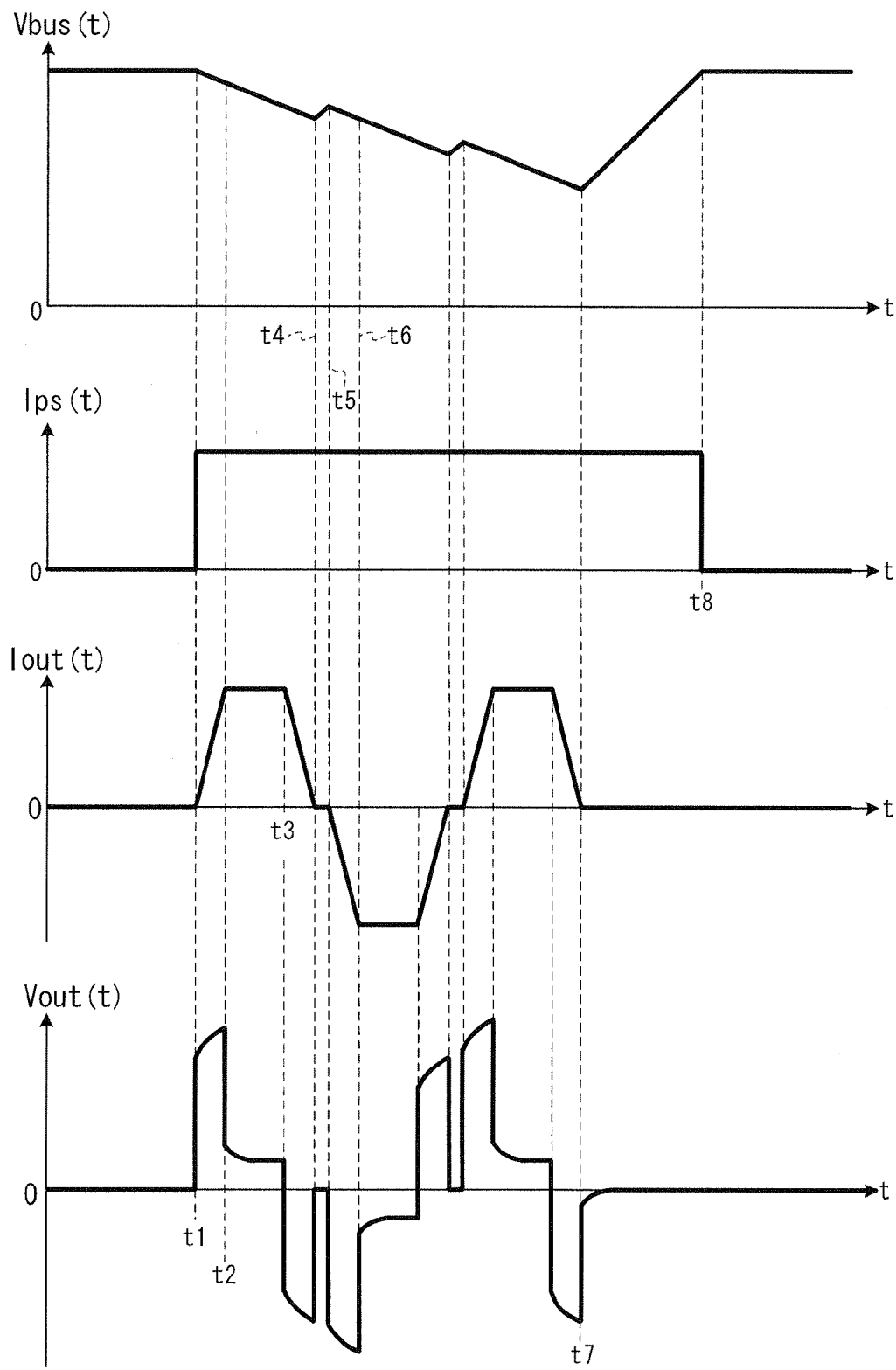
FIG. 11 is a schematic diagram showing an example of the waveform of the output voltage Vout(t) shown in FIG. 4 calculated based on the equivalent circuit model shown in FIG. 5.

FIG. 11 is a schematic diagram showing an example of the waveform of the output voltage Vout(t) shown in FIG. 4 calculated based on the equivalent circuit model 140$x$ shown in FIG. 5 according to the formulas (1) to (27).

As shown in FIG. 11, the waveform of the output electric current Iout(t) contains no curved (distorted) section and is substantially the same as the waveform of the control voltage inputted from the sequence controller 56 to the positive-side input terminal of the gradient magnetic field amplifier 128. This is because the wiring between the sequence controller 56 and the gradient magnetic field amplifier 128 does not include a significant capacitance component or a significant inductance component.

On the other hand, the waveform of the output voltage Vout(t) can be ultimately calculated according to the formula (27). The waveform of the output voltage Vout(t) is curved (distorted) unlike the waveform shown in FIG. 10 (formed by a plurality of straight lines), which is determined according to the formula (33) simplified with the series circuit including a resistor and a coil.

For example, in FIG. 10, in the period from the time t1 to the time t2, the waveform of the output voltage Vout(t) is linear because the first term (R×Iout(t)) of the right side of the formula (33) linearly increases from zero as the output current Iout(t) increases.

However, in actuality, at higher frequencies, the resistance values of the resistive component 26$x$R of the X axis gradient magnetic field coil 26$x$ vary because of the skin effect or the like.

Unlike the formula (33) simplified with the series circuit including a resistor and a coil, the formula (1) involves such variations in resistance value, the influence of the magnetic field induced by the eddy current, the influence of the choke coil and the like as the third term ($M_1 \times dI_1/dt$) and the fourth term ($M_2 \times dI_2/dt$) of the right side.

Thus, each section of the waveform of the output voltage Vout(t) shown in FIG. 11 is distorted, and the waveform of the output voltage Vout(t) is approximately the same as the actual waveform of the output voltage to the X axis gradient magnetic field coil 26$x$.

Next, a method of resetting of the conditions of the imaging sequence in the case where the imaging sequence is impracticable will be described with regard to different cases 1 to 3.

The imaging sequence means how gradient magnetic fields are applied to an imaging region under a static magnetic field, and under what conditions RF signals or the like are transmitted in what type of pulse sequence, such as of spin echo or EPI, so as to acquire(collect) MR signals from an object as a sequence.

The conditions of the imaging sequence include conditions concerning the flip angle, the repetition time TR, the number of slices, the field of view (FOV) which is the imaging region, the number of steps in the phase encode direction or the frequency encode direction, and the type of the pulse sequence such as the EPI pulse sequence and the spin echo pulse sequence.

[Case 1] First, a case where it is judged according to the first judgment algorithm that the imaging sequence is impracticable will be described.

For example, the electrical load on the gradient magnetic field power supply 44 can be reduced by at least one of increasing the repetition time TR", reducing the number of slices, expanding the FOV which is the imaging region, and reducing the number of steps in the phase encode direction and the frequency encode direction.

That is, the increase of the temperature of the gradient magnetic field coil 26 can be reduced by correcting the conditions of the imaging sequence by any of the measures described above, and as a result, it is not judged according to the first judgment algorithm that the imaging sequence is impracticable. The same holds true for the second and third judgment algorithms. That is, the conditions of the imaging sequence can be corrected by any of the measures described above, so that it is not judged that the imaging sequence is impracticable.

According to the first judgment algorithm, if the estimated temperature of the X axis gradient magnetic field coil 26$x$ immediately after the imaging sequence is performed is higher than a threshold by 5° C., for example, the condition setting unit 100 performs an inverse operation according to the formula (29) as described below, for example. That is, the condition setting unit 100 calculates the time integral of the power consumption Pxcoil(t) over the period from the start time to the end time of the imaging sequence, in such a manner that the estimated temperature of the X axis gradient magnetic field coil 26$x$ after the performance of the imaging sequence is equal to the threshold.

Then, the condition setting unit 100 performs an inverse operation according to the formula (28) or the like to determine to what extent the amplitudes of the output electric current Iout(t) and the output voltage Vout(t) should be reduced if the time integral of the power consumption Pxcoil(t) is to be equal to the calculated value described above.

Based on the result of the inverse operation, correction candidates for the conditions of the imaging sequence are calculated, in such a manner that the estimated temperature of the X axis gradient magnetic field coil 26$x$ immediately after the performance of the imaging sequence is equal to the threshold. Thus, the condition setting unit 100 can set the conditions of the imaging sequence close to the electrical serviceability limit of the gradient magnetic field generation system.

More specifically, the condition setting unit 100 calculates to what extent the repetition time TR should be increased, what percentage of the number of slices should be reduced, to what extent the FOV should be expanded, or to what extent the number of steps in the phase encode direction and the frequency encode direction should be reduced. The same holds true for a case where the temperature of the Y axis gradient magnetic field coil 26y or the Z axis gradient magnetic field coil 26z after the performance of the imaging sequence exceeds a threshold.

In the two-dimensional Fourier transformation in image reconstruction, the number of steps in the phase encode direction and the frequency encode direction is desirably $2^n$, where n represents a natural number. Therefore, the number of steps in the phase encode direction and the frequency encode direction is desirably corrected to be a half, a fourth or an eighth based on the result of the above-described calculation of the extent to which the number of steps should be reduced.

Although the correction candidates for the conditions of the imaging sequence have been described as being calculated in such a manner that the estimated temperature of the X axis gradient magnetic field coil 26x immediately after the performance of the imaging sequence is equal to the threshold, this is only an example.

Alternatively, the condition setting unit 100 may calculate correction candidates for the conditions of the imaging sequence that have an allowance for the electrical load on the gradient magnetic field power supply 44 so that the estimated temperature of the X axis gradient magnetic field coil 26x immediately after the performance of the imaging sequence is lower than the threshold by 1° C. or 3° C.

Now, consider a case where the temperatures of the X axis gradient magnetic field coil 26x, the Y axis gradient magnetic field coil 26y and the Z axis gradient magnetic field coil 26z transmitted from the temperature sensors 70x1 to 70x3, 70y1 to 70y3 and 70z1 to 70z3 are sufficiently higher than a predetermined value (room temperature, for example). In this case, the condition setting unit 100 can calculate a required cooling time for display, instead of issuing an instruction to display the correction candidates for the conditions of the imaging sequence.

More specifically, for example, consider a case where the temperature of the Z axis gradient magnetic field coil 26z transmitted from the temperature sensors is higher than the predetermined value by 10° C., and it is judged according to the first judgment algorithm that the calculated temperature of the Z axis gradient magnetic field coil 26z after the imaging sequence is performed is higher than the threshold by 5° C.

In this case, if the imaging sequence is performed after a wait for the temperature of the Z axis gradient magnetic field coil 26z to decrease by 5° C. or more, it is not judged according to the first algorithm that the imaging sequence is impracticable.

[Case 2] Next, a case where it is judged according to the second judgment algorithm that the imaging sequence is impracticable will be described. The condition setting unit 100 calculates to what extent the value of the electric current flowing through the breaker 122 exceeds the rated current of the breaker 122 in a time zone when the current value is at the maximum in the imaging sequence.

Based on the calculation result, the condition setting unit 100 calculates to what extent the total input power Pin(t) should be reduced in the time zone when the value of the electric current flowing through the breaker 122 is at the maximum, so that the value of the electric current flowing through the breaker 122 in this time zone is to be equal to the rated current.

Based on the calculation result, the condition setting unit 100 performs an inverse operation according to the formulas (32), (31), (28), (27) and the like to determine to what extent the amplitudes of the output electric current Iout(t) and the output voltage Vout(t) should be reduced.

Based on the result of the inverse operation, the condition setting unit 100 calculates correction candidates for the conditions of the imaging sequence, in such a manner that the value of the electric current flowing through the breaker 122 is equal to the rated current of the breaker 122 in the time zone when the current value is at the maximum.

Although the correction candidates for the conditions of the imaging sequence have been described as being calculated so that the value of the electric current flowing through the breaker 122 is equal to the rated current of the breaker 122 in the time zone when the current value is at the maximum, this is only an example. Alternatively, the condition setting unit 100 may calculate the correction candidates for the conditions of the imaging sequence, in such a manner that the value of the electric current flowing through the breaker 122 is 95% or 90% of the rated current of the breaker 122 in the time zone when the current value is at the maximum.

[Case 3] Next, a case where it is judged according to the third judgment algorithm that the imaging sequence is impracticable will be described.

First, consider a case where the judgment condition is not satisfied for the X channel. Based on the result of the calculation by the judging unit 102, the condition setting unit 100 judges the period (Δt) in which the judgment target value is lower than the output voltage Vout(t) by the maximum amount of shortfall, and calculates the amount of shortfall.

Based on the calculation result and the maximum duty ratio of the switching element in the gradient magnetic field amplifier 128, the condition setting unit 100 performs an inverse operation to determine to what extent the amplitudes of the output electric current Iout(t) and the output voltage Vout(t) should be reduced according to the formulas (36), (34), (28), (27) and the like.

Based on the result of the inverse operation, the condition setting unit 100 calculates the correction candidates for the conditions of the imaging sequence, in such a manner that the judgment target value is not lower than the output voltage Vout(t) to the X axis gradient magnetic field coil 26x.

The condition setting unit 100 also calculates the correction candidates for the conditions of the imaging sequence, for cases where the judgment condition is not satisfied for the Y channel and the Z channel in the same manner as described above.

The condition setting unit 100 calculates the correction candidates for the conditions of the imaging sequence as described above and inputs the calculated correction candidates to the display control unit 98 to display the calculated correction candidates on a display device 64 (monitor).

Figure 12:
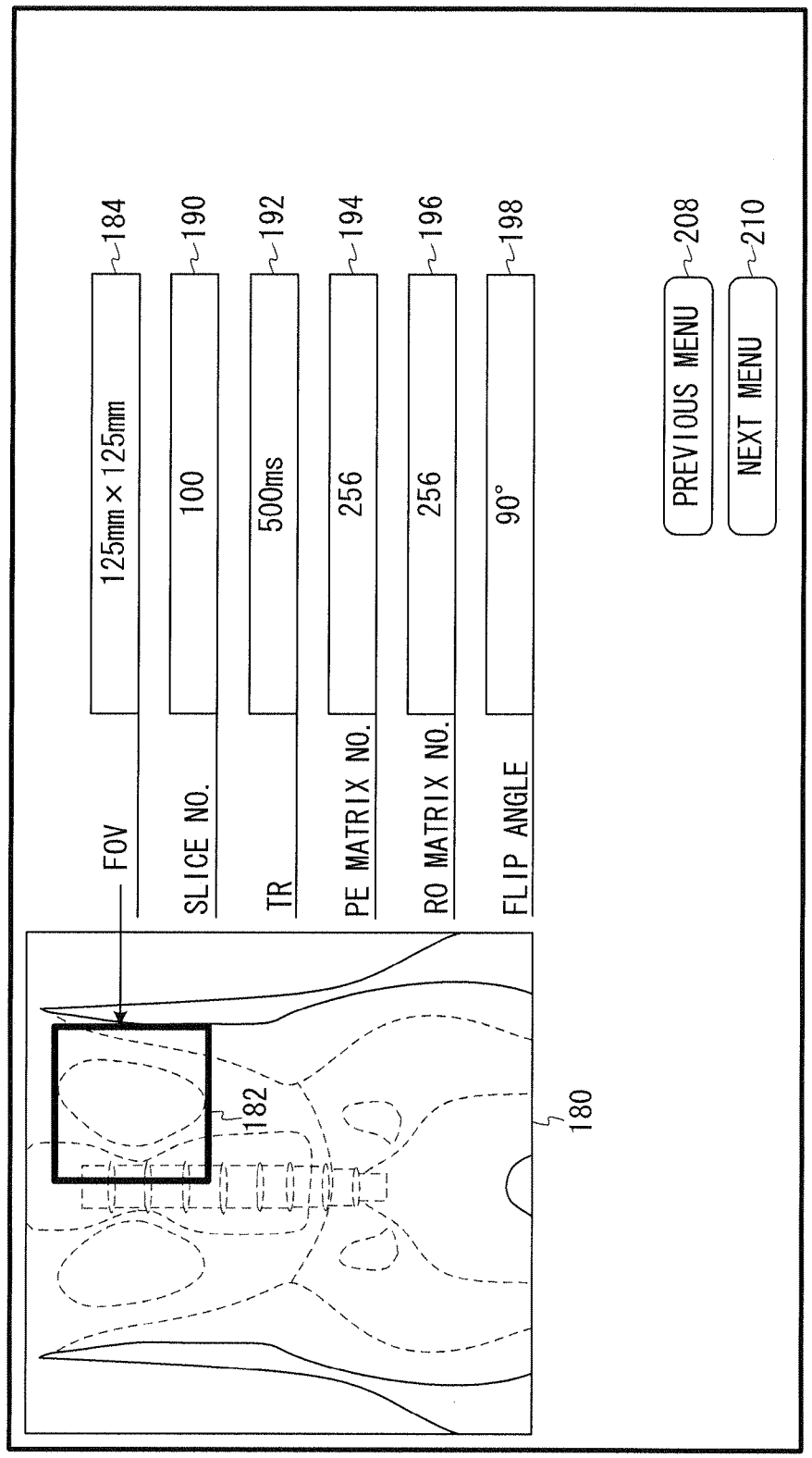
FIG. 12 is a schematic diagram showing an example of a display screen for setting the conditions of an imaging sequence before the first to third judgment algorithms are performed.

FIG. 12 is a schematic diagram showing an example of a display screen for setting the conditions of the imaging sequence before the first to third judgment algorithms are performed. As shown in FIG. 12, a thick frame 182 that indicates the FOV of the main scan currently set is superimposed on a scout image 180.

In FIG. 12, a box 184 displays the size (length by width) of the FOV (in millimeters). A box 190 displays the number of slices of the main scan. A box 192 displays the length of the repetition time of the main scan. A box 194 displays the number of steps in the phase encode direction of the main scan. A box 196 displays the number of steps in the frequency encode direction of the main scan. A box 198 displays the flip angle of the main scan.

A button 208 can be clicked to display the previous one of a plurality of setting screens for the conditions of the imaging sequence. A button 210 can be clicked to display the next one of the plurality of setting screens for the conditions of the imaging sequence.

Figure 13:
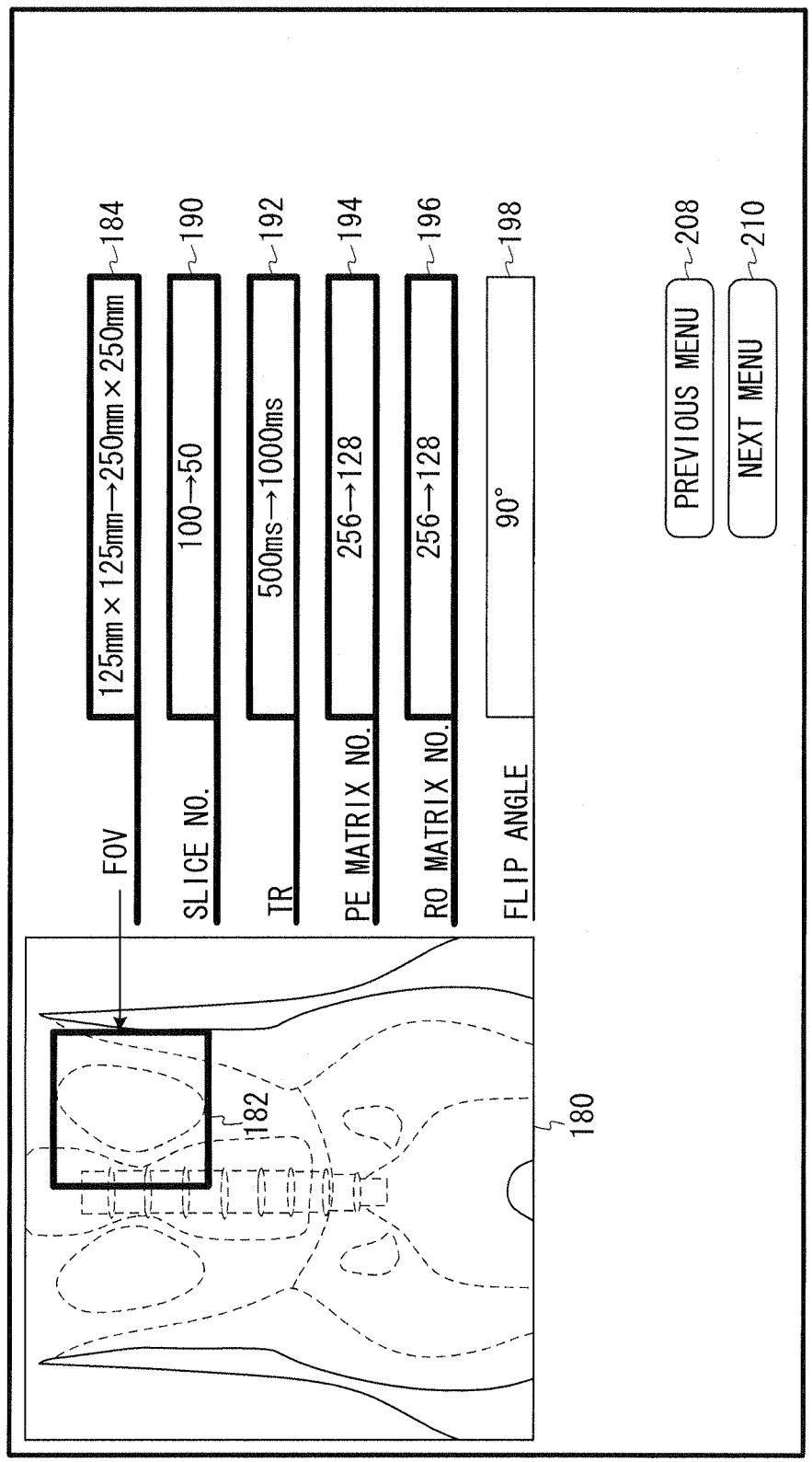
FIG. 13 is a schematic diagram showing an example of a display screen for setting the conditions of the imaging sequence, in a case where it is judged according to at least one of the first to third judgment algorithms that the imaging sequence is impracticable.

FIG. 13 is a schematic diagram showing an example of a display screen for setting the conditions of the imaging sequence, in a case where it is judged according to at least one of the first to third judgment algorithms that the imaging sequence is impracticable.

If the judging unit 102 judges that the imaging sequence is impracticable, the condition setting unit 100 changes the display aspect of the condition(s) to be changed out of the conditions of the imaging sequence, in such a manner that the condition(s) to be changed can be distinguished from the other conditions. Specifically, for example, the condition setting unit 100 changes the boxes 184, 190, 192, 194 and 196 of the conditions to be changed to a different color, such as red.

Alternatively, the condition setting unit 100 may make the numerals displayed in the boxes of the conditions to be changed blink.

Alternatively, the condition setting unit 100 may show the boxes with thick lines as shown in FIG. 13.

In the example of FIG. 13, it is displayed in the box 184 as one of the correction candidates of conditions of the imaging sequence to expand FOV from 125 mm×125 mm to 250 mm×250 mm.

Additionally, it is displayed in the box 190 as one of the correction candidates of conditions of the imaging sequence to decrease the slice number from 100 to 50.

Additionally, it is displayed in the box 192 as one of the correction candidates of conditions of the imaging sequence to lengthen the repetition time TR from 500 ms to 1000 ms.

Additionally, it is displayed in the box 194 and 196 as one of the correction candidates of conditions of the imaging sequence to decrease the phase encode step number and the frequency encode step number from 256 to 128 respectively.

A user can alter (reconfigure) the conditions of the imaging sequence by selecting one or a plurality of the correction candidates of the imaging sequence displayed on the display device 64 via the input device 62 so as to make the imaging sequence practicable.

Figure 14:
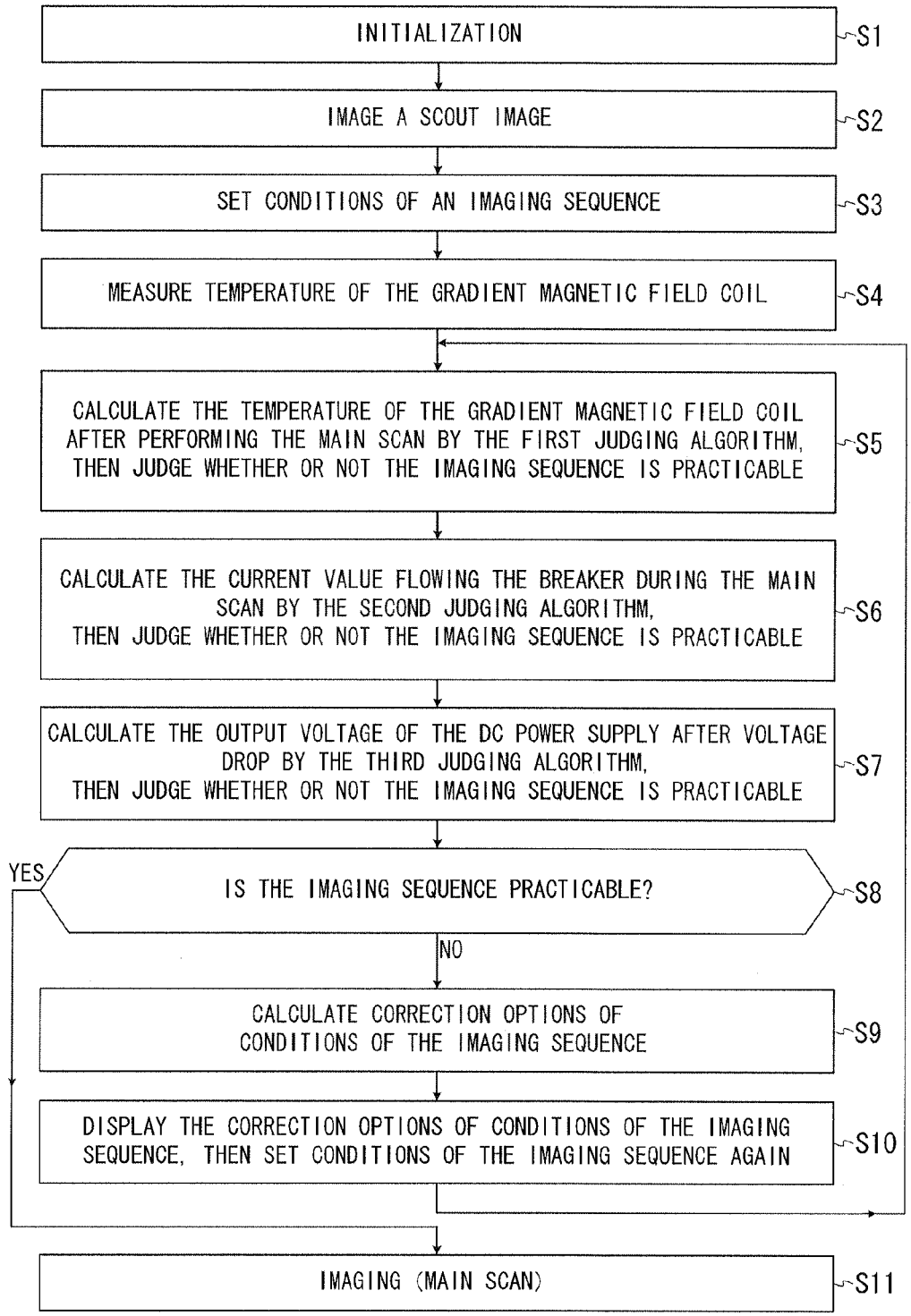
FIG. 14 is a flowchart illustrating a flow of a process performed by the MRI apparatus of the first embodiment.

FIG. 14 is a flowchart illustrating a flow of a process performed by the MRI apparatus 20A of the present embodiment. In the following, according to the step numbers in the flowchart shown in FIG. 14, an operation of the MRI apparatus 20A will be described by referring to the aforementioned FIGS. 1 to 13 as required.

[Step S1] Based on the conditions of the imaging sequence (the type of the pulse sequence, the flip angle or the FOV described above, for example) inputted to the MRI apparatus 20A via the input device 62, the MPU 86 (see FIG. 3) performs initial setting of the MRI apparatus 20A. Besides, the central frequency of the RF pulses or the like is set by prescan. Then, the process proceeds to Step S2.

[Step S2] Scout images are taken. More specifically, the object QQ is set on the bed 32 in advance and a static magnetic field is formed in the imaging space by the static magnetic field magnet 22 excited by the static magnetic field power supply 40. In addition, electric current is supplied from the shim coil power supply 42 to the shim coil 24, thereby the static magnetic field formed in the imaging space is uniformed.

After this, when the MPU 86 receives a command of start of imaging from the input device 62, the MPU 86 inputs imaging conditions including an imaging sequence into the sequence controller 56. Then, the sequence controller 56 drives the gradient magnetic field power supply 44, the RF transmitter 46 and the RF receiver 48 according to the inputted imaging sequence, thereby gradient magnetic fields are formed in the imaging region, and RF signals are generated from the RF coil 28.

Then, MR signals generated by nuclear magnetic resonance inside the object QQ are received by the RF coil 28 and detected by the RF receiver 48. The RF receiver 48 performs predetermined signal processing on the detected MR signals and then performs A/D conversion on the MR signals to generate raw data, which are digital data of the MR signals. The RF receiver 48 inputs the generated raw data to the sequence controller 56.

The sequence controller 56 inputs the raw data to the image reconstruction unit 90.

In the k-space (frequency space) formed in the k-space database 92, the image reconstruction unit converts the raw data into matrix data (k-space data), and stores these data.

The image reconstruction unit 90 obtains the k-space data from the k-space database 92 and reconstructs image data by performing image reconstruction processing including Fourier transformation on the obtained k-space data. The image reconstruction unit 90 stores the reconstructed image data in the image database 94.

The image processing unit 96 obtains the image data from the image database 94 and generates image data for 2-dimensional display by performing predetermined image processing on the obtained image data. The image processing unit 96 stores the image data for 2-dimensional display in the storage device 66. After this, the process proceeds to Step S3.

[Step S3] The MPU 86 makes the storage device 66 transfer the image data for display of the scout images to the display control unit 98, and makes the display device 64 display the scout images.

Then, based on the conditions of the imaging sequence (see the above description for specific examples) inputted to the MRI apparatus 20A via the input device 62, the condition setting unit 100 sets the conditions of the imaging sequence of the main scan.

The imaging sequence of the main scan set in this step is an MRI sequence that involves a pulse sequence of applying the gradient magnetic fields Gx, Gy and Gz in the apparatus coordinate system under application of the static magnetic field. The gradient magnetic field Gx is determined by the output electric current Iout(t) flowing through the X axis gradient magnetic field coil 26x (see FIG. 11, for example). Similarly, the gradient magnetic fields Gy and Gz are determined by the electric current flowing through the Y axis and Z axis gradient magnetic field coils 26y and 26z, respectively.

That is, in the main scan in Step S11 described later, gradient magnetic fields along logical axes, that is, the gradient magnetic field Gss in the slice selection direction, the gradient magnetic field Gpe in the phase encode direction and the gradient magnetic field Gro in the readout direction (see FIG. 9, for example) are formed in the imaging region by synthesis of the gradient magnetic fields Gx, Gy and Gz described above. Then, the process proceeds to Step S4.

[Step S4] The temperature sensors 70x1 to 70x3 (see FIG. 2) detect the temperature of the X axis gradient magnetic field coil 26x and input the respective detected temperatures to the judging unit 102 via the sequence controller 56. Similarly, the temperature sensors 70y1 to 70y3 detect the temperature of the Y axis gradient magnetic field coil 26y and input the respective detected temperatures to the judging unit 102. Similarly, the temperature sensors 70z1 to 70z3 detect the temperature of the Z axis gradient magnetic field coil 26z and input the respective detected temperatures to the judging unit 102.

Here, as an example, the judging unit 102 stores the maximum temperature of the temperatures detected by the temperature sensors 70x1 to 70x3 as a pre-sequence temperature (temperature anterior to the imaging sequence) TBx of the X axis gradient magnetic field coil 26x.

In addition, the judging unit 102 stores the maximum temperature of the temperatures detected by the temperature sensors 70y1 to 70y3 as a pre-sequence temperature TBy of the Y axis gradient magnetic field coil 26y.

In addition, the judging unit 102 stores the maximum temperature of the temperatures detected by the temperature sensors 70z1 to 70z3 as a pre-sequence temperature TBz of the Z axis gradient magnetic field coil 26z.

In this way, the judging unit 102 in the control device 30 acquires the pre-sequence temperatures TBx, TBy and TBz (from the temperature sensors of the MRI apparatus 20A). Then, the process proceeds to Step S5.

[Step S5] Based on the conditions of the imaging sequence of the main scan set in Step S3, the judging unit 102 performs the first judgment algorithm.

Specifically, based on the equivalent circuit model 140x and the pre-sequence temperatures TBx, TBy and TBz, the judging unit 102 calculates, as post-sequence temperatures, estimated temperatures TAx, TAy and TAz of the X axis gradient magnetic field coil 26x, the Y axis gradient magnetic field coil 26y and the Z axis gradient magnetic field coil 26z that would be detected immediately after performance of the main scan if the main scan is performed.

If any of the calculated estimated temperatures TAx, TAy and TAz exceeds a threshold, the judging unit 102 judges that the imaging sequence currently set is impracticable. The first judgment algorithm has already been described in detail. Then, the process proceeds to Step S6.

[Step S6] Based on the conditions of the imaging sequence of the main scan set in Step S3, the judging unit 102 performs the second judgment algorithm.

Specifically, based on the equivalent circuit model 140x and the power consumptions of the gradient magnetic field amplifiers 128, 128' and 128'' and the X axis gradient magnetic field coil 26x, the Y axis gradient magnetic field coil 26y and the Z axis gradient magnetic field coil 26z, the judging unit 102 calculates the electric current flowing through the breaker 122.

If there is a time zone when the electric current flowing through the breaker 122 exceeds the rated current of the breaker 122, the judging unit 102 judges that the imaging sequence currently set is impracticable. The second judgment algorithm has already been described in detail. Then, the process proceeds to Step S7.

[Step S7] Based on the conditions of the imaging sequence of the main scan set in Step S3, the judging unit 102 performs the third judgment algorithm.

Specifically, based on the equivalent circuit model 140x, the judging unit 102 calculates the output voltage Vfin after the voltage drop of the direct-current power supply 124 in the case where the imaging sequence is performed for each of the X channel, the Y channel and the Z channel.

The judging unit 102 judges whether or not there is a time zone Δt when the output voltage Vfin after the voltage drop is lower than the output voltage Vout(t) that has to be applied to the gradient magnetic field coil 26.

If it is judged for any of the X, Y and Z channels that there is a time zone when the output voltage Vfin is lower than the output voltage Vout(t), the judging unit 102 judges that the imaging sequence currently set is impracticable. The third judgment algorithm has already been described in detail.

Although the first, second and third judgment algorithms have been described as being performed in this order in Steps S5 to S7 for the sake of convenience, this is only an example. Steps S5 to S7 can be performed in any order. Alternatively, for example, the judging unit 102 may have an arithmetic processing mechanism including three judging sub-units, that is, a first judging unit, a second judging unit and a third judging unit, and the first to third judging sub-units may perform the first to third judgment algorithms, respectively, in parallel.

After this, the process proceeds to Step S8.

[Step S8] The judging unit 102 judges that the imaging sequence is practicable only in the case where it is not judged according to any of the first, second and third judgment algorithms that the imaging sequence is impracticable, and otherwise judges that the imaging sequence is impracticable.

If it is judged that the imaging sequence is practicable, the process proceeds to Step S11.

If it is judged that the imaging sequence is impracticable, the process proceeds to Step S9.

[Step S9] Based on the result of the calculation by the judging unit 102, the condition setting unit 100 calculates correction candidates for the conditions of the imaging sequence in different ways in different seven cases as described below, for example.

Firstly, in the case where only the first judgment algorithm shows the result that the imaging sequence is impracticable, the condition setting unit 100 calculates correction candidates for the conditions of the imaging sequence, in such a manner that it is not judged according to the first judgment algorithm that the imaging sequence is impracticable (see Case 1).

Secondly, in the case where only the second judgment algorithm shows the result that the imaging sequence is impracticable, the condition setting unit 100 calculates correction candidates for the conditions of the imaging sequence, in such a manner that it is not judged according to the second judgment algorithm that the imaging sequence is impracticable (see Case 2).

Thirdly, in the case where only the third judgment algorithm shows the result that the imaging sequence is impracticable, the condition setting unit 100 calculates correction candidates for the conditions of the imaging sequence, in such a manner that it is not judged according to the third judgment algorithm that the imaging sequence is impracticable (see Case 3).

Fourthly, in the case where the first and second judgment algorithms show the result that the imaging sequence is impracticable, the condition setting unit 100 calculates correction candidates for the conditions of the imaging sequence, in such a manner that it is not judged according to the first judgment algorithm that the imaging sequence is impracticable. Then, based on the conditions of the imaging sequence corrected by, for example, one of the correction candidates, the condition setting unit 100 judges according to the second judgment algorithm whether the imaging sequence is practicable or not. Only in the case where the judgment result shows impracticable, the condition setting unit 100 calculates correction candidates for the corrected conditions of the imaging sequence again, in such a manner that it is not judged according to the second judgment algorithm that the imaging sequence is impracticable (In the next step S10, the correction candidates calculated again are displayed).

Fifthly, in the case where the first and third judgment algorithms show the result that the imaging sequence is impracticable, the condition setting unit 100 similarly calculates correction candidates for the conditions of the imaging sequence, in such a manner that it is not judged according to the first judgment algorithm that the imaging sequence is impracticable. Then, based on the conditions of the imaging sequence corrected by, for example, one of the correction candidates, the condition setting unit 100 judges according to the third judgment algorithm whether the imaging sequence is practicable or not. Only in the case where the judgment result shows impracticable, the condition setting unit 100 calculates correction candidates for the corrected conditions of the imaging sequence again, in such a manner that it is not judged according to the third judgment algorithm that the imaging sequence is impracticable.

Sixthly, in the case where the second and third judgment algorithms show the result that the imaging sequence is impracticable, the condition setting unit 100 calculates correction candidates for the conditions of the imaging sequence, in such a manner that it is not judged according to the second judgment algorithm that the imaging sequence is impracticable. Then, based on the conditions of the imaging sequence corrected by, for example, one of the correction candidates, the condition setting unit 100 judges according to the third judgment algorithm whether the imaging sequence is practicable or not. Only in the case where the judgment result shows impracticable, the condition setting unit 100 calculates correction candidates for the corrected conditions of the imaging sequence again, in such a manner that it is not judged according to the third judgment algorithm that the imaging sequence is impracticable.

Seventhly, in the case where all of the first to third judgment algorithms show the result that the imaging sequence is impracticable, the condition setting unit 100 calculates correction candidates for the conditions of the imaging sequence in such a manner that it is not judged according to the first judgment algorithm that the imaging sequence is impracticable.

Then, based on the conditions of the imaging sequence corrected by, for example, one of the correction candidates, the condition setting unit 100 judges according to the second judgment algorithm whether the imaging sequence is practicable or not. If it is judged that the imaging sequence is practicable, the condition setting unit 100 proceeds to perform the judgment processing according to the third judgment algorithm of whether the imaging sequence is practicable or not. If it is judged that the imaging sequence is impracticable, the condition setting unit 100 calculates correction candidates for the corrected conditions of the imaging sequence in such a manner that it is not judged according to the second judgment algorithm that the imaging sequence is impracticable.

After the correction candidates for the conditions of the imaging sequence are calculated in such a manner that it is not judged according to the first and second judgment algorithms that the imaging sequence is impracticable as described above, the condition setting unit 100 performs the third judgment algorithm based on the conditions of the imaging sequence corrected by, for example, one of the latest correction candidates. If it is judged according to the third judgment algorithm that the imaging sequence is practicable, the process directly proceeds to Step S10. On the other hand, if it is judged that the imaging sequence is impracticable, the condition setting unit 100 calculates correction candidates for the corrected conditions of the imaging sequence in such a manner that it is not judged according to the third judgment algorithm that the imaging sequence is impracticable.

As described above, the condition setting unit 100 calculates the correction candidates for the conditions of the imaging sequence in different seven cases, in such a manner that it is not judged according to any of the first to third judgment algorithms that the imaging sequence is impracticable.

After this, the process proceeds to Step S10.

[Step S10] The condition setting unit 100 inputs the correction candidates for the conditions of the imaging sequence finally calculated in Step S9 to the display control unit 98 so as to display the correction candidates on the display device 63 in a distinguished manner (see FIG. 13).

Then, the conditions of the imaging sequence are set again by a user. The input device 62 and the way of display on the display device 64 are configured in such a manner that the user can select any of the correction candidates for the conditions of the imaging sequence or input arbitrary (any) condition for the imaging sequence.

After this, the process returns to Step S5.

[Step S11] Data acquisition is performed according to the set conditions of the imaging sequence of the main scan in the same manner as in taking the scout images, and the sequence controller inputs raw data of MR signals to the image reconstruction unit 90.

Then, the image reconstruction unit 90 converts the raw data into matrix data (k-space data) in the k-space formed in the k-space database 92, and retains the matrix data. Only in the case where the imaging sequence is an EPI sequence, the regridding processing described above with reference to FIG. 8 and FIG. 9 is performed after the k-space data is generated.

Then, the image reconstruction unit 90 fetches the k-space data from the k-space database 92 and then generates image data for display and stores the image data for display in the storage device 66, as in the case of the scout images. Then, the MPU 86 makes the storage device 66 transfer the image data for display to the display control unit 98 and makes the display device 64 display the images taken by the main scan.

This is the end of the description of an operation of the MRI apparatus 20A according to this embodiment.

As described above, according to the first embodiment, the equivalent circuit model 140x which includes the secondary-side circuit causing mutual induction with the primary side is used so as to take the influences of the skin effect and the eddy current into consideration. In calculation of the output voltage Vout(t) to the gradient magnetic field coil 26, the formula (27) derived with the equivalent circuit model 140x is used, and the values of the constants such as Rload in the formula (27) are preliminarily determined and stored in the judging unit 102. Therefore, based on the output electric current Iout(t) that provides the gradient magnetic field waveform defined for the imaging sequence, the formula (27) and the like, the output voltage Vout(t) required to achieve the output electric current Iout(t) can be accurately calculated.

Based on the output voltage Vout(t) accurately calculated as described above, the first to third judgment algorithms are performed to judge whether the imaging sequence is practicable or not from three points of view.

More specifically, the judgment is made from the following three points of view: (1) whether the temperature of the gradient magnetic field coil 26 immediately after the performance of the imaging sequence exceeds the threshold or not, (2) whether the electric current flowing through the breaker 122 exceeds the rated current of the breaker 122 or not, and (3) whether the voltage Vfin after the voltage drop of the direct-current power supply 124 is lower than the output voltage Vout(t) or not. Thus, whether the imaging sequence is practicable or not can be accurately judged (Steps S5 to S8).

Based on the result of the judgment described above, the correction candidates for the conditions of the imaging sequence are calculated, in such a manner that it is not judged according to the first to third judgment algorithms that the imaging sequence is impracticable. And these correction candidates are displayed (Steps S9 and S10). Thus, the user can make the imaging sequence practicable simply by selecting from among the correction candidates for the conditions of the imaging sequence. That is, a highly convenient console for setting an imaging sequence is provided.

Since the output voltage Vout(t) required to achieve the output electric current Iout(t) to the gradient magnetic field coil 26 can be accurately calculated, conditions of the imaging sequence close to the electrical serviceability limit of the gradient magnetic field generation system can be set.

Specifically, for example, if it is judged according to the first judgment algorithm that the imaging sequence is impracticable, correction candidates for the conditions of the imaging sequence are calculated in such a manner that the estimated temperature of the gradient magnetic field coil 26 immediately after the performance of the imaging sequence is equal to the threshold.

As a result, conditions of the imaging sequence under which a load close to the electrical serviceability limit of the gradient magnetic field generation system is applied can be set. The same holds true for cases where it is judged according to the second or third judgment algorithm that the imaging sequence is impracticable (see Case 2 and Case 3 described above, for example).

Furthermore, in the case where the imaging sequence is an EPI sequence, the length of each sampling interval ΔTs is changed in such a manner that the length of the sampling interval ΔTs corresponds to the intensity of the gradient magnetic field at the time of reception of the MR signal in the sampling interval ΔTs, and the regridding processing is performed. In the case where MR signals in each line are received at short time intervals, such as the case of EPI, the regridding processing described above can improve the accuracy of the image reconstruction and therefore the image quality.

According to the first embodiment described so far, whether the imaging sequence is practicable or not can be accurately judged from the viewpoint of the electrical load on the gradient magnetic field generation system for MRI.

The following are supplementary notes on the first embodiment.

The measured value of the impedance of the gradient magnetic field coil 26 may not only be the measured value of the gradient magnetic field coil 26 alone but also be the measured value of the gradient magnetic field coil 26 including another component, such as a line filter and an output cable. In this case, the first to third judgment algorithms can be performed based on a circuit model different from the equivalent circuit model 140x shown in FIG. 5.

Figure 15:
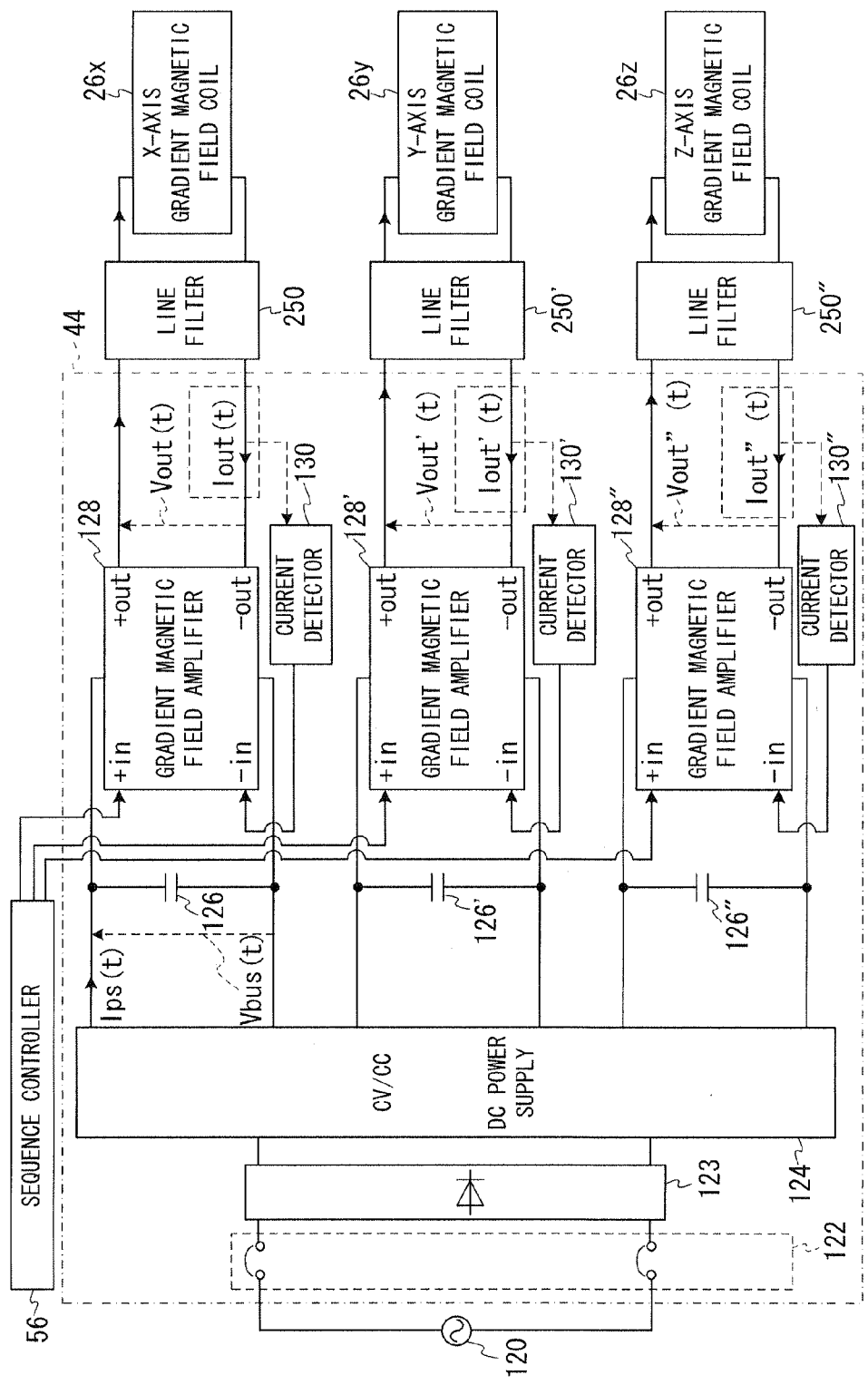
FIG. 15 is a block diagram showing the gradient magnetic field power supply and the gradient magnetic field coils, in the case where line filters are taken into consideration.

FIG. 15 is a block diagram showing the gradient magnetic field power supply 44 and the gradient magnetic field coil 26 in the case where line filters are taken into consideration.

Specifically, line filters 250, 250' and 250" for removing noise are inserted between each of the X axis gradient magnetic field coil 26x, the Y axis gradient magnetic field coils 26y and the Z axis gradient magnetic field coil 26z and each of the gradient magnetic field amplifier 128, the gradient magnetic field amplifier 128' and the gradient magnetic field amplifier 128", respectively. In the other respects, the circuit configuration shown in FIG. 15 is the same as the circuit configuration shown in FIG. 4.

Figure 16:
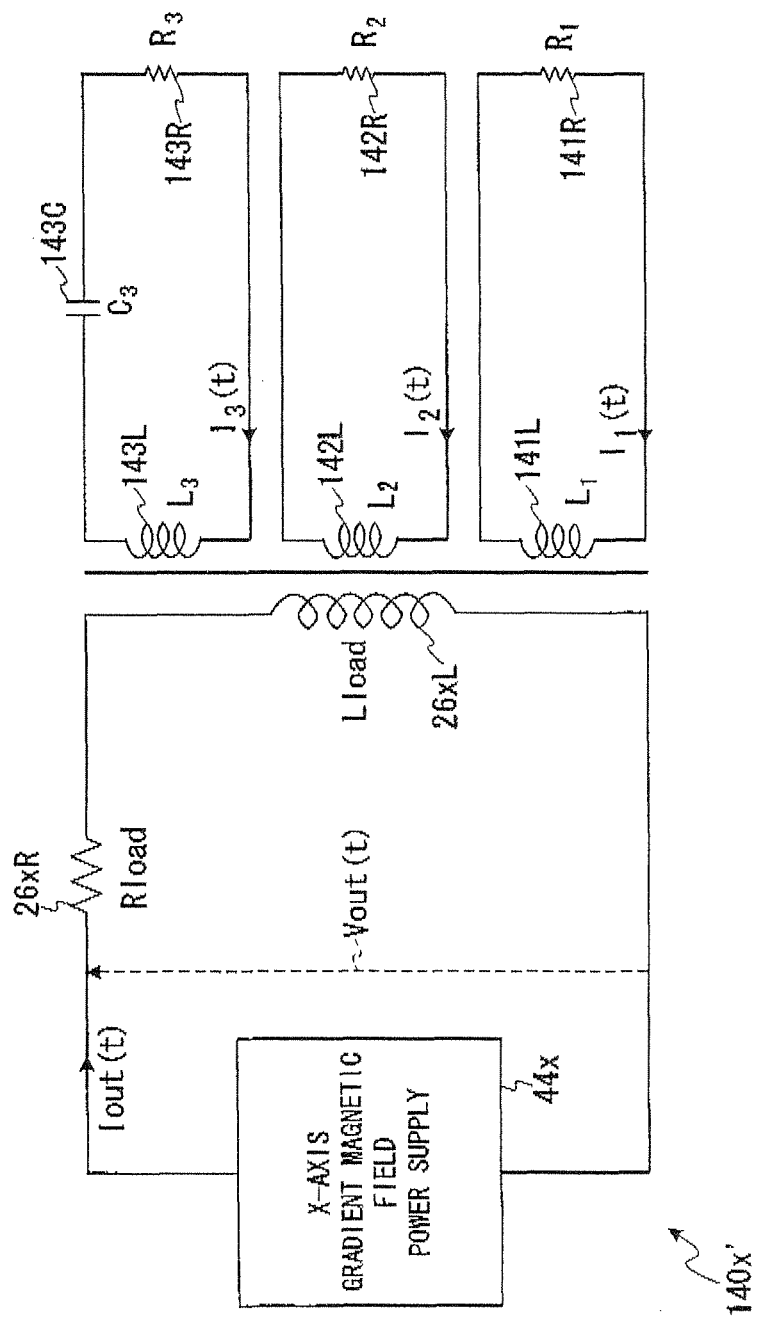
FIG. 16 is a circuit diagram showing another example of the equivalent circuit model of the gradient magnetic field generation system used in the calculation for judging whether an imaging sequence is practicable or not.

FIG. 16 is a circuit diagram showing another example of the equivalent circuit model of the gradient magnetic field generation system used in the calculation for judging whether the imaging sequence is practicable or not.

Configuration of the equivalent circuit model 140x' shown in FIG. 16 is obtained by adding a third secondary-side circuit to the equivalent circuit model 140x shown in FIG. 5. The third secondary-side circuit has a series connection of a capacitor 143C that corresponds to the capacitance component of the line filter (any of 250, 250' and 250"), a coil 143L that corresponds to the inductance component of the line filter and a resistor 143R that corresponds to the resistance component of the line filter. The coil 143L is electromagnetically coupled to the coil 26xL.

The capacitance value of the capacitor 143C is denoted by $C_3$, the self-inductance value of the coil 143L is denoted by $L_3$, the resistance value of the resistor 143R is denoted by $R_3$, the value of the electric flowing in the third secondary-side circuit in the direction of the arrow is denoted by $I_3(t)$.

Also, the mutual inductance value between the coil 143L and the coil 26xL is denoted by $M_3$. Then, the following formulas (37), (38), (39), and (40) hold.

$$Vout(t) = R_{load} \cdot Iout(t) + L_{load} \cdot \frac{dIout(t)}{dt} + \qquad (37)$$
$$M_1 \cdot \frac{dI_1(t)}{dt} + M_2 \cdot \frac{dI_2(t)}{dt} + M_3 \cdot \frac{dI_3(t)}{dt}$$

$$0 = R_1 \cdot I_1(t) + L_1 \cdot \frac{dI_1(t)}{dt} + M_1 \cdot \frac{dIout(t)}{dt} \qquad (38)$$

$$0 = R_2 \cdot I_2(t) + L_2 \cdot \frac{dI_2(t)}{dt} + M_2 \cdot \frac{dIout(t)}{dt} \qquad (39)$$

$$0 = R_3 \cdot I_3(t) + L_3 \cdot \frac{dI_3(t)}{dt} + M_3 \cdot \frac{dIout(t)}{dt} + \frac{1}{C_3} \cdot \int_0^t I_3 \, dt \qquad (40)$$

The first to third judgment algorithms can be performed according to the formulas (37) to (40) in the same manner as in the embodiment described above.

Figure 17:
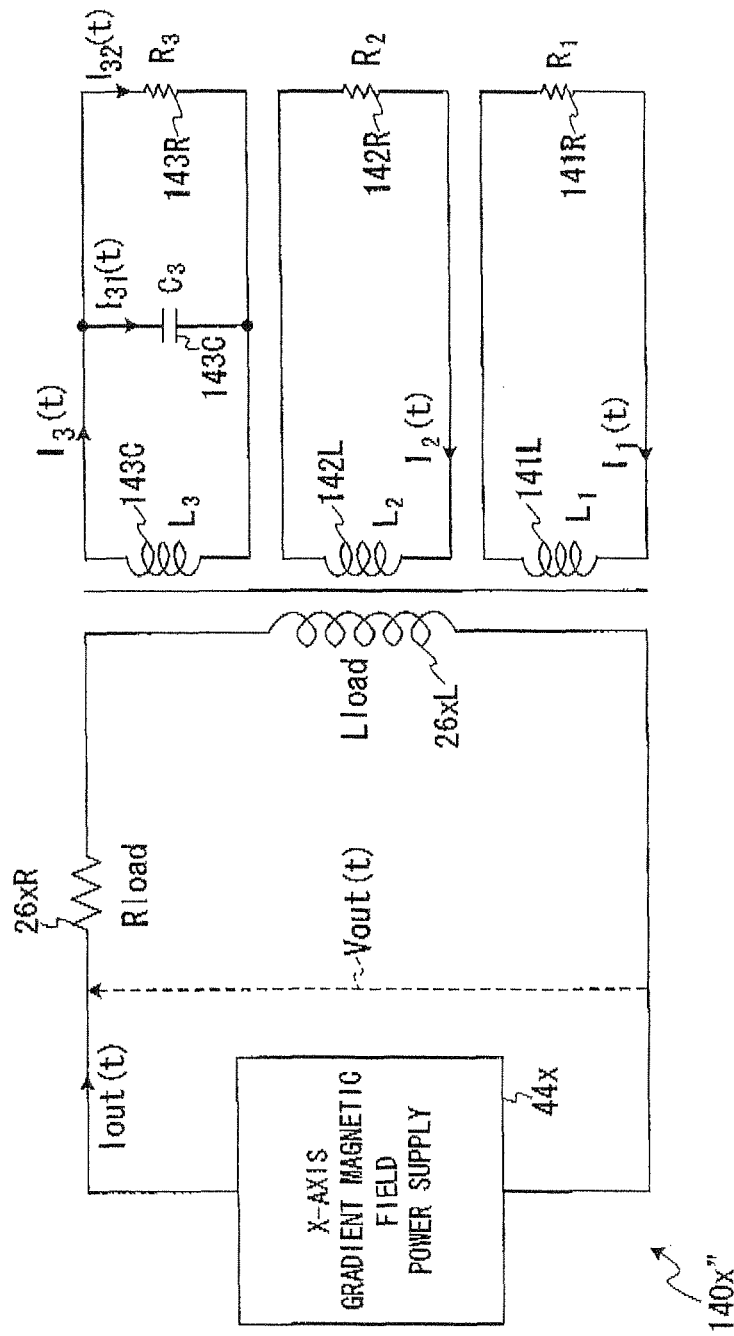
FIG. 17 is a circuit diagram showing another example of the equivalent circuit model of the gradient magnetic field generation system used in the calculation for judging whether the imaging sequence is practicable or not.

FIG. 17 is a circuit diagram showing another example of the equivalent circuit model of the gradient magnetic field generation system used in the calculation for judging whether the imaging sequence is practicable or not.

An equivalent circuit model 140x" shown in FIG. 17 is the same as the equivalent circuit model 140x' described above except that the capacitor 143C, the coil 143L and the resistor 143R of the third secondary-side circuit are connected in parallel with each other.

In this case, the value of the electric current flowing through the coil 143L in the third secondary-side circuit in the direction of the arrow in FIG. 17 is denoted by $I_3(t)$, the value of the electric current flowing through the capacitor 143C in the same direction is denoted by $I_{31}(t)$, and the value of the electric current flowing through the resistor 143R in the same direction is denoted by $I_{32}(t)$.

Thus, $I_3(t)$ is the sum of $I_{31}(t)$ and $I_{32}(t)$. Then, the following formulas (41), (42), (43), (44), (45), and (46) hold.

$$Vout(t) = R_{load} \cdot Iout(t) + L_{load} \cdot \frac{dIout(t)}{dt} + \qquad (41)$$
$$M_1 \cdot \frac{dI_1(t)}{dt} + M_2 \cdot \frac{dI_2(t)}{dt} + M_3 \cdot \frac{dI_3(t)}{dt}$$

-continued $$0 = R_1 \cdot I_1(t) + L_1 \cdot \frac{dI_1(t)}{dt} + M_1 \cdot \frac{dIout(t)}{dt} \quad (42)$$

$$0 = R_2 \cdot I_2(t) + L_2 \cdot \frac{dI_2(t)}{dt} + M_2 \cdot \frac{dIout(t)}{dt} \quad (43)$$

$$0 = L_3 \cdot \frac{dI_3(t)}{dt} + M_3 \cdot \frac{dIout(t)}{dt} + \frac{1}{C_3} \cdot \int_0^t I_{31} \, dt \quad (44)$$

$$0 = R_3 \cdot I_{32}(t) + L_3 \cdot \frac{dI_3(t)}{dt} + M_3 \cdot \frac{dIout(t)}{dt} \quad (45)$$

$$I_3(t) = I_{31}(t) + I_{32}(t) \quad (46)$$

Based on the above formulas (41) to (46), the first to third judgment algorithm may be performed in the way similar to the aforementioned embodiment. In the example described above, the regridding processing described above with reference to FIG. 8 and FIG. 9 is performed only in the case where the imaging sequence is an EPI sequence. However, embodiments of the present invention are not limited to such an aspect.

The regridding processing can also be performed in a case where the imaging sequence is not an EPI sequence.

In the example described above, the electrolyte capacitors 126, 126' and 126" are used as a power supply source that is charged before the performance of an imaging sequence and supplies a discharge current to the gradient magnetic field amplifiers 128, 128' and 128" when the imaging sequence is performed. However, embodiments of the present invention are not limited to such an aspect.

Instead of the electrolyte capacitors 126, 126' and 126", a charge/discharge element, such as a secondary battery and an electric double layer capacitor, can be used. The charge/discharge element herein refers to a circuit element that can be repeatedly charged and discharged, such as a capacitor and a secondary battery.

In the example described above, in Step S9, correction candidates for the conditions of the imaging sequence are calculated and displayed. However, embodiments of the present invention are not limited to such an implementation. The calculation of correction candidates for the conditions of the imaging sequence is not essential and can be omitted.

For example, if it is judged in Step S8 that the imaging sequence is impracticable, the display device 64 can change the way of display of the boxes (184, 190, 192, 194 and 196) of the parameters of the conditions of the imaging sequence to be corrected in such a manner that the boxes can be distinguished. After that, when the conditions of the imaging sequence are corrected, the process can return Step S5. Correction of the conditions of the imaging sequence and judgment of whether the imaging sequence is practicable or not are repeatedly performed, and the process can proceed to the main scan only after it is judged in Step S8 that the imaging sequence is practicable.

In the MRI apparatus 20A, for example, components such as the static magnetic field magnet 22, the shim coil 24 and so on are included in a cylindrical structure which is called the gantry 21 in FIG. 2. In FIG. 1, an example has been described in which the RF receiver 48 is disposed outside the gantry 21, that is, the RF receiver 48 is disposed outside the static magnetic field magnet 22, the shim coil 24, and the gradient magnetic field coil unit 26. However, the embodiment of the present invention is not limited to such an implementation. The RF receiver 48 may be included in the gantry 21. (This point applies to the second embodiment).

Specifically, for example, an electronic circuit board that is equivalent to the RF receiver 48 may be disposed in the gantry 21. Then, the MR signals, which are analog electrical signals converted from the electromagnetic wave by the receiving RF coil 28, may be amplified by a pre-amplifier in the electronic circuit board, the amplified signals may be outputted to the outside of the gantry 21 as digital signals and inputted to the sequence controller 56. In outputting the signals to the outside of the gantry 21, for example, an optical communication cable is preferably used to transmit the signals in the form of optical digital signals. This is because the effect of external noise is reduced.

Second Embodiment

In the second embodiment, the regridding processing will be described in further detail. The second to fifth embodiments are the same as the first embodiment in that the gradient magnetic field waveform is calculated with high accuracy. The entire configuration of the hardware of an MRI apparatus 20B according to the second to fifth embodiments is the same as that of the MRI apparatus 20A according to the first embodiment described above with reference to FIG. 1, and therefore, illustration of the entire configuration thereof is omitted.

The MRI apparatus 20B according to the second to fifth embodiments differs from the MRI apparatus 20A according to the first embodiment in functionality of the computer. In the following, the computer and the operation device are renumbered as 58' and 60', respectively, and differences from the first embodiment will be mainly described.

Figure 18:
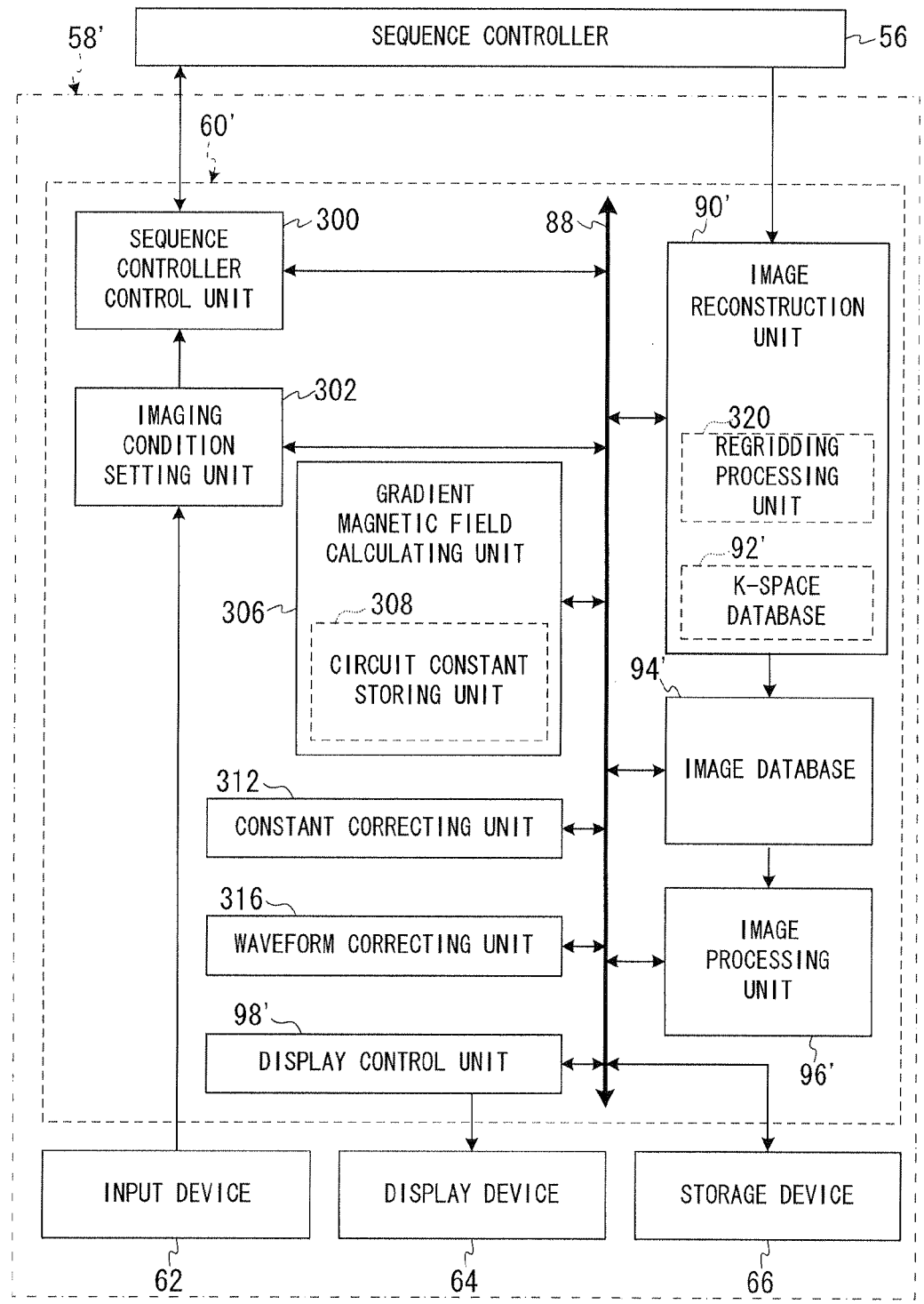
FIG. 18 is a functional block diagram showing the computer in the MRI apparatus according to the second embodiment.

FIG. 18 is a functional block diagram showing the computer 58' in the MRI apparatus 20B according to the second to fifth embodiments.

The computer 58' functions as a sequence controller control unit 300, an imaging condition setting unit 302, a gradient magnetic field calculating unit 306 (including a circuit constant storing unit 308), a constant correcting unit 312, a waveform correcting unit 316, an image reconstruction unit 90' (including a k-space database 92' and a regridding processing unit 320), an image database 94', an image processing unit 96', a display control unit 98' and the like according to a program.

The imaging condition setting unit 302 sets conditions of the imaging sequence including values of parameters, such as a pulse width and a pulse amplitude, based on instruction information from the input device 62, the judgment result concerning the calculated gradient magnetic field waveform or the like.

The imaging condition setting unit 302 sets an imaging sequence according to the conditions of the imaging sequence and inputs the imaging sequence to the sequence controller control unit 300.

The sequence controller control unit 300 inputs the imaging sequence or the like set by the imaging condition setting unit 302 to the sequence controller 56.

The static magnetic field magnet 22, the static magnetic field power supply 40, the shim coil 24, the shim coil power supply 42, the gradient magnetic field coil 26, the gradient magnetic field power supply 44, the RF transmitter 46, the RF receiver 48, the sequence controller 56, the sequence controller control unit 300, the imaging condition setting unit 302 and the like form a data acquisition unit.

The data acquisition unit performs the prescan described later. In addition, the data acquisition unit performs the main scan according to the imaging sequence set by the imaging condition setting unit 302, thereby acquiring MR signals from an object QQ as raw data.

The image reconstruction unit 90' converts the raw data of the MR signals inputted thereto from the RF receiver 48 via the sequence controller 56 into k-space data and retains the k-space data in a k-space (frequency space) in the k-space database 92'.

Furthermore, the image reconstruction unit 90' fetches the k-space data from the k-space database 92' and performs the image reconstruction processing including Fourier transformation to generate image data. The image reconstruction unit 90' retains the generated image data in the image database 94'.

Furthermore, the image reconstruction unit 90' has the regridding processing unit 320 that performs the regridding processing.

The image processing unit 96' fetches required image data from the image database 94' and performs image processing such as differential processing and display processing such as maximum intensity projection (MIP) processing, on the image data to generate display image data. The image processing unit 96' stores the generated image data in the storage device 66.

The display control unit 98' performs a control for allowing the display image data stored in the storage device 66 and characters and images for various user interfaces to be displayed on the display device 64.

The gradient magnetic field calculating unit 306 performs the calculations described below on the assumption that there are other coils than the gradient magnetic field coil 26 (a coil electromagnetically coupled to the gradient magnetic field coil 26) as in the first embodiment.

Specifically, the gradient magnetic field calculating unit 306 calculates the electric current (I1($t$) and I2($t$) in FIG. 5) flowing through the other coils described above based on the electric current flowing through the gradient magnetic field coil 26 in the equivalent circuit (see FIG. 5, for example) including the gradient magnetic field coil 26 and the other described above. In the following description, the electric current (Iout(t) in FIG. 5) flowing through the gradient magnetic field coil 26 will be referred to as gradient magnetic field current.

Based on the gradient magnetic field current and the current flowing through the other coils described above, the gradient magnetic field calculating unit 306 further calculates the waveforms of the gradient magnetic fields formed in the imaging region (the time variations of the gradient magnetic fields Gx, Gy and Gz along the X axis, the Y axis and the Z axis described above, for example).

The circuit constant storing unit 308 stores the circuit constants of the equivalent circuit.

The constant correcting unit 312 acquires an evaluation image by the prescan described later. If the evaluation image contains an artifact, the constant correcting unit 312 corrects the circuit constants of the equivalent circuit so as to reduce the artifact.

In the second embodiment, the description is focused on the regridding processing, and thus, correction of the circuit constants will not be described. Specific functions of the constant correcting unit 312 (correction of the circuit constants) will be described in the third embodiment.

The waveform correcting unit 316 corrects the parameters of the imaging sequence to bring the gradient magnetic field waveform to a target waveform, in the case where the gradient magnetic field waveform calculated by the gradient magnetic field calculating unit 306 deviates from the set values of the gradient magnetic field waveform.

In the second embodiment, the description is focused on the regridding processing, and thus, correction of the parameters of the imaging sequence will not be described. Specific functions of the waveform correcting unit 316 (the processing of bringing the gradient magnetic field waveform to the target waveform) will be described in the fourth embodiment.

As described above, the gradient magnetic field is generated by applying a current pulse to the gradient magnetic field coil 26. The current pulse applied to the gradient magnetic field coil 26 ideally has a rectangular shape but actually has a trapezoidal shape having a rising section and a falling section. As a result, the pulse of the gradient magnetic field also does not have an ideal rectangular waveform but has a trapezoidal waveform having a rising section and a falling section.

In a fast imaging method, such as EPI, data sampling occurs not only in the flat section of the pulse but also in the rising section and the falling section (ramp sampling), and the data are used for image reconstruction. In this way, the time required for acquiring data is further reduced.

MR signals sampled at equal time intervals in the rising section and the falling section are sampled when the gradient magnetic field is changing and therefore are not placed at equal intervals in the k-space. Thus, the sampled MR signals are desirably rearranged to be placed at equal intervals in the k-space before image reconstruction. The rearrangement processing is the regridding processing described above in the first embodiment.

Figure 19:
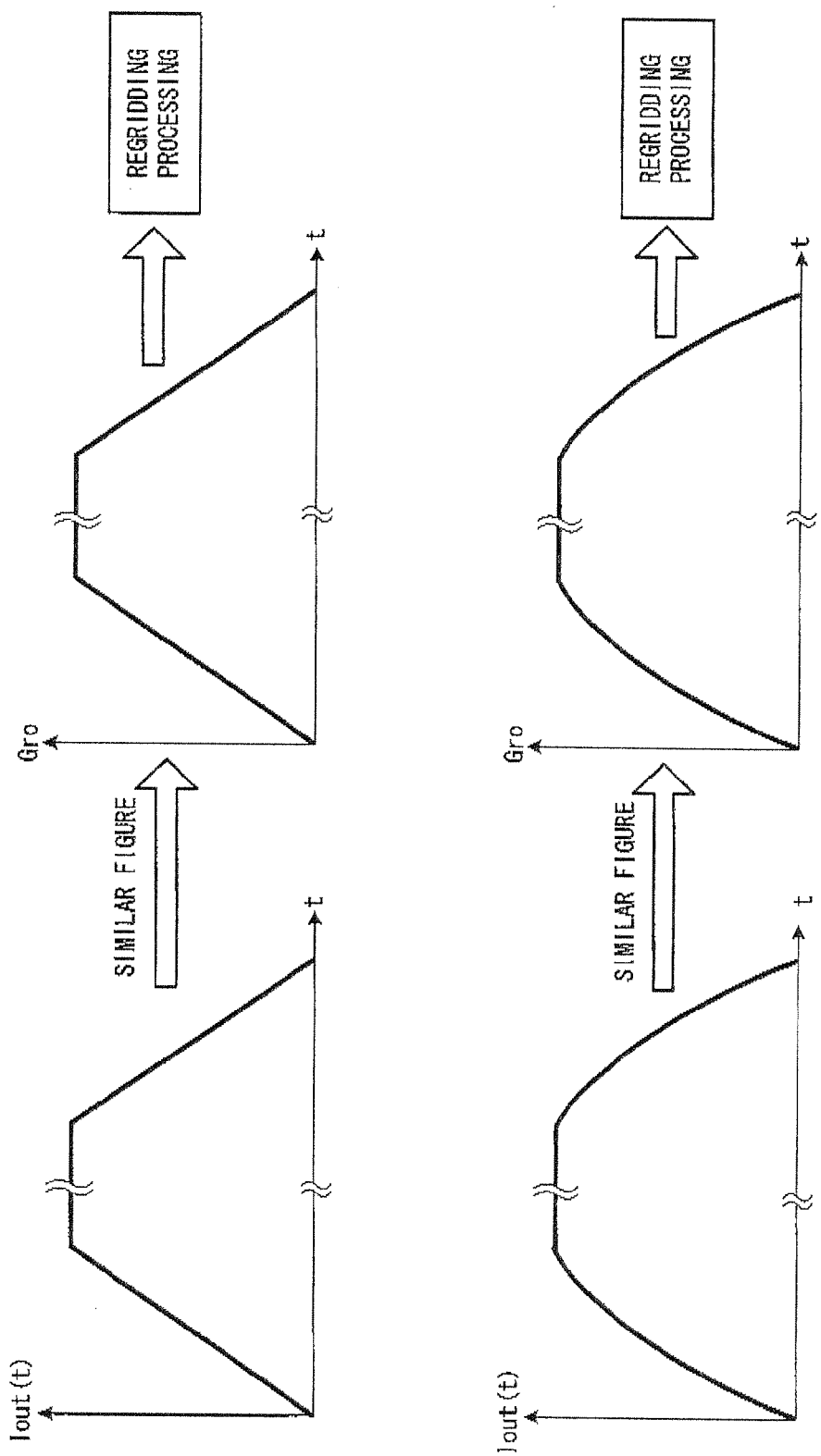
FIG. 19 is a schematic diagram showing a concept of conventional regridding processing.

FIG. 19 is a schematic diagram showing a concept of the conventional regridding processing. In FIG. 19, each horizontal axis indicates the elapsed time t. In this example, it is assumed that the X axis of the apparatus coordinate system agrees with the readout direction, and the gradient magnetic field current supplied to the gradient magnetic field coil 26x is denoted by Iout(t) (the same holds true for the description of FIG. 20).

The graphs shown in the upper left part and the lower left part of FIG. 19 show examples of waveforms of the gradient magnetic field current Iout(t), and the vertical axes of these graphs indicate the magnitude of the gradient magnetic field current Iout(t). The graphs shown in the upper right part and the lower right part of FIG. 19 show examples of waveforms of the gradient magnetic field Gro in the readout direction, and the vertical axes of these graphs indicate the intensity of the magnetic field.

According to the conventional technique, the gradient magnetic field waveform is estimated on the assumption that the waveform of the gradient magnetic field Gro in the readout direction is similar to the waveform of the gradient magnetic field current Iout(t). That is, according to the conventional technique, it is estimated that the waveform of the gradient magnetic field Gro in the readout direction shown in the upper right part of FIG. 19 is derived from the waveform of the gradient magnetic field current Iout(t) shown in the upper left part of FIG. 19. Similarly, it is estimated that the waveform of the gradient magnetic field Gro in the readout direction shown in the lower right part of FIG. 19 is derived from the waveform of the gradient magnetic field current Iout(t) shown in the lower left part of FIG. 19.

According to the conventional technique, the regridding processing is performed based on the gradient magnetic field waveform that is inaccurately estimated in this way.

The waveform of the gradient magnetic field current may be trapezoidal as shown in the upper right part of FIG. 19 or may include a nonlinear section as shown in the lower right part of FIG. 19. In any case, according to the conventional technique, the regridding processing is performed on the assumption that the gradient magnetic field waveform is similar to the gradient magnetic field current waveform.

However, the waveform of the gradient magnetic field current and the waveform of the gradient magnetic field actually induced by the gradient magnetic field current do not always agree with each other. In particular, in the case of the gradient magnetic field having higher frequency components, such as the gradient magnetic field used in the fast imaging method like EPI, the gradient magnetic field waveform deviates from the gradient magnetic field current waveform, in particular, in the rising section and the falling section.

To solve the problem, the MRI apparatus 20B according to the second embodiment accurately calculates the waveform of the actually generated gradient magnetic field on the assumption that there are a plurality of other coils than the gradient magnetic field coil 26 as in the first embodiment.

Figure 20:
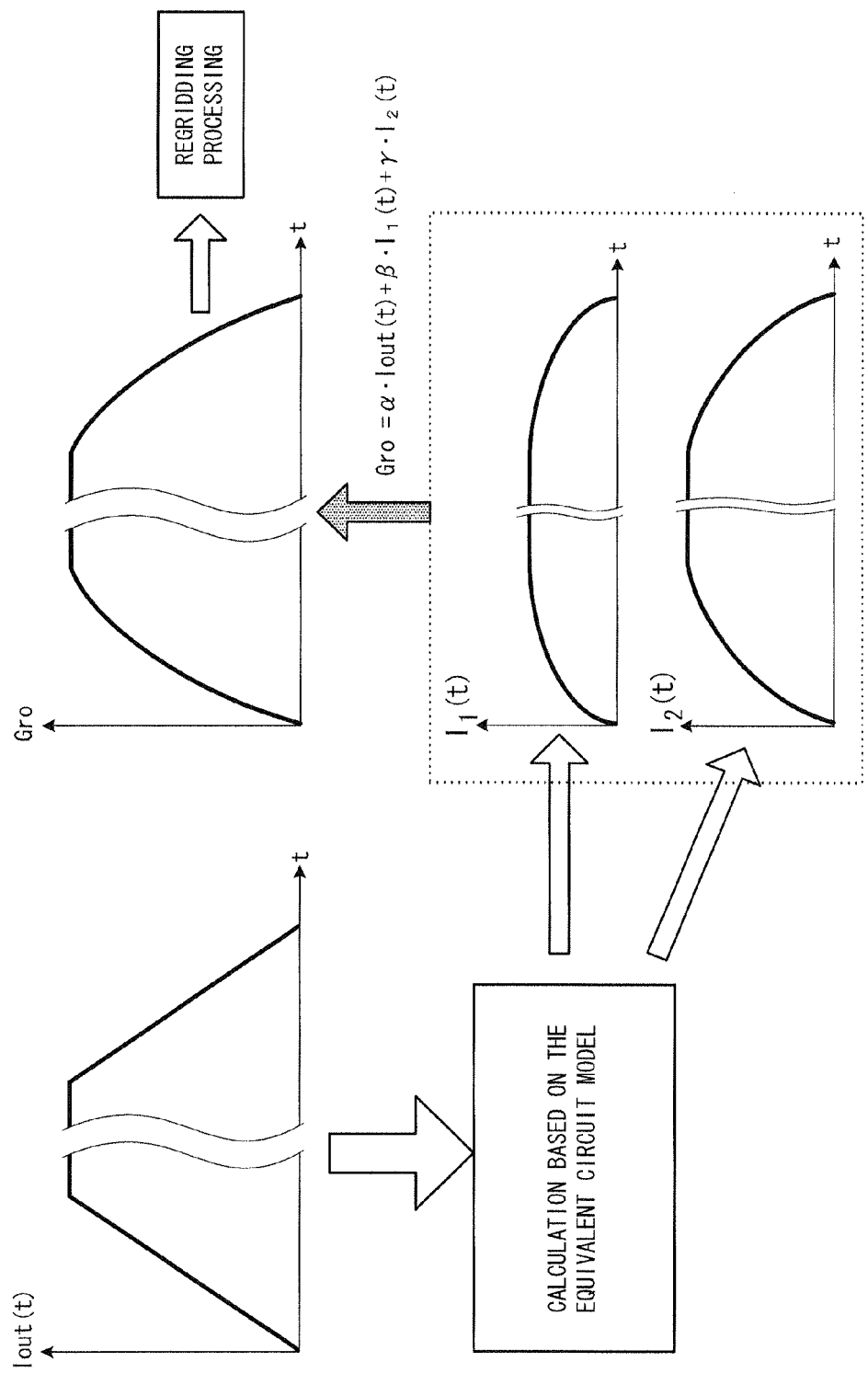
FIG. 20 is a schematic diagram showing a concept of a calculation method for a gradient magnetic field waveform according to the second embodiment.

FIG. 20 is a schematic diagram showing a concept of a calculation method for a gradient magnetic field waveform according to the second embodiment. In FIG. 20, the process proceeds from the upper left part to the lower left part, then to the lower right part and then finally to the upper right part. The upper left part of FIG. 20 shows an example of the waveform of the gradient magnetic field current Iout(t) as in FIG. 19. The lower right part of FIG. 20 is a schematic diagram showing examples of the electric current I1($t$) and the electric current I2($t$) flowing through the coils 141L and 142L respectively in FIG. 5, which are the other coils. The upper right part of FIG. 20 is a schematic diagram showing an example of the waveform of the calculated gradient magnetic field Gro in the readout direction.

According to the second embodiment, the electric current that flow through the other coils 141L and 142L when the gradient magnetic field current Iout(t) is inputted to the equivalent circuit including the gradient magnetic field coil 26 and the other coils 141L and 142L is calculated (see the lower right part of FIG. 20).

Then, based on the gradient magnetic field current, the calculated electric current $I_1$(t) and the calculated electric current $I_2$(t), the waveform of the actually generated gradient magnetic field Gro is calculated with high accuracy (see the upper right part of FIG. 20). Furthermore, based on the gradient magnetic field waveform calculated with high accuracy in this way, the regridding processing is performed.

In this example, a case where the equivalent circuit of the gradient magnetic field generation system described above with reference to FIG. 5 is used will be described. The gradient magnetic field generation system refers to the whole of the components involved in generation of the gradient magnetic field, including the gradient magnetic field power supply 44, the gradient magnetic field coil 26 and the sequence controller 56 shown in FIG. 1. However, as for the equivalent circuit, the equivalent circuits shown in FIGS. 16 and 17 described above in the first embodiment may be used. That is, the number of other coils than the gradient magnetic field coil 26 is not limited to 2 but can be 1 or 3 or more.

FIG. 5 shows an example of the equivalent circuit model of the gradient magnetic field generation system for the X axis gradient magnetic field Gx as described above. A similar equivalent circuit model is used for the gradient magnetic field generation system for the Y axis gradient magnetic field Gy and the gradient magnetic field generation system for the Z axis gradient magnetic field Gz.

The resistance value Rload in the formula (9) or the like described above in the first embodiment is measureable as described above, and the measured resistance value Rload is preliminarily stored in the circuit constant storing unit 308. The self-inductance value Lload preliminarily determined in the same manner as in the first embodiment is also preliminarily stored in the circuit constant storing unit 308.

Once the resistance value Rload and the self-inductance value Lload are determined, the coupling coefficient $K_1$ in the formula (4), the coupling coefficient $K_2$ in the formula (5), the time constant $\tau_1 = L_1/R_1$ and the time constant $\tau_2 = L_2/R_2$ can be determined in the same manner as in the first embodiment. Thus, the mutual inductance $M_1$ and the mutual inductance $M_2$ are determined in the same manner as in the first embodiment, and the circuit constants A, B, C and D are determined according to the formulas (11) to (14).

In the second embodiment, an example will be described in which the waveform of the gradient magnetic field is calculated in spin echo EPI, and the regridding processing is performed based on the gradient magnetic field waveform.

Figure 21:
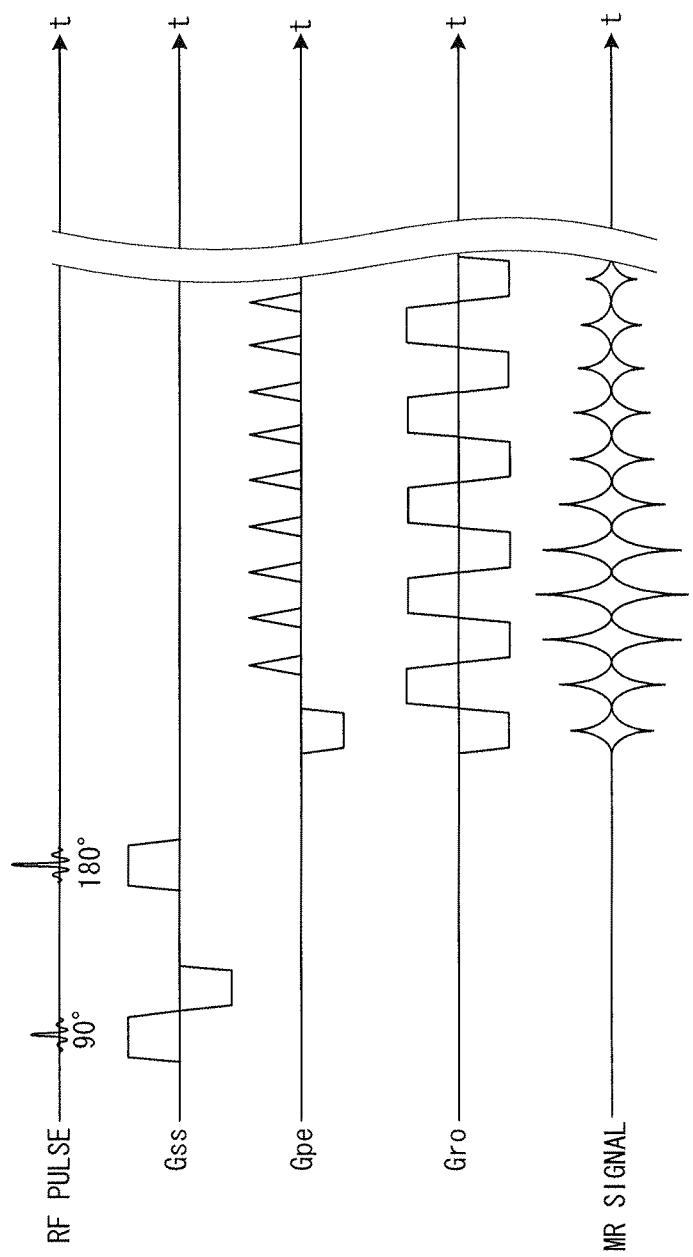
FIG. 21 is a schematic diagram for illustrating an example of an imaging sequence of spin echo EPI.

FIG. 21 is a schematic diagram for illustrating an example of an imaging sequence of spin echo EPI. From the top toward the bottom, FIG. 21 shows examples of the waveforms of the RF pulses, the gradient magnetic field Gss in the slice selection direction, the gradient magnetic field Gpe in the phase encode direction, the gradient magnetic field Gro in the readout direction and the MR signals (echo signals) from the object QQ. Each horizontal axis indicates the elapsed time t.

EPI is to successively invert the gradient magnetic field at a high speed in one nuclear magnetic excitation to cause successive MR signals and acquire (collect) the MR signals.

More specifically, EPI is to invert at a high speed the gradient magnetic field Gro in the readout direction in synchronization with the phase encode steps before the magnetization in the xy plane attenuates and vanishes because of the transverse relaxation (T2 relaxation) after application of a 90° excitation pulse. In this way, successive gradient echoes are generated, and the MR signals used for image reconstruction are acquired.

EPI can be classified into spin (SE) EPI, field echo (FE) EPI, fast FE (FFE) EPI and the like.

SE EPI is a method based on the spin echo method as shown in FIG. 21 for acquiring MR signals generated after the 90° excitation pulse and a 180° excitation pulse are applied.

FE EPI is a method for acquiring MR signals generated after the 90° excitation pulse is applied. FFE EPI is a method using the fast FE method.

EPI that creates image data for one image by combining data on an echo train obtained by application of a plurality of excitation pulses is referred to as multi-shot EPI. On the other hand, EPI that reconstructs an image only from an echo train obtained by application of a single excitation pulse is referred to as a single shot (SS) EPI.

Next, the regridding processing according to the second embodiment will be specifically described.

As described above with reference to FIG. 8, if the number of the phase encode steps and the number of frequency encode steps are both 256, for example, the k-space data are generated as described below.

That is, the same number of lines of MR signals as the number of phase encode steps are arranged for each phase encode step after the cosine function or sine function of the carrier frequency is subtracted from each of the MR signals. The plurality of MR signals are divided by the number of frequency encode steps, and the intensity of each resulting signal is regarded as a matrix value. Thereby, matrix data comprising 256 by 256 matrix elements (that is, the real part or the imaginary part of the k-space data) are generated.

The MR signals sampled at equal or unequal intervals under application of the gradient magnetic field Gro in the readout direction correspond to an integral of the gradient magnetic field Gro in the readout direction along the time axis, that is, a 0th-order moment of the gradient magnetic field Gro in the readout direction in the k-space.

In a region where the gradient magnetic field is flat, the 0-th order moment linearly varies. However, in regions where the gradient magnetic field are not flat (such as the rising region and the falling region), the 0-th order moment nonlinearly varies. In the fast imaging method, such as EPI, even data on the MR signals sampled in the regions where the gradient magnetic field is not flat (such as the rising region and the falling region) are used for image reconstruction in order to further reduce the imaging time.

The image reconstruction is performed on the assumption that the sampled data lies in a linear region in the k-space. Thus, it is desired to convert or correct the nonlinear sampled data so as to be linear in the k-space.

Figure 22:
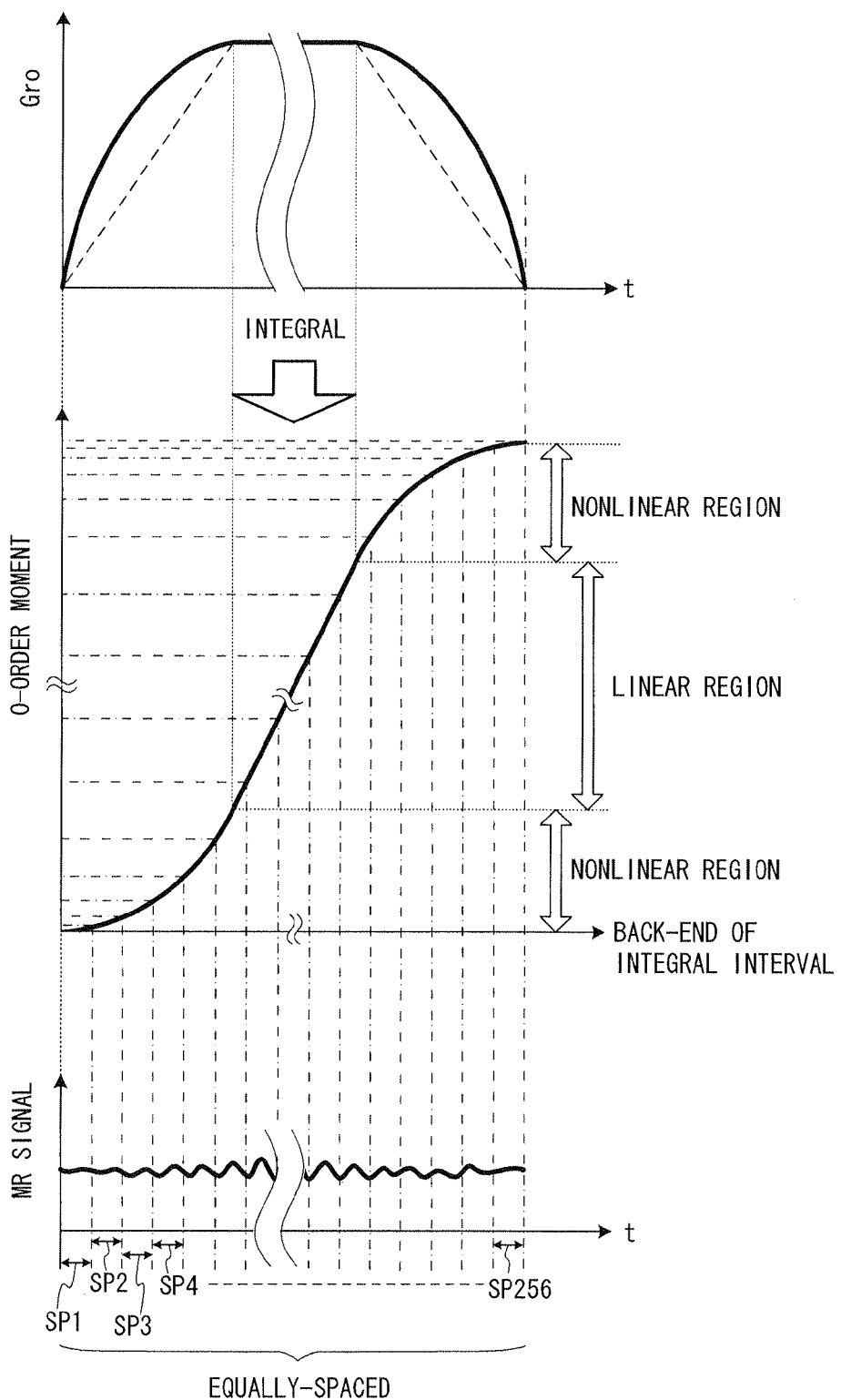
FIG. 22 is a conceptual diagram showing that MR signals sampled at equal time intervals in a region where the gradient magnetic field Gro in the readout direction is nonlinear are placed at unequal intervals in the k-space.

FIG. 22 is a conceptual diagram showing that MR signals sampled at equal time intervals in a region where the gradient magnetic field Gro in the readout direction is nonlinear are placed at unequal intervals in the k-space.

The upper part of FIG. 22 is the same as the upper right part of FIG. 20 and shows an example of the waveform of the gradient magnetic field Gro in the readout direction accurately calculated according to the method of the first embodiment. That is, in the upper part of FIG. 22, the horizontal axis indicates the elapsed time t from the start time of applying the pulses of the gradient magnetic field Gro in the readout direction, and the vertical axis indicates the intensity of the gradient magnetic field Gro in the readout direction.

The middle part of FIG. 22 shows a time integral of the absolute value of the intensity of the gradient magnetic field Gro in the readout direction shown in the upper part of FIG. 22. In common to all the integration periods, the start time of the integration period is the start time of application of the pulses of the gradient magnetic field Gro in the readout direction.

Therefore, in the middle part of FIG. 22, the horizontal axis indicates the back end of the integral interval (integration period,) and the vertical axis indicates the time integral of the absolute value of the intensity of the gradient magnetic field Gro in the readout direction, that is, the 0-th order moment.

The lower part of FIG. 22 is a schematic diagram showing respective sampling periods for each of the MR signals for one phase encode step (that is, the MR signals for one line), when sampling of the MR signals is performed based on equally-spaced sampling periods.

In the lower part of FIG. 22, the horizontal axis indicates the elapsed time t since the start time of applying the pulses of the gradient magnetic field Gro in the readout direction as with the upper part, and the vertical axis indicates the intensity of the MR signal. In this example, the number of frequency encode steps is 256, and 256 sampling periods SP1, SP2, SP3, SP4, . . . , SP256 are set. That is, the MR signals for one line are equally divided into the 256 sampling periods SP1 to SP256 as shown by the vertical alternate long and short dash lines in FIG. 22.

The region where the gradient magnetic field is not flat means a region where the 0-th order moment of the gradient magnetic field is nonlinear, and the region where the gradient magnetic field is linear means a region where the 0-th order moment of the gradient magnetic field is linear.

Therefore, as can be seen from the upper part, the middle part and the lower part of FIG. 22, if the MR signals are sampled at equal time intervals both in the region where the gradient magnetic field Gro in the readout direction is flat and in the region where the gradient magnetic field Gro in the readout direction is not flat, the generated k-space data become unequally-spaced in the k-space.

This is because the MR signals sampled under application of the gradient magnetic field Gro in the readout direction correspond to the 0-th order moments of the gradient magnetic field Gro in the readout direction in the k-space, and the 0-th order moments are unequally-spaced as shown by the horizontal alternate long and short dash lines in the middle part of FIG. 22.

In the following description, if the term 0-th order moment is merely used, it means the 0-th order moment of the gradient magnetic field Gro in the readout direction.

Figure 23:
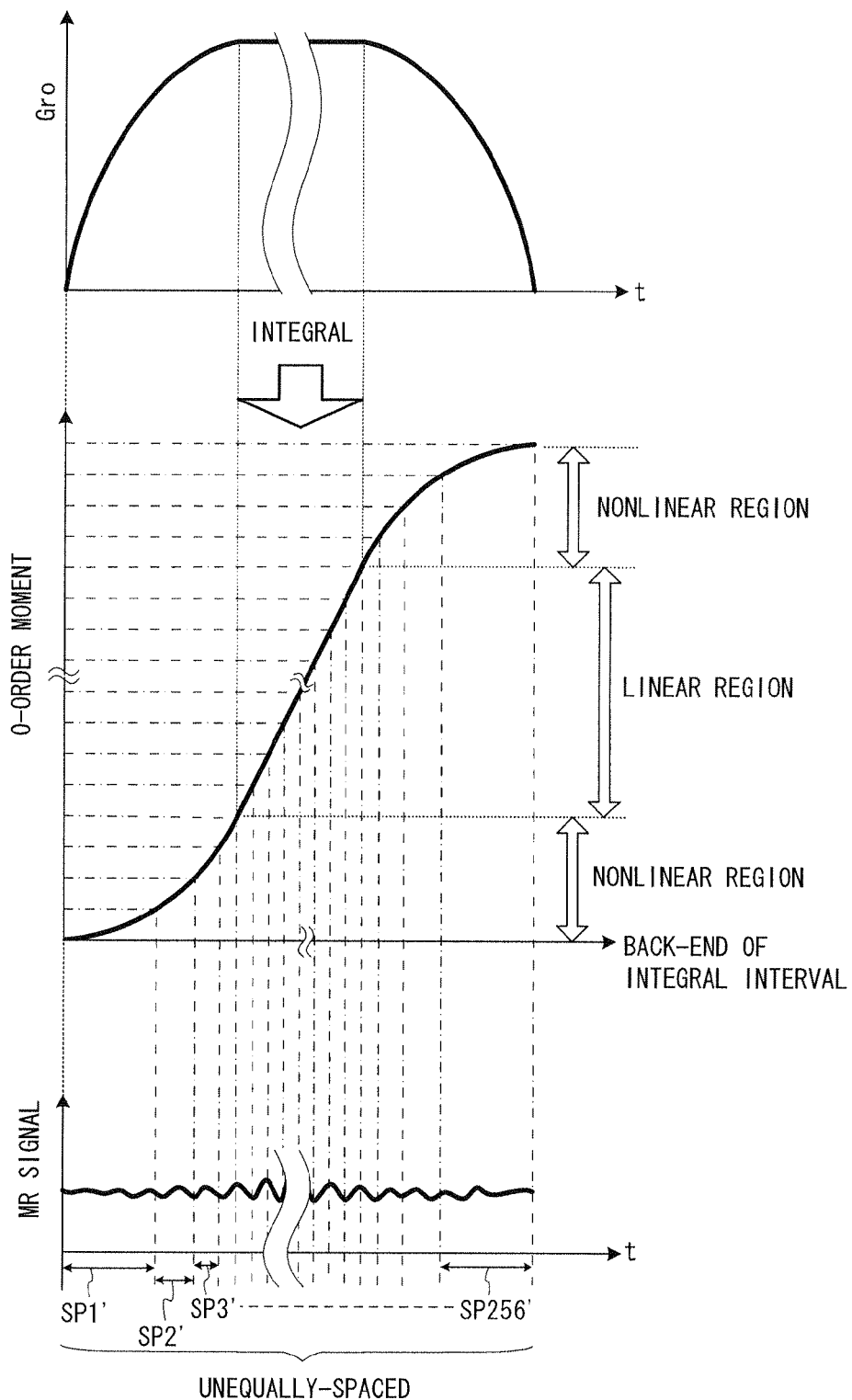
FIG. 23 is a schematic diagram showing a concept of the first method of the regridding processing.

FIG. 23 is a schematic diagram showing a concept of the first method of the regridding processing. The upper part of FIG. 23 is the same as the upper part of FIG. 22. The lower part of FIG. 23 is a schematic diagram showing the sampling period for each of the MR signals for one phase encode step that are sampled at unequal intervals.

According to the first method, the MR signals for one line are unequally divided into 256 sampling periods SP1', SP2', SP3', . . . , SP256' as shown by the vertical alternate long and short dash lines in FIG. 23.

The middle part of FIG. 23 shows a way of determining the unequal sampling periods SP1' to SP256'. The middle part of FIG. 23 is the same as the middle part of FIG. 22 in that it shows 0-th order moments but differs from the middle part of FIG. 22 only in the intervals between the horizontal alternate long and short dash lines in the drawing. That is, the horizontal alternate long and short dash lines are drawn, in such a manner that the 0-th order moments rise in equal increments. The vertical alternate long and short dash lines are drawn so as to pass through the intersections between the horizontal alternate long and short dash lines and the thick line indicating the 0-th order moments.

According to the first method, the sampling periods SP1' to SP256' are determined so as to satisfy the following condition. That is, each time integral value of the pulse intensity of the gradient magnetic field Gro in the readout direction whose back end of the integral interval is the representative time of each sampling period (SP1' to SP256') becomes equally spaced.

In common to all the integration periods, the start time of the integral interval for time integral value described above is the start time of application of the pulses of the gradient magnetic field Gro in the readout direction, for example. The representative time described above may be the back end or the central time of each sampling period SP1' to SP256'.

According to the first method, the k-space data are generated by sampling the MR signals at unequal time intervals in the sampling periods determined as described above. The matrix elements of the k-space data generated in this way are placed at equal intervals in the k-space. The expression placed at equal intervals in the k-space means that the values of the 0-th order moments corresponding to the sampling periods are arranged at equal intervals as shown by the horizontal alternate long and short dash lines in the middle part of FIG. 23.

In other words, according to the first method, the MR signals are sampled at unequal time intervals, in such a manner that each 0-th order moment at each time of acquiring (receiving) a part of the MR signal corresponding to each sampling period becomes equally-spaced.

According to the second embodiment, since the gradient magnetic field waveform can be calculated with high accuracy based on the equivalent circuit as described above, the irregular sampling timings according to the first method shown in FIG. 23 can be determined with high accuracy.

Figure 24:
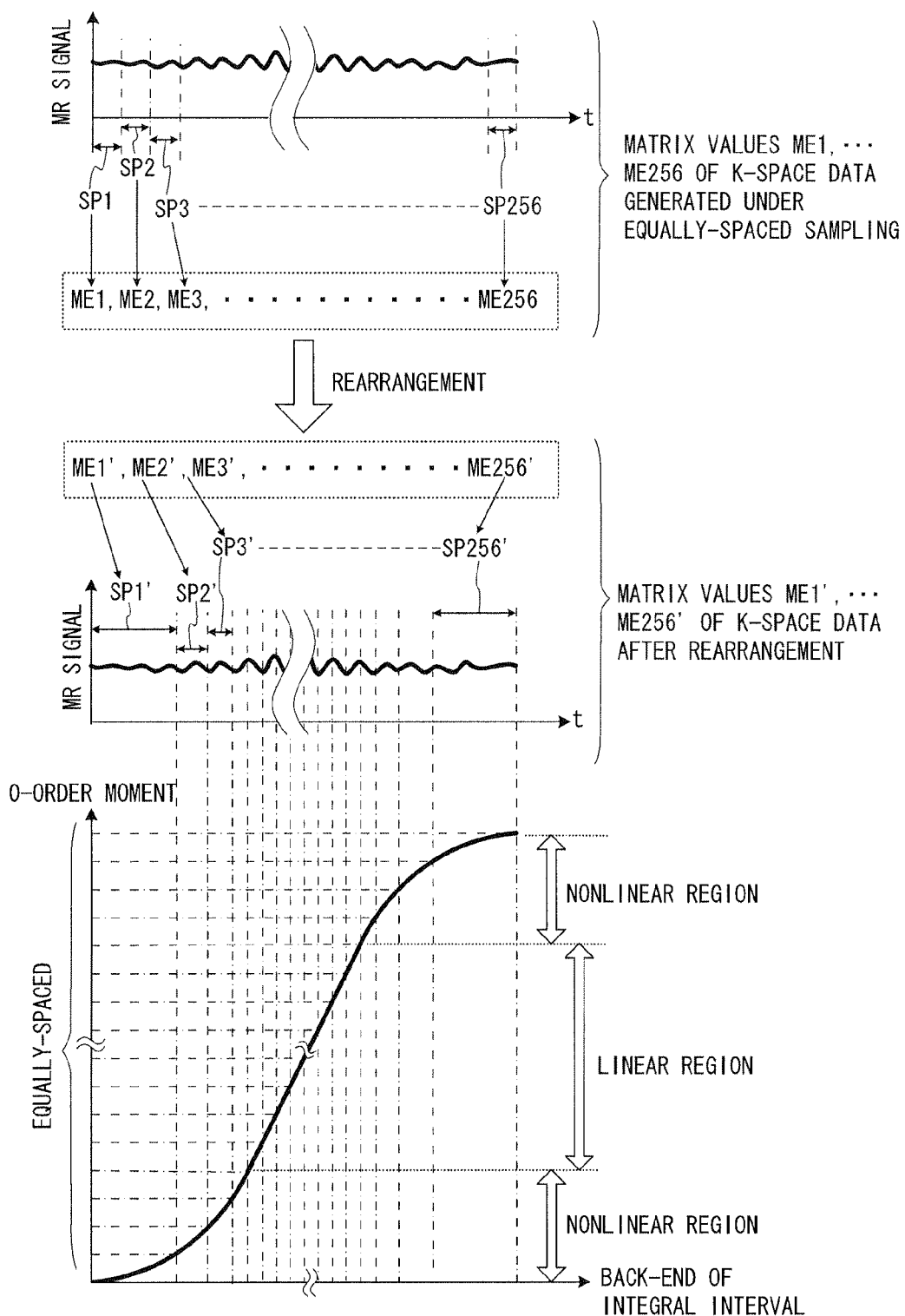
FIG. 24 is a schematic diagram showing a concept of the second method of the regridding processing.

FIG. 24 is a schematic diagram showing a concept of the second method of the regridding processing.

The upper part of FIG. 24 shows matrix values ME1, ME2, ME3, ME4, ..., ME256 of the matrix elements for one line of the k-space data generated by sampling the MR signals at equal intervals as shown in the lower part of FIG. 22.

In this example, it is assumed that the number of frequency encode steps is 256, so that the number of matrix elements for one line is also 256. The matrix values ME1, ME2, ME3, ..., ME256 correspond to the sampling periods SP1, SP2, SP3, ..., SP256 for the MR signals shown above them in the drawing.

According to the second method, k-space data are generated by sampling the MR signals at equal time intervals as shown in the upper part of FIG. 24. Then, the k-space data is rearranged (converted) into new k-space data as described below.

That is, the k-space data are rearranged, in such a manner that each time integral value of the pulse intensity of the gradient magnetic field Gro in the readout direction up to each representative time of each sampling period corresponding to each matrix element of the k-space data becomes equally-spaced.

The rearrangement can be achieved by interpolation or other processing, and the representative time is the same as those in the first method.

The middle part of FIG. 24 shows matrix values ME1', ME2', ME3', ..., ME256' of the rearranged k-space data in the upper half and shows the original MR signals (the same MR signals as those shown in the upper part of FIG. 24) in the lower half. The matrix values ME1', ME2', ME3', ..., ME256' are values that would otherwise be generated from the signal intensities of the original MR signals sampled in the sampling periods SP1' to SP256' (the same sampling periods as those shown in FIG. 23).

The lower part of FIG. 24 shows the same 0-th order moments as those shown in the middle part of FIG. 23. As shown by the horizontal alternate long and short dash lines that equally divide the 0-th order moments in the lower part of FIG. 24, the 0-th order moments corresponding to the matrix elements of the rearranged k-space data are arranged at equal intervals.

That is, according to the second method, the k-space data are rearranged, in such a manner that each 0-th order moment at each time of acquiring (receiving) the part of the MR signal corresponding to each matrix element becomes equally-spaced.

According to the second embodiment, since the gradient magnetic field waveform can be calculated with high accuracy based on the equivalent circuit as described above, the k-space data can be rearranged with high accuracy so as to be arranged at equal intervals according to the second method shown in FIG. 24.

Figure 25:
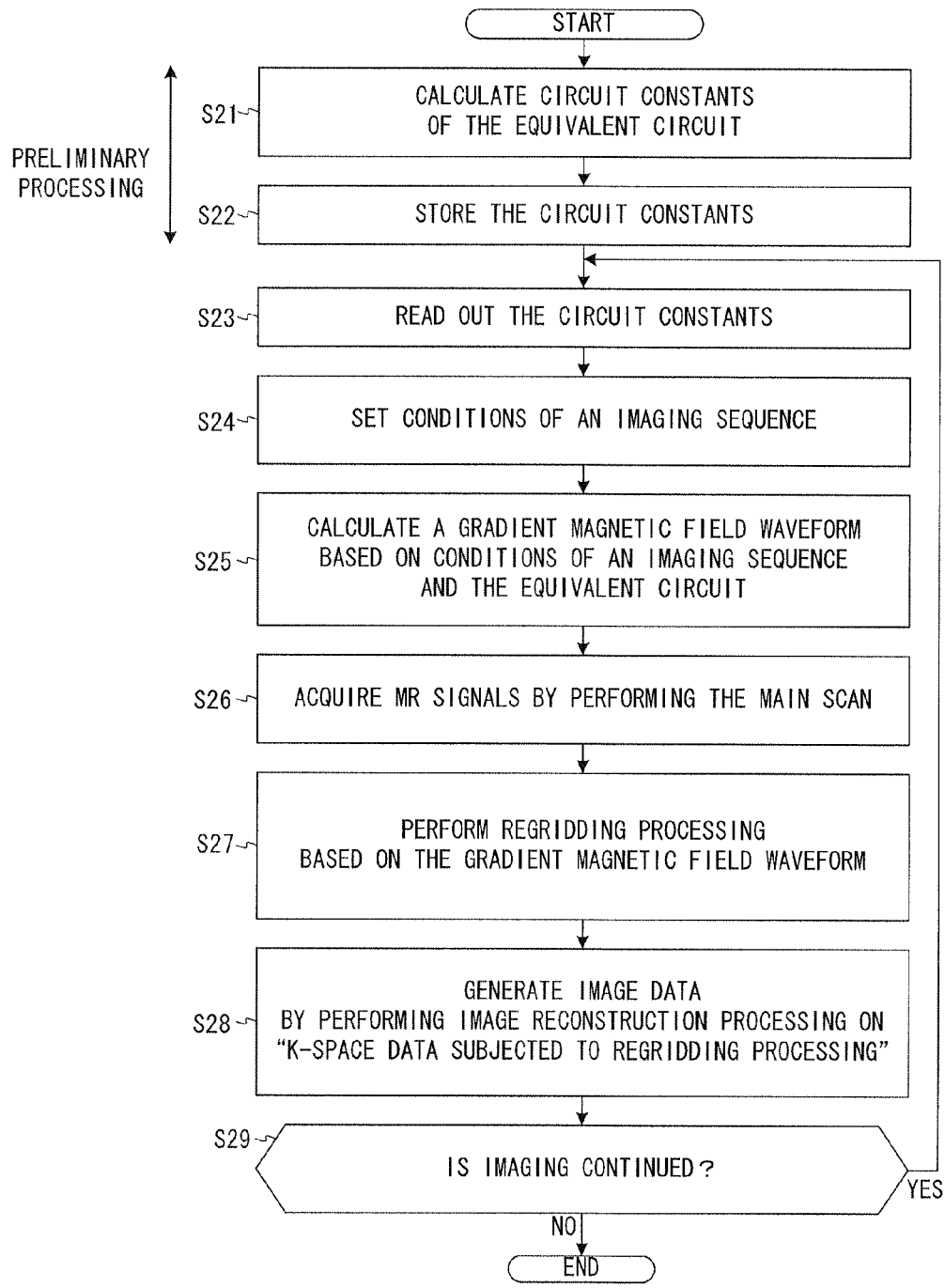
FIG. 25 is a flowchart illustrating an example of a flow of a process performed by the MRI apparatus of the second embodiment.

FIG. 25 is a flowchart illustrating a flow of a process performed by the MRI apparatus 20B of the second embodiment. In the following, according to the step numbers in the flowchart shown in FIG. 25, an operation of the MRI apparatus 20B will be described by referring to the aforementioned drawings as required.

[Step S21] According to the method described above, the circuit constants of the equivalent circuit (see FIG. 5, for example) are determined. That is, the impedance of the gradient magnetic field coil 26 viewed from the gradient magnetic field power supply 44 is measured, and the circuit constants are calculated based on the measurement according to the theoretical formulas (9) and (10). Then, the process proceeds to Step S22.

[Step S22] The circuit constants determined in Step S21 are stored in the circuit constant storing unit 308. The times when the processing of Step S21 and Step S22 are performed are not particularly limited except that the processing have to be performed before performance of the main scan.

For example, the processing of Step S21 and Step S22 can be performed in the factory or the like before shipment of the MRI apparatus 20B. Alternatively, the processing of Step S21 and Step S22 may be performed in situ (on-site) when the product is installed in a hospital or the like. If the environment in the factory and the environment at the installation site significantly differ, it is more effective to perform the above processing on-site. Even after the MRI apparatus 20B come into service, the processing of Steps S21 and Step S22 may be performed at any appropriate time if the environment at the installation site changes due to some cause, or the processing of Steps S21 and S22 may be regularly performed just in case that the environment at the installation site changed due to some cause.

Then, the process proceeds to Step S23. Steps S23 to S29 are processing performed in the case where the main scan is performed.

[Step S23] The gradient magnetic field calculating unit 306 reads out each circuit constant of the equivalent circuit from the circuit constant storing unit 308. Then, the process proceeds to Step S24.

[Step S24] The imaging condition setting unit 302 sets the imaging sequence of the main scan based on various kinds of information concerning the conditions of the imaging sequence inputted by the user to the input device 62. The sequence controller control unit 300 inputs the imaging sequence set by the imaging condition setting unit 302 to the sequence controller 56. Then, the process proceeds to Step S25.

[Step S25] The gradient magnetic field calculating unit 306 calculates the gradient magnetic field waveform based on the imaging sequence set in Step S24 and the circuit constants of the equivalent circuit read out in Step S23. Once the imaging sequence is set, the specifications of the gradient magnetic field (pulse sequence) therein are determined, and the waveform of the gradient magnetic field current to be passed through the gradient magnetic field coil 26 is also determined. The gradient magnetic field calculating unit 306 calculates the gradient magnetic field waveform based on the waveform of the gradient magnetic field current and the circuit constants of the equivalent circuit.

The calculation of the gradient magnetic field waveform can be performed for all of the gradient magnetic field Gss in the slice selection direction, the gradient magnetic field Gpe in the phase encode direction and the gradient magnetic field Gro in the readout direction. According to the second embodiment, at least the waveform of the gradient magnetic field Gro in the readout direction is calculated.

More specifically, for example, in the case of the equivalent circuit shown in FIG. 5, the waveform of the X axis gradient magnetic field Gx(t) that is the sum of the magnetic field induced by the eddy current and other magnetic fields can be calculated as the total magnetic field waveform expressed by the formula (30) described above in the first embodiment.

In this example, assuming that the X axis of the apparatus coordinate system agrees with the readout direction, the left side Gx(t) of the formula (30) is the gradient magnetic field Gro(t) in the readout direction. That is, the gradient magnetic field Gro(t) in the readout direction can be calculated according to the formula (30).

As described above, the gradient magnetic field current Iout(t) flowing through the X axis gradient magnetic field coil 26x is determined by the conditions of the imaging sequence. On the other hand, the circuit constants $R_1, L_1, M_1, R_2, L_2$ and $M_2$ of the formulas (2) and (3) described above are already stored in the circuit constant storing unit 308. Therefore, if the initial values of the electric current $I_1(t)$ and the electric current $I_2(t)$ in the differential equations (2) and (3) are determined, the time variations (waveforms) of the electric current $I_1(t)$ and the electric current $I_2(t)$ can be determined.

Both the initial values of the electric current $I_1(t)$ and the electric current $I_2(t)$ can be zero, if it is assumed that a sufficient time has elapsed since the previous imaging sequence was performed.

Then, the formula (30) contains no unknown quantity, and the gradient magnetic field Gro(t) in the readout direction can be calculated. The gradient magnetic field waveform shown in the upper right part of FIG. 20 described above is an example of the gradient magnetic field Gro(t) in the readout direction calculated as described above. After the gradient magnetic field waveform is calculated in this way, the process proceeds to Step S26.

[Step S26] According to the imaging sequence of the main scan set in Step S24, the main scan is performed in the same manner as in Step S11 in the first embodiment, thereby acquiring MR signals. Then, the process proceeds to Step S27.

[Step S27] The regridding processing unit 320 performs the regridding processing based on the gradient magnetic field Gro(t) in the readout direction calculated in Step S25 and the MR signals acquired in Step S26. Methods of the regridding processing have already been described above. That is, k-space data are generated according to the first method shown in FIG. 23, or k-space data generated by sampling at equal time intervals are rearranged according to the second method shown in FIG. 24.

The k-space data subjected to the regridding processing are stored in the k-space database 92'. Then, the process proceeds to Step S28.

[Step S28] The image reconstruction unit 90' performs image reconstruction processing on the k-space data subjected to the regridding processing, thereby generating image data. Then, the process proceeds to Step S29.

[Step S29] If imaging is not to be continued, as in Step S11 in the first embodiment, image data for display are generated and stored in the storage device 66, and the display device 64 displays the image taken by the main scan. If imaging is to be continued, the operation device 60' returns the process to Step S23. This is the end of an operation according to the second embodiment.

According to the second embodiment, since the regridding processing is performed based on the gradient magnetic field waveform accurately calculated as described above, the accuracy of the regridding processing can be improved. In addition, according to the second embodiment, the gradient magnetic field waveform can be calculated for a desired imaging sequence in the same method without significantly increasing the calculation load.

With the EPI pulse sequence, even a slight waveform variation in the rising region and the falling region of the gradient magnetic field has a highly significant effect on the regridding processing. According to the second embodiment, even when a slight change in the EPI imaging sequence occurs, the gradient magnetic field waveform reflecting the change can be immediately calculated. Thus, according to the second embodiment, "the time required for adjustment processing brought by the change in the imaging sequence" can be reduced.

Third Embodiment

The third embodiment is a modification of the second embodiment.

Figure 26:
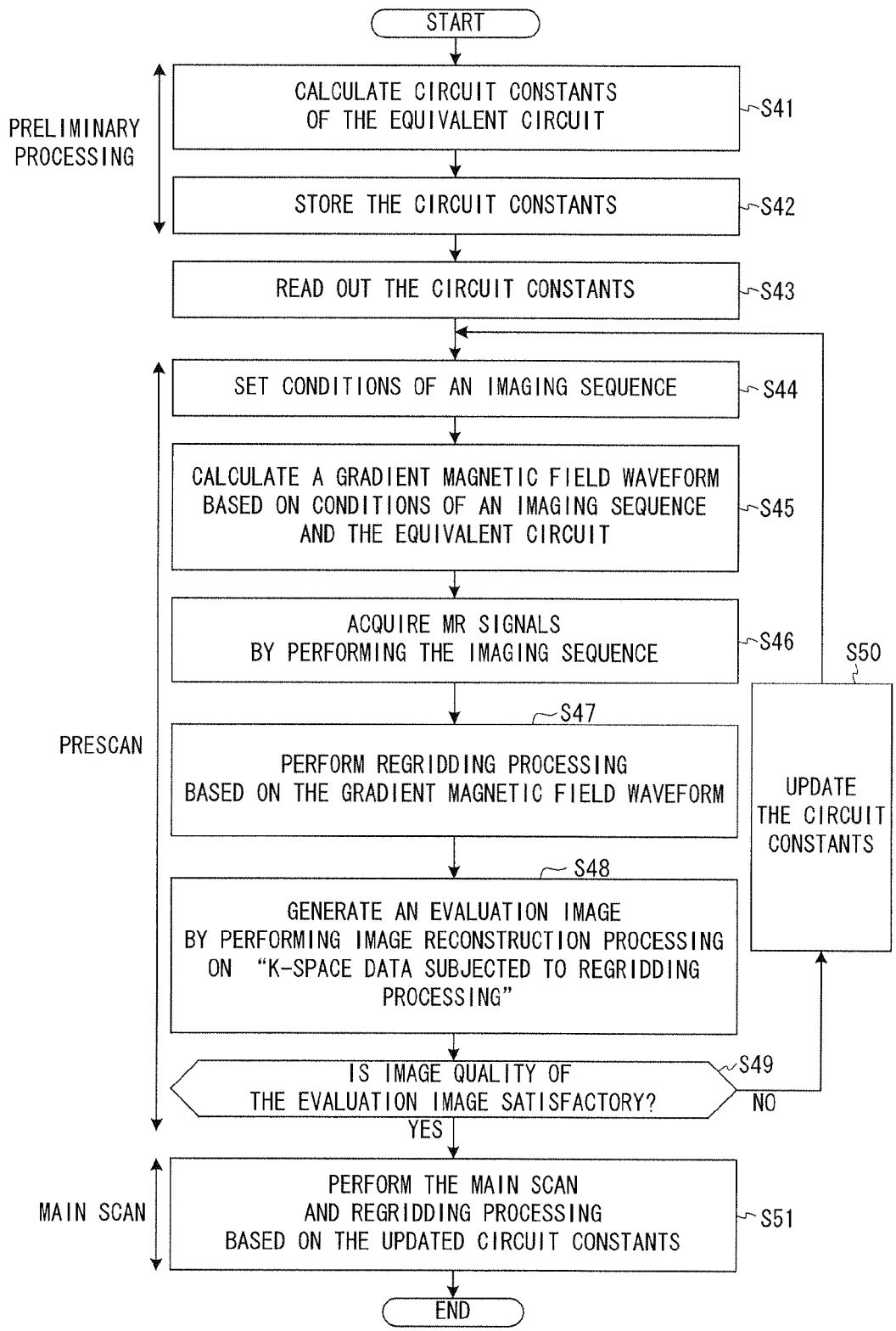
FIG. 26 is a flowchart illustrating an example of a flow of a process performed by the MRI apparatus of the third embodiment.

FIG. 26 is a flowchart showing an operation of the MRI apparatus 20B according to the third embodiment. The third embodiment differs from the second embodiment in that a prescan for verifying the circuit constants of the equivalent circuit (in Steps S44 to S49) is additionally provided. In the following, according to the step numbers shown in FIG. 26, the operation of the MRI apparatus 20B according to the third embodiment will be described.

[Steps S41 to S43] The processing in these steps is the same as those in Steps S21 to S23 in the second embodiment. Then, the process proceeds to Step S44.

[Steps S44 to S48] In Steps S44 to S48, image data of an evaluation image are generated as a part of the prescan. The specific processing in Steps S44 to S48 is basically the same as those in Steps S24 to S28 of the main scan in the second embodiment, respectively, but differ from them in that the generated image data are used as the evaluation image. Then, the process proceeds to Step S49.

[Step S49] The constant correcting unit 312 evaluates the image quality of the evaluation image based on the presence or absence of an artifact or the magnitude of the artifact.

In particular, in the case of EPI, an N/2 artifact caused by a variation between the phase encode steps tends to occur. If the circuit constants of the equivalent circuit are out of proper ranges, the result of the calculation of the gradient magnetic field waveform that reflects a gradient magnetic field variation having a relatively long period over phase encode steps becomes inaccurate.

In this case, the correction by the regridding processing can also be inaccurate to cause the N/2 artifact. Besides, a change in an environmental factor, such as temperature, can also cause a change in impedance of the gradient magnetic field coil 26 when the circuit constants of the equivalent circuit are determined.

Thus, in Step S49, the constant correcting unit 312 automatically calculates a numerical evaluation index or the like that indicates the image quality reflecting the degree of the artifact for the image data of the evaluation image automatically generated in Step S48. The evaluation index can be an index of the magnitude of the N/2 artifact, for example.

In the case where the evaluation index is lower than a predetermined threshold, the constant correcting unit 312 proceeds the process to Step S50. Otherwise, the process proceeds to Step S51.

The case where the evaluation index is lower than a predetermined threshold means the case where the artifact is equal to or higher than a predetermined level, and the image quality of the evaluation image is not satisfactory (sufficiently high). The judgment of the image quality of the evaluation image may be performed by visual inspection, and the judgment result can be inputted to the input device 62.

[Step S50] The constant correcting unit 312 performs processing of updating the circuit constants of the equivalent circuit and then returns the process to Step S44.

Specifically, for example, the constant correcting unit 312 increases and updates the value of the circuit constant $R_1$ shown in FIG. 5 stored in the circuit constant storing unit 308, and then the process returns to Step S44. In this way, the evaluation image is generated again, and the evaluation index of the image quality is calculated in Step S49 again.

If the evaluation index becomes worse than the previously calculated value, the constant correcting unit 312 decreases and updates again the value of the circuit constant $R_1$ stored in the circuit constant storing unit 308, and then the process returns to Step S44 again. To the contrary, if the evaluation index becomes better, the constant correcting unit 312 maintains the value of the circuit constant $R_1$, increases and updates another circuit constant, such as $L_1$, stored in the circuit constant storing unit 308, and then the process returns to Step S44 again.

In this way, whether the value of each circuit constant (parameter) should be increased or decreased in order to improve the image quality is judged by actually changing the value of the circuit constant and regenerating the evaluation image. Such a prescan is repeated until the evaluation index of the image quality of the evaluation image reaches the predetermined threshold.

The improvement of the image quality described above includes reduction of the artifact.

In other words, the prescan is repeated until the artifact is reduced to be equal to or lower than a predetermined level by the constant correcting unit 312 updating the circuit constants.

The process described above is only an example of the method of updating the circuit constants, and the circuit constants can also be updated according to other methods.

[Step S51] Based on the latest (updated) circuit constants, that is, the circuit constants that are judged by the prescan to provide an artifact equal to or lower than a predetermined level, the acquisition of the MR signals of the main scan and the regridding processing are performed. The specific processing are the same as those in Steps S23 to S28 in the second embodiment. This is the end of the description of an operation according to the third embodiment.

As described above, the third embodiment has the same advantages as those of the second embodiment. Furthermore, according to the third embodiment, the main scan is performed based on the circuit constants that are judged by the prescan to provide an artifact equal to or lower than a predetermined level. Therefore, an image of high quality can be obtained with reliability.

Fourth Embodiment

The fourth embodiment differs from the second embodiment in the way of using the calculated gradient magnetic field waveform. According to the second embodiment, the regridding processing is performed based on the calculated gradient magnetic field waveform. However, according to the fourth embodiment, parameter correction processing concerning the gradient magnetic field in the pulse sequence is performed based on the calculated gradient magnetic field waveform. In the following, with reference to FIG. 27 and FIG. 28, the parameter correction processing will be described.

Figure 27:
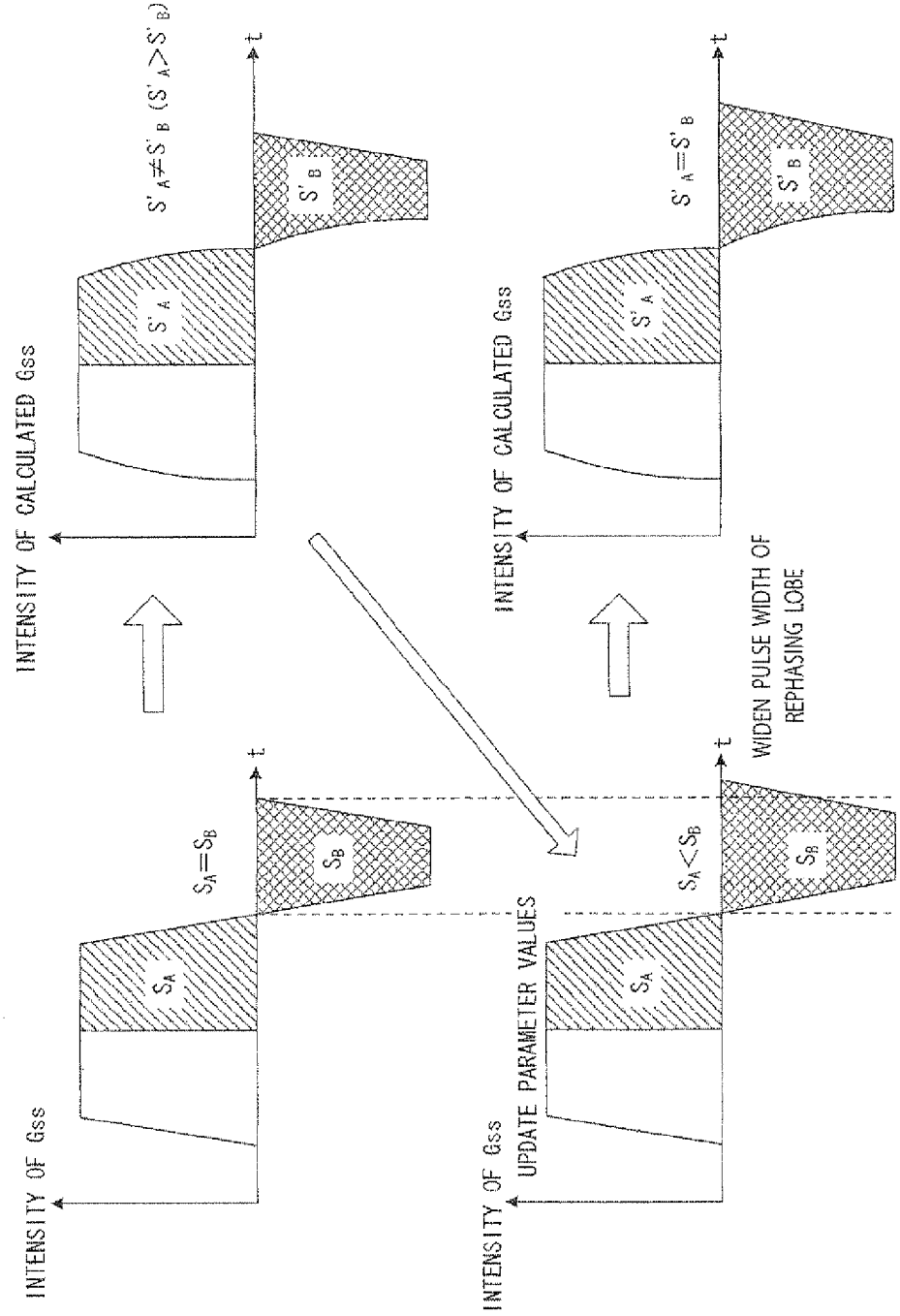
FIG. 27 is a schematic diagram for illustrating an example of the method of correcting a parameter concerning the gradient magnetic field Gss in the slice selection direction in EPI.

FIG. 27 is a schematic diagram for illustrating an example of the method of correcting a parameter concerning the gradient magnetic field Gss in the slice selection direction in EPI. In FIG. 27, the horizontal axes indicate the elapsed time t, and the vertical axes indicate the intensity of the gradient magnetic field Gss in the slice selection direction. The waveform of the gradient magnetic field Gss in the slice selection direction is set, calculated and set again, following the series of the waveform diagrams shown in the upper left part, the upper right part, the lower left part and the lower right part of FIG. 27 in this order.

As shown in the upper left part of FIG. 27, with the typical gradient magnetic field Gss in the slice selection direction, a negative pulse referred to as a rephrasing lobe is applied immediately after a positive pulse.

The initial values of parameters (the start time of the application, the end time of the application and the magnetic field intensity, for example) of the rephrasing lobe are set as described below (in Step S64 shown in FIG. 29 described later).

That is, on the assumption that the positive pulse and the rephrasing lobe are perfect trapezoidal waves, the initial values of the parameters are set in such a manner that a half (SA) of the area of the positive pulse is equal to the area (SB) of the rephrasing pulse applied immediately after the positive pulse. The area means the time integral value of the absolute value of the magnetic field intensity.

Based on the values of the parameters of the gradient magnetic field Gss in the slice selection direction set as described above and the equivalent circuit described above, the waveform correcting unit 316 calculates the actual waveform of the gradient magnetic field Gss in the slice selection direction according to the formulas (1) to (14) and (30).

The calculated actual waveform of the gradient magnetic field Gss in the slice selection direction is the waveform shown in the upper right part of FIG. 27, for example. In the calculated gradient magnetic field waveform, if a half ($S'_A$) of the area of the positive pulse differs from the area ($S'_B$) of the rephrasing lobe (if $S'_A > S'_B$, for example), the waveform correcting unit 316 corrects the value of a parameter of the rephrasing lobe.

For example, as shown in the lower left part of FIG. 27, the waveform correcting unit 316 increases the width of the rephrasing lobe, in such a manner that $S'_A = S'_B$. Then, based on the corrected parameter and the equivalent circuit described above, the waveform correcting unit 316 calculates the waveform of the gradient magnetic field Gss in the slice selection direction again according to the formulas (1) to (14) and (30).

The waveform correcting unit 316 repeats correction of parameters of the rephrasing lobe such as the width and calculation of the waveform of the gradient magnetic field Gss in the slice selection direction, until SA becomes equal to S'B (SA=S'B, as shown in the lower right part of FIG. 27).

Figure 28:
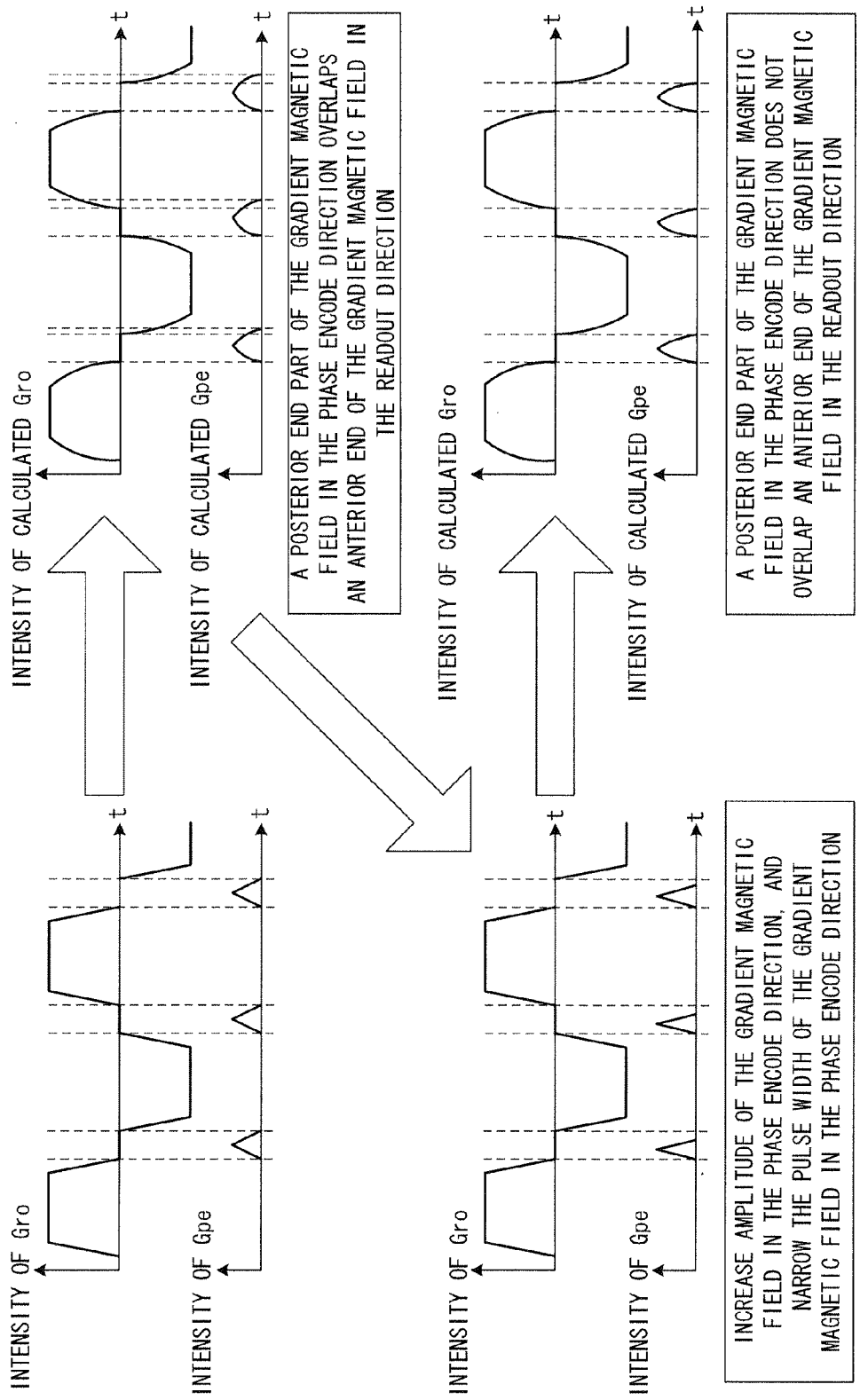
FIG. 28 is a schematic diagram for illustrating an example of the method of correcting a parameter, concerning the gradient magnetic field Gpe in the phase encode direction in EPI.

FIG. 28 is a schematic diagram for illustrating an example of the method of correcting a parameter concerning the gradient magnetic field Gpe in the phase encode direction in EPI.

In FIG. 28, the horizontal axes indicate the elapsed time t. In each of the sets of waveform diagrams shown in the upper left part, the upper right part, the lower left part and the lower right part of FIG. 28, the vertical axis of the upper waveform diagram indicates the intensity of the gradient magnetic field Gro in the readout direction, and the vertical axis of the lower waveform diagram indicates the intensity of the gradient magnetic field Gpe in the phase encode direction.

The waveform of the gradient magnetic field Gpe in the phase encode direction is set, calculated and set again, following the series of the waveform diagrams shown in the upper left part, the upper right part, the lower left part and the lower right part of FIG. 28 in this order.

First, on the assumption that the waveform of the gradient magnetic field Gro in the readout direction is trapezoidal, the initial values of the parameters of the EPI pulse sequence are set in such a manner that the posterior end part (trailing edge side or back end part) of the gradient magnetic field Gpe in the phase encode direction and the anterior end part (leading edge side) of the gradient magnetic field Gro in the readout direction do not temporally overlap with each other (see the upper left part of FIG. 28). This is the processing in Step S64 shown in FIG. 29 described later.

The phrase temporally overlap means that there is a time when both (the pulses of) the gradient magnetic field Gpe in the phase encode direction and (the pulses of) the gradient magnetic field Gro in the readout direction are applied, for example.

Based on the set values of the parameters and the equivalent circuit described above, the waveform correcting unit 316 calculates the gradient magnetic field Gpe in the phase encode direction and the gradient magnetic field Gro in the readout direction according to the formulas (1) to (14) and (30). The calculated gradient magnetic field waveforms are those shown in the upper right part of FIG. 28, for example.

If the posterior end part of the calculated gradient magnetic field Gpe in the phase encode direction and the anterior end part of the calculated gradient magnetic field Gro in the readout direction temporally overlap with each other, the waveform correcting unit 316 corrects a set value of the gradient magnetic field Gpe in the phase encode direction.

Specifically, for example, the waveform correcting unit 316 reduces (shortens) the value of the pulse width of the gradient magnetic field Gpe in the phase encode direction and increases the value of the amplitude (magnetic field intensity) of the gradient magnetic field Gpe in the phase encode direction, in such a manner that the step width of the phase encode is not changed (see the lower left part of FIG. 28).

Based on the corrected parameter of the EPI pulse sequence and the equivalent circuit described above, the waveform correcting unit 316 calculate again the gradient magnetic field Gpe in the phase encode direction and the gradient magnetic field Gro in the readout direction, according to the formulas (1) to (14) and (30).

The waveform correcting unit 316 repeats correction of the values of parameters described above and calculation of the actual gradient magnetic field waveforms based on the equivalent circuit, until the posterior end part of the gradient magnetic field Gpe in the phase encode direction and the anterior end part of the gradient magnetic field Gra in the readout direction do not temporally overlap with each other.

Figure 29:
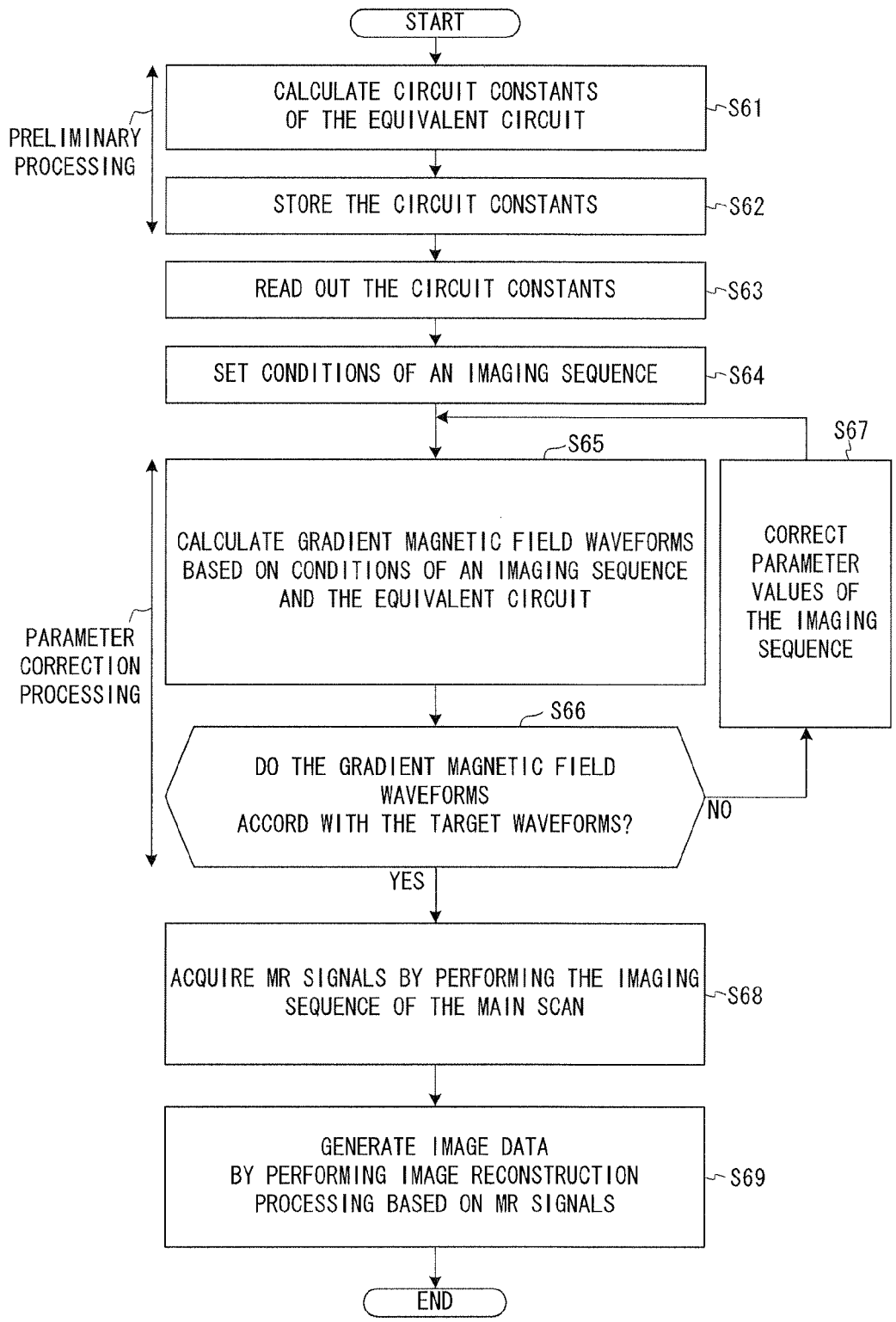
FIG. 29 is a flowchart illustrating an example of a flow of a process performed by the MRI apparatus of the fourth embodiment.

FIG. 29 is a flowchart showing an operation of the MRI apparatus 20B according to the fourth embodiment. In the following, according to the step numbers shown in FIG. 29, the operation of the MRI apparatus 20B according to the fourth embodiment will be described with reference to FIGS. 27 and 28 described above as required.

[Steps S61 to S64] The processing in these steps is the same as those in Steps S21 to S24 in the second embodiment. Then, the process proceeds to Step S65.

[Step S65] In Steps S65 to S67, the waveform correcting unit 316 performs the parameter correction processing. In Step S65, the waveform correcting unit 316 calculates the gradient magnetic field waveform as described above based on the values of the EPI parameters and the equivalent circuit described above according to the formulas (1) to (14) and (30) (see the upper right or lower right part of FIG. 27 and the upper right or lower right part of FIG. 28). Then, the process proceeds to Step S66.

[Step S66] The waveform correcting unit 316 judges whether or not the gradient magnetic field waveform calculated in Step S65 satisfactorily agrees with a target waveform.

The phrase satisfactorily agrees with a target waveform means that a half of the area of the positive pulse of the gradient magnetic field Gss in the slice selection direction is substantially equal to the area of the rephrasing lobe as described above with reference to FIG. 27, for example.

Alternatively, for example, as described above with reference to FIG. 28, the phrase satisfactorily agrees with a target waveform means that the posterior end part of the gradient magnetic field Gpe in the phase encode direction and the anterior end part of the gradient magnetic field Gro in the readout direction do not temporally overlap with each other.

If it is judged that the calculated gradient magnetic field waveform satisfactorily agrees with the target waveform, the process proceeds to Step S68. Otherwise, the process proceeds to Step S67.

[Step S67] The waveform correcting unit 316 corrects the set values of parameters. Specifically, for example, if a half of the area of the positive pulse of the gradient magnetic field Gss in the slice selection direction does not satisfactorily agree with the area of the rephrasing lobe, the waveform correcting unit 316 increases the width of the rephrasing love in such a manner that the areas agree with each other. This processing has already been described in detail with reference to FIG. 27.

If the posterior end side of the gradient magnetic field Gpe in the phase encode direction and the anterior end side of the gradient magnetic field Gro in the readout direction temporally overlap with each other, the waveform correcting unit 316 corrects the pulse width and the amplitude (magnetic field intensity) of the gradient magnetic field Gpe in the phase encode direction. This processing has already been described in detail with reference to FIG. 28.

Such parameter correction processing brings the gradient magnetic field waveform close to the target waveform. After the parameter correction processing described above, the process returns to Step S65.

[Step S68] If the process reaches Step S68, it means that the values of the parameters of the pulse sequence have been originally set so as to satisfactorily agree with the target waveform or corrected so as to satisfactorily agree with the target waveform.

The MRI apparatus 20B performs the imaging sequence of the main scan in the same manner as in Step S11 in the first embodiment, converts the data of the acquired MR signals into k-space data and stores the k-space data. Then, the process proceeds to Step S69.

[Step S69] In the same manner as in Step S11 in the first embodiment, the image reconstruction processing is performed on the k-space data to generate image data for display, and the image data for display are stored in the storage device 66. Then, the image data for display are transferred from the storage device 66 to the display control unit 98, and the image taken by the main scan is displayed on the display device 64. This is the end of the description of the operation of the MRI apparatus 20B according to the fourth embodiment.

As described above, according to the fourth embodiment, before the main scan is performed, the gradient magnetic field waveforms actually generated by the currently set parameters are calculated with high accuracy based on the equivalent circuit. Then, if the calculated gradient magnetic field waveforms do not satisfactorily agree with each of the target waveforms, such as in the case where the posterior end part of the gradient magnetic field Gpe in the phase encode direction and the anterior end part of the gradient magnetic field Gro in the readout direction temporally overlap with each other, the values of the parameters are corrected before the performance of the main scan.

In this way, since the actually generated gradient magnetic fields can be made to satisfactorily agree with the target waveform, the image quality can be improved.

Fifth Embodiment

The MRI apparatus 20B according to the fifth embodiment performs the regridding processing according to the second embodiment and the parameter correction processing according to the fourth embodiment.

Figure 30:
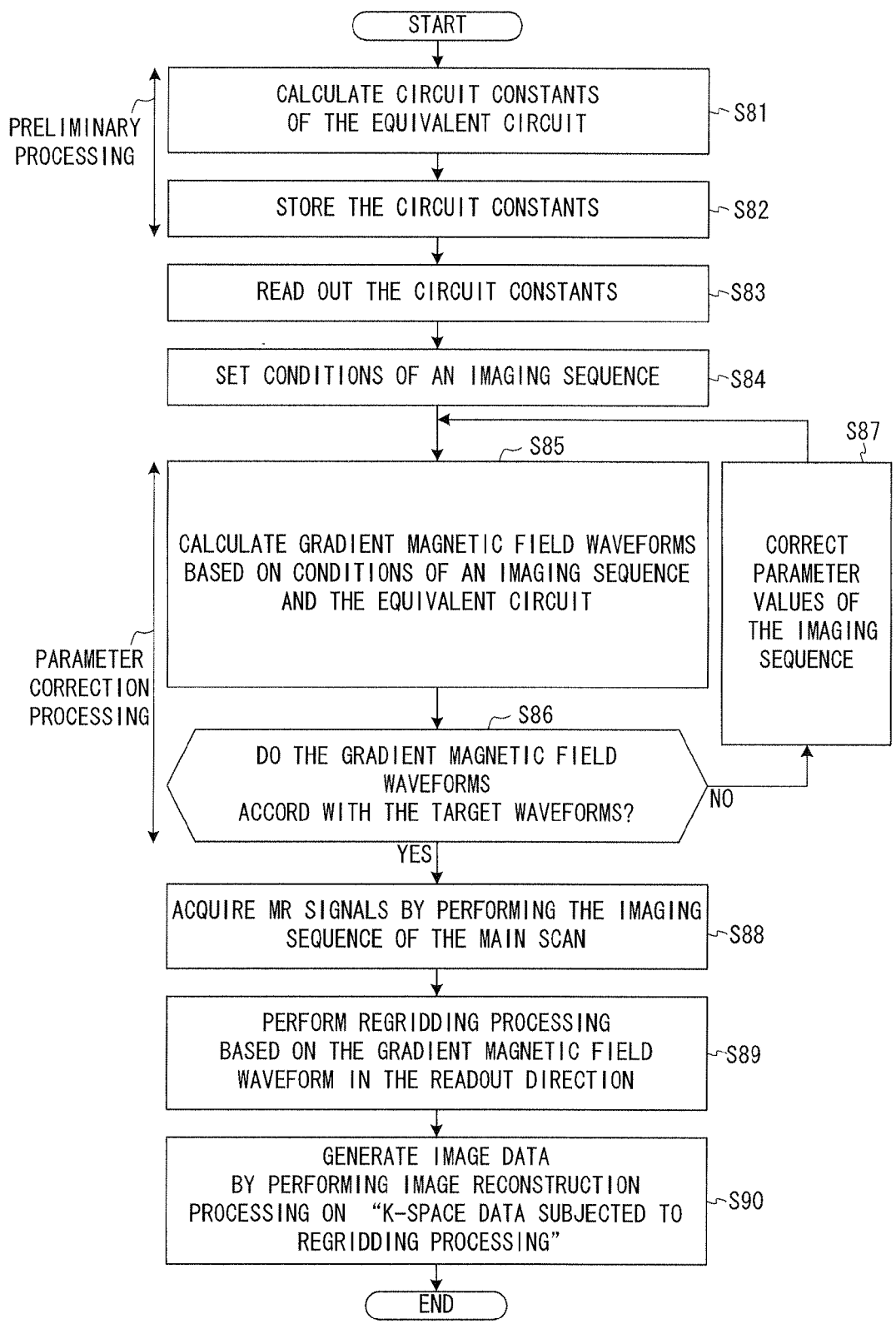
FIG. 30 is a flowchart illustrating an example of a flow of a process performed by the MRI apparatus of the fifth embodiment.

FIG. 30 is a flowchart showing an operation of the MRI apparatus 20B according to the fifth embodiment. In the following, according to the step numbers shown in FIG. 30, the operation of the MRI apparatus 20B according to the fifth embodiment will be described.

[Steps S81 to S88] The processing in these steps is the same as those in Steps S61 to S68 in the fourth embodiment. Then, the process proceeds to Step S89.

[Steps S89 and S90] The processing in these steps is the same as those in Step S27 and Step S28 in the second embodiment.

As described above, according to the fifth embodiment, the gradient magnetic field waveforms are calculated based on the equivalent circuit, the parameter correction processing according to the fourth embodiment is performed based on the gradient magnetic field waveforms, and the regridding processing according to the second embodiment is performed after the performance of the main scan.

Thus, the fifth embodiment combines the advantage of the second embodiment and the advantage of the fourth embodiment.

As described above, the MRI apparatuses 20B according to the second to fifth embodiments can calculate the actual gradient magnetic field waveforms with high accuracy and perform the regridding processing and the parameter correction processing with high accuracy based on the calculated gradient magnetic field waveforms.

While certain embodiments have been described, these embodiments have been presented by way of example only, and are not intended to limit the scope of the inventions. Indeed, the novel methods and systems described herein may be embodied in a variety of other forms; furthermore, various omissions, substitutions and changes in the form of the methods and systems described herein may be made without departing from the spirit of the inventions. The accompanying claims and their equivalents are intended to cover such forms or modifications as would fall within the scope and spirit of the inventions.

What is claimed is:

1. A magnetic resonance imaging (MRI) control apparatus comprising:
   a condition setting unit configured to set an MR imaging sequence to be performed by an MRI apparatus, based on set conditions of the set imaging sequence; and
   a judging unit configured to (a) calculate electric current that would be required for supply to a gradient magnetic field coil of the MRI apparatus based on said set conditions of the set imaging sequence, (b) calculate a voltage that would be required to be applied to the gradient magnetic field coil, based on a mutual inductance of the gradient magnetic field coil to achieve the calculated electric current flowing to the gradient magnetic field coil, and (c) judge whether the set imaging sequence is practicable or not based on the calculated voltage.

2. The apparatus according to claim 1, wherein:
   the judging unit is configured to calculate the voltage, under an assumption that another coil exists in addition to the gradient magnetic field coil, based on a mutual inductance between said another coil and the gradient magnetic field coil resistance of the gradient magnetic field coil and a self-inductance of the gradient magnetic field coil.

3. The apparatus according to claim 2, further comprising:
   an image reconstruction unit configured to generate matrix data in k-space by separating a plurality of nuclear magnetic resonance signals respectively detected in a plurality of sampling periods during performance of the set imaging sequence into frequency encode step numbers based on a sampling interval;
   wherein the image reconstruction unit is configured to (i) calculate a waveform of a totalized magnetic field of a magnetic field generated by said another coil and a magnetic field generated by the gradient magnetic field coil by calculating an electric current value flowing in said another coil, and (ii) rearrange the matrix data by varying each sampling interval so that the length of each sampling interval depends on intensity of the totalized magnetic field at each detection time of a nuclear magnetic resonance signal included in each sampling interval.

4. The apparatus according to claim 1, wherein:
   the judging unit is configured to (i) calculate anticipated power consumption of the gradient magnetic field coil based on the calculated electric current and the calculated voltage, (ii) calculate an expected temperature rise of the gradient magnetic field coil if the set imaging sequence was performed based on a time integral value of the power consumption, and (iii) judge whether the set imaging sequence is practicable or not based on the expected temperature rise.

5. The apparatus according to claim 4, wherein:
   the judging unit is configured to (iv) acquire a temperature of the gradient magnetic field coil before performance of the set imaging sequence as a pre-sequence temperature from the MRI apparatus, (v) calculate an expected temperature of the gradient magnetic field coil after performance of the set imaging sequence as an expected post-sequence temperature based on the pre-sequence temperature and the temperature rise, and (vi) judge the set imaging sequence impracticable when the post-sequence temperature is higher than a predetermined value.

6. The apparatus according to claim 1, further comprising:
   an amplifier connected to supply electric power to the gradient magnetic field coil; and
   a circuit breaker disposed in an electric power pathway from an external power supply to the amplifier;
   wherein the judging unit is configured to (i) calculate and totalize both expected power consumption of the gradient magnetic field coil and expected power consumption inside the amplifier based on the calculated electric current and the calculated voltage, (ii) calculate an expected electric current value to flow through the circuit breaker based on the calculated totalized power consumption, and (iii) judge whether the set imaging sequence is practicable or not, based on the calculated electric current that would flow through the circuit breaker and a rated current value of the circuit breaker.

7. The apparatus according to claim 1, further comprising:
   an amplifier connected to supply electric power to the gradient magnetic field coil;
   a direct-current power supply connected to supply electric power to the amplifier; and
   a charge/discharge element that is charged by the direct-current power supply and that supplies its discharging current to the amplifier;
   wherein the judging unit is configured to (i) calculate and totalize both expected power consumption of the gradient magnetic field coil and expected power consumption of the amplifier based on the calculated electric current and the calculated voltage, (ii) calculate an expected required output voltage of the direct-current power supply in performance of the set imaging sequence based on totalized expected power consumption and respective power supply amounts from the direct-current power supply and the charge discharge element, and (iii) judge the set imaging sequence impracticable when a time span exists in which output voltage of the direct-current power supply is smaller than the calculated voltage required to be applied to the gradient magnetic field coil.

8. The apparatus according to claim 1, wherein:
the judging unit is configured to (i) calculate a correction candidate of conditions of the set imaging sequence so that a corrected set imaging sequence is judged practicable by the judging unit and (ii) to display the correction candidate of conditions, if the judging unit judged that the earlier set imaging sequence is impracticable.

9. The apparatus according to claim 8, wherein:
the judging unit is configured to (iii) display a condition to be corrected with a visually altered display aspect, compared to other displayed conditions of the corrected set imaging sequence, if the judging unit judged that the earlier set imaging sequence is impracticable.

10. The apparatus according to claim 8, wherein:
the judging unit is configured to (iii) calculate at least one of: prolongation of a repetition time, expansion of FOV (field of view) which is a region to be imaged, reduction of slice number, and contraction of a matrix size in a phase encode direction and a frequency encode direction, as the correction candidate.

11. The apparatus of claim 1 further comprising:
a gradient magnetic field coil that applies a gradient magnetic field to an imaging region under control of the MRI control apparatus.

* * * * *